United States Patent
Ahn et al.

(10) Patent No.: US 10,696,697 B2
(45) Date of Patent: Jun. 30, 2020

(54) HETEROCYCLIC COMPOUND AND ORGANIC ELECTROLUMINESCENCE DEVICE INCLUDING THE SAME

(71) Applicant: SAMSUNG DISPLAY CO., LTD., Yongin-si, Gyeonggi-do (KR)

(72) Inventors: Heechoon Ahn, Yongin-si (KR); Soo-byung Ko, Yongin-si (KR); Mieun Jun, Yongin-si (KR); Sungbum Kim, Yongin-si (KR); Mina Jeon, Yongin-si (KR); Youngkook Kim, Yongin-si (KR); Seokhwan Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 245 days.

(21) Appl. No.: 15/813,651

(22) Filed: Nov. 15, 2017

(65) Prior Publication Data

US 2018/0334468 A1   Nov. 22, 2018

(30) Foreign Application Priority Data

May 16, 2017   (KR) .................. 10-2017-0060594

(51) Int. Cl.
*H01L 51/50* (2006.01)
*C07F 7/08* (2006.01)
(Continued)

(52) U.S. Cl.
CPC ............ *C07F 7/0816* (2013.01); *C09K 11/06* (2013.01); *H01L 51/0052* (2013.01);
(Continued)

(58) Field of Classification Search
None
See application file for complete search history.

(56) References Cited

U.S. PATENT DOCUMENTS

2015/0137111 A1*  5/2015  Ryu .................. C09K 11/06
                                                          257/40
2015/0318501 A1   11/2015  Watanabe et al.
(Continued)

FOREIGN PATENT DOCUMENTS

KR   10-2011-0018688 A   2/2011
KR   10-2014-0108778 A   9/2014
(Continued)

*Primary Examiner* — Gregory D Clark
(74) *Attorney, Agent, or Firm* — Lewis Roca Rothgerber Christie LLP

(57) ABSTRACT

A heterocyclic compound and an organic electroluminescence device including the same, the compound being represented by the following Formula 1:

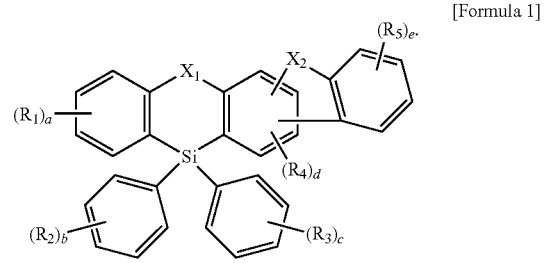

[Formula 1]

16 Claims, 1 Drawing Sheet

(51) Int. Cl.
  *C09K 11/06*      (2006.01)
  *H01L 51/00*      (2006.01)

(52) U.S. Cl.
  CPC ...... *H01L 51/0067* (2013.01); *H01L 51/0071* (2013.01); *H01L 51/0094* (2013.01); *H01L 51/5012* (2013.01); *C09K 2211/1096* (2013.01); *H01L 51/0085* (2013.01); *H01L 51/5016* (2013.01)

(56) References Cited

U.S. PATENT DOCUMENTS

2016/0020396 A1  1/2016  Lee
2017/0170406 A1  6/2017  Choi et al.

FOREIGN PATENT DOCUMENTS

| KR | 10-2015-0079960 A | 7/2015 |
| KR | 10-2015-0117130 A | 10/2015 |
| KR | 10-2016-0010706 A | 1/2016 |
| KR | 10-2017-0016702 A | 2/2017 |

* cited by examiner

HETEROCYCLIC COMPOUND AND ORGANIC ELECTROLUMINESCENCE DEVICE INCLUDING THE SAME

CROSS-REFERENCE TO RELATED APPLICATIONS

Korean Patent Application No. 10-2017-0060594, filed on May 16, 2017, in the Korean Intellectual Property Office, and entitled: "Heterocyclic Compound And Organic Electroluminescence Device Including The Same," is incorporated by reference herein in its entirety.

BACKGROUND

1. Field

The present disclosure herein relates to a heterocyclic compound and an organic electroluminescence device including the same.

2. Description of the Related Art

The development of an organic electroluminescence display as an image display is being actively conducted. The organic electroluminescence display is different from a liquid crystal display and is a self-luminescent display accomplishing displays via the recombination of holes and electrons injected from a first electrode and a second electrode in an emission layer and via light emission from a luminescent material including an organic compound in the emission layer.

An organic electroluminescence device, e.g., an organic device, may include a first electrode, a hole transport layer disposed on the first electrode, an emission layer disposed on the hole transport layer, an electron transport layer disposed on the emission layer, and a second electrode disposed on the electron transport layer. Holes are injected from the first electrode, and the injected holes move via the hole transport layer and are injected into the emission layer. Meanwhile, electrons are injected from the second electrode, and the injected electrons move via the electron transport layer and are injected into the emission layer. The holes and electrons injected into the emission layer recombine to produce excitons in the emission layer. The organic electroluminescence device emits light using light generated by the transition of the excitons to a ground state.

SUMMARY

Embodiments are directed to a heterocyclic compound and an organic electroluminescence device including the same.

The embodiments may be realized by providing a heterocyclic compound represented by the following Formula 1:

[Formula 1]

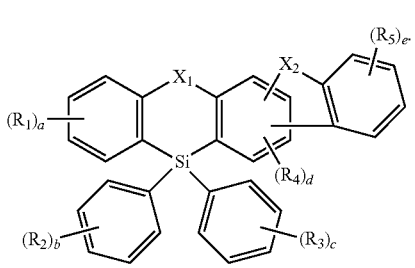

wherein, in Formula 1, $X_1$ is O, S, SO, or $SO_2$, $X_2$ is $NR_6$, $CR_7R_8$, $SiR_9R_{10}$, O, or S, $R_1$ to $R_{10}$ are each independently a hydrogen atom, a deuterium atom, a cyano group, a substituted or unsubstituted silyl group, a substituted or unsubstituted phosphine oxide group, a substituted or unsubstituted alkyl group having 1 to 10 carbon atoms, a substituted or unsubstituted alkenyl group having 2 to 10 carbon atoms, a substituted or unsubstituted aryl group having 6 to 60 ring carbon atoms, or a substituted or unsubstituted heteroaryl group having 2 to 60 ring carbon atoms, "a" and "e" are each independently an integer of 0 to 4, "b" and "c" are each independently an integer of 0 to 5, and "d" is an integer of 0 to 2.

The compound represented by Formula 1 may be represented by the following Formula 2:

[Formula 2]

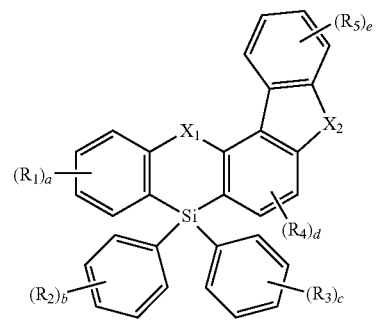

wherein, in Formula 2, $X_1$, $X_2$, $R_1$ to $R_5$, and "a" to "e" are defined the same as those of Formula 1.

$X_2$ may be $NR_6$, and $R_6$ may be a substituted or unsubstituted phosphine oxide group, a substituted or unsubstituted aryl group having 6 to 30 ring carbon atoms, or a substituted or unsubstituted heteroaryl group having 2 to 30 ring carbon atoms.

$X_2$ may be $NR_6$, and $R_6$ may be a diphenylphosphine oxide group, a substituted or unsubstituted phenyl group, a substituted or unsubstituted fluorene group, a substituted or unsubstituted pyridine group, a substituted or unsubstituted pyrimidyl group, a substituted or unsubstituted triazine group, a substituted or unsubstituted carbazole group, a substituted or unsubstituted dibenzofuran group, or a substituted or unsubstituted dibenzothiophene group.

The compound represented by Formula 1 may be represented by one of the following Formulae 2-1 to 2-3:

[Formula 2-1]

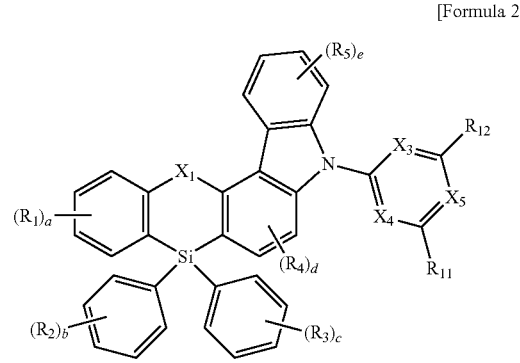

-continued

[Formula 2-2]

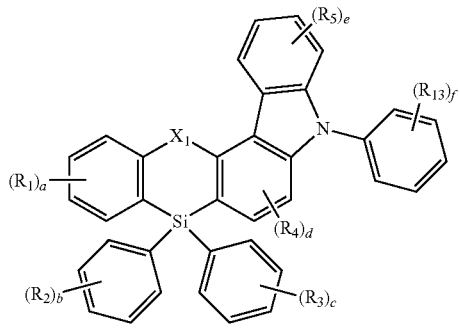

[Formula 2-3]

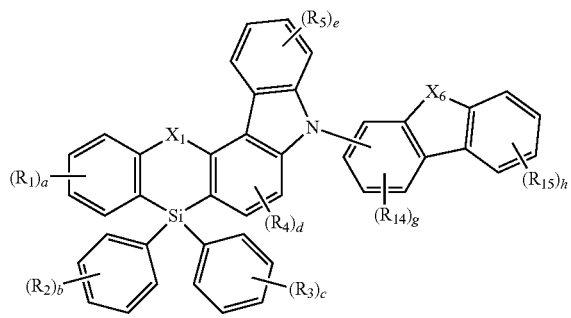

wherein, in Formula 2-1, $X_3$ to $X_5$ may be each independently N or CH, at least one of $X_3$ to $X_5$ being N, $R_{11}$ and $R_{12}$ is defined the same as $R_1$ to $R_5$, wherein in Formula 2-2, $R_{13}$ is defined the same as $R_1$ to $R_5$, "f" may be an integer of 0 to 5, wherein, in Formula 2-3, $X_6$ may be O, S, $CR_{16}R_{17}$, or $NR_{18}$, $R_{14}$ to $R_{18}$ are defined the same as $R_1$ to $R_5$, "g" may be an integer of 0 to 3, "h" may be an integer of 0 to 4, and wherein, in Formulae 2-1 to 2-3, $X_1$, $R_1$ to $R_5$, and "a" to "e" are defined the same as those of Formula 1.

The compound represented by Formula 1 may be represented by the following Formula 3:

[Formula 3]

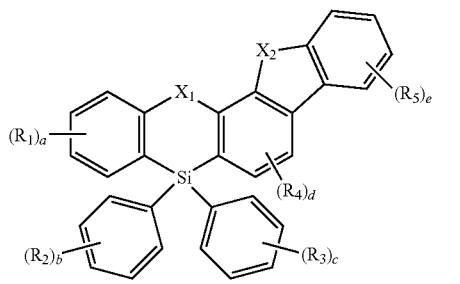

wherein, in Formula 3, $X_1$, $X_2$, $R_1$ to $R_5$ and "a" to "e" are defined the same as those of Formula 1.

The compound represented by Formula 1 may be represented by the following Formula 4:

[Formula 4]

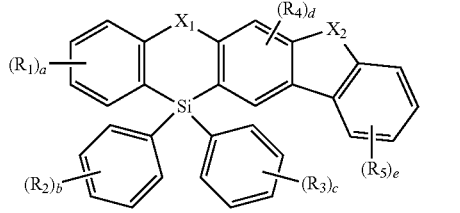

wherein, in Formula 4, $X_1$, $X_2$, $R_1$ to $R_5$ and "a" to "e" are defined the same as those of Formula 1.

The compound represented by Formula 1 may be represented by the following Formula 5:

[Formula 5]

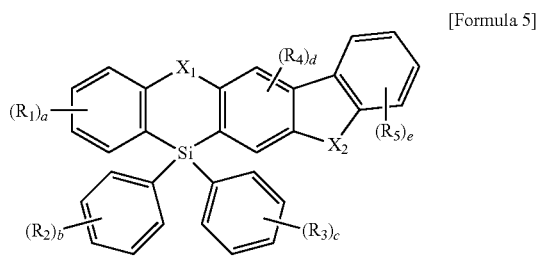

wherein, in Formula 5, $X_1$, $X_2$, $R_1$ to $R_5$ and "a" to "e" are defined the same as those of Formula 1.

The heterocyclic compound represented by Formula 1 may be a compound of the following Compound Group 1:

[Compound Group 1]

1

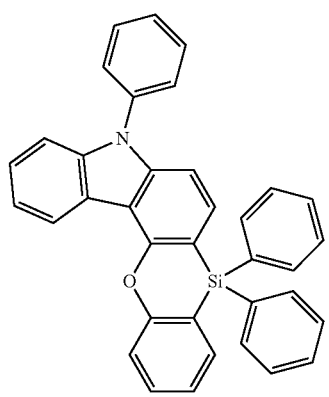

2

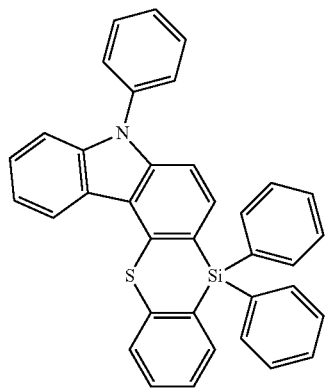

3

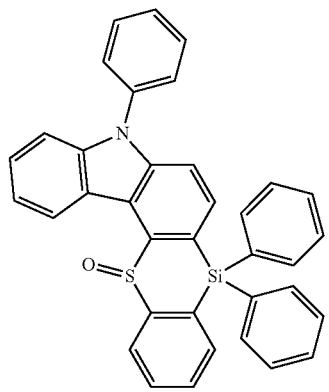

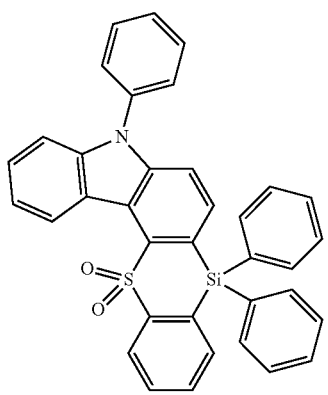
4
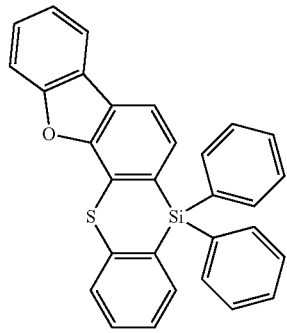
8
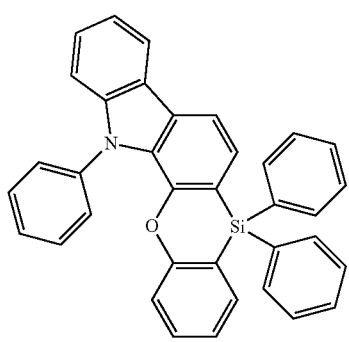
5
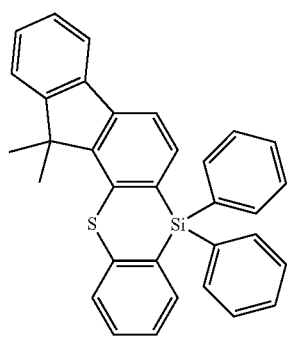
9
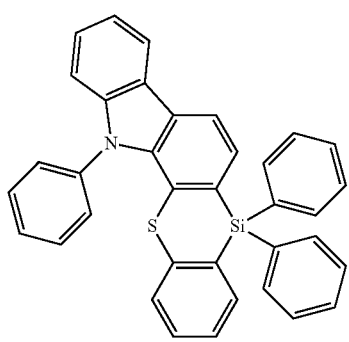
6
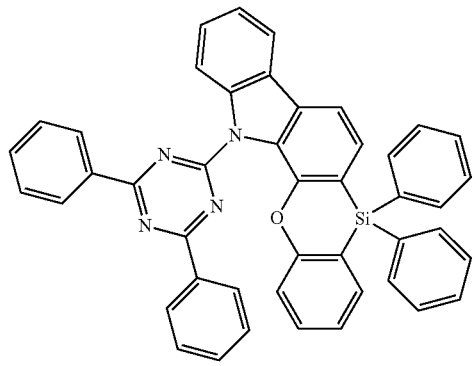
10
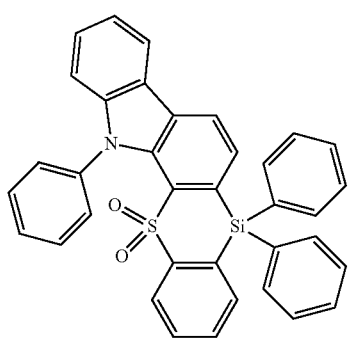
7
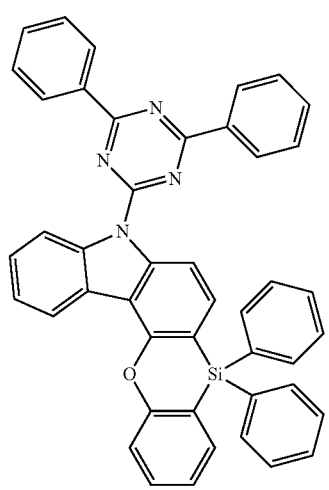
11

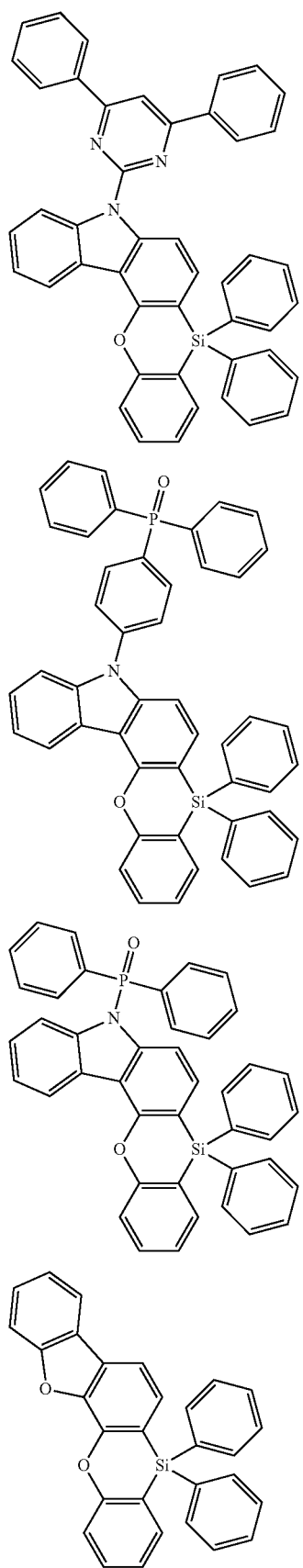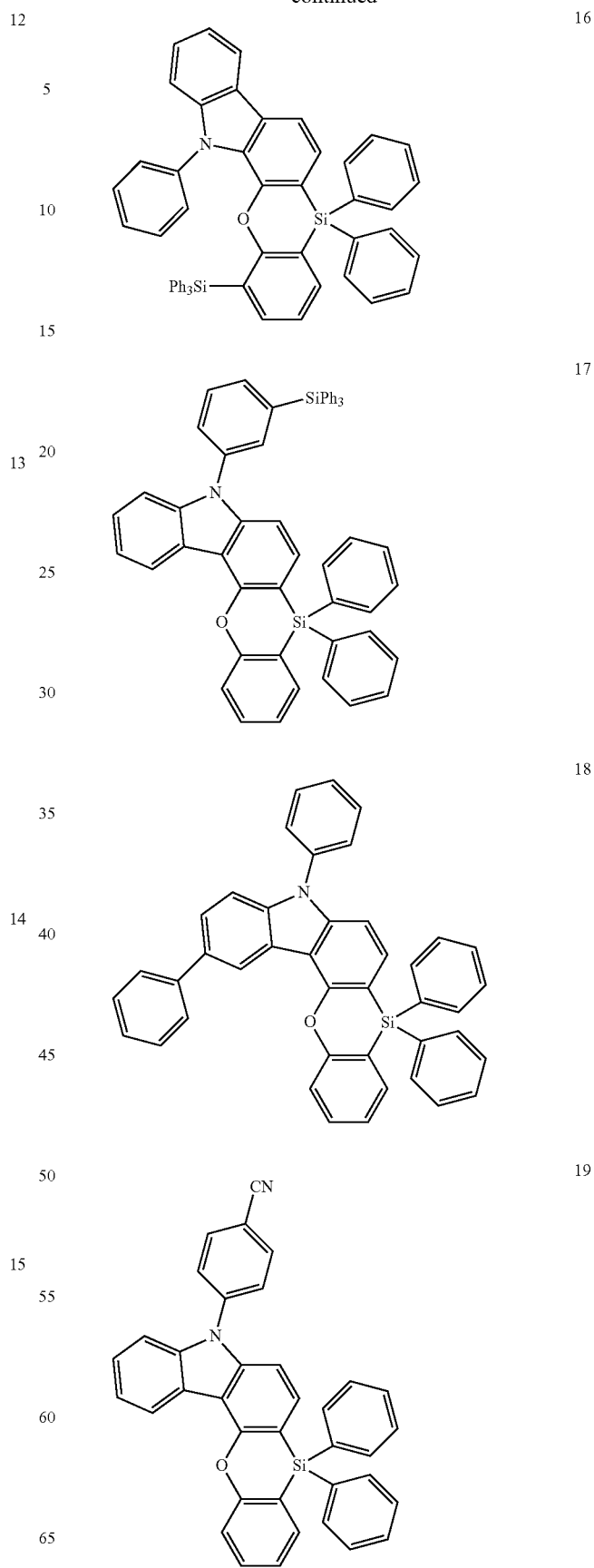

20
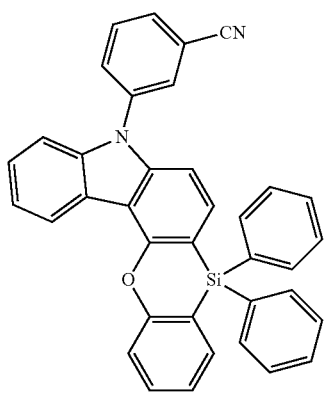
23
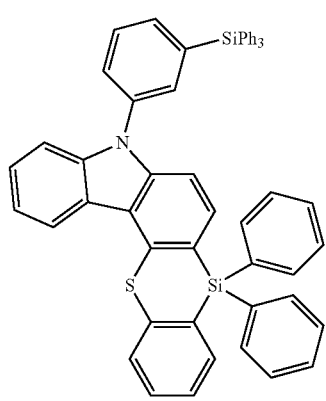
21
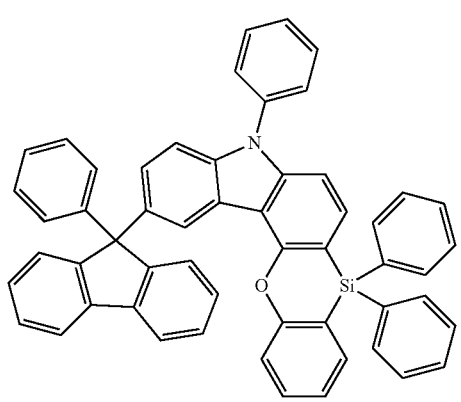
24
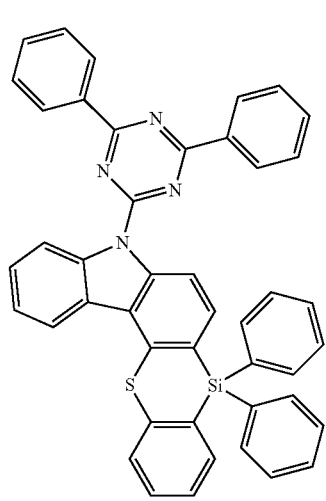
22
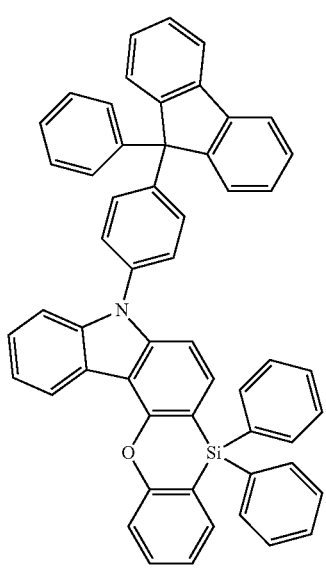
25
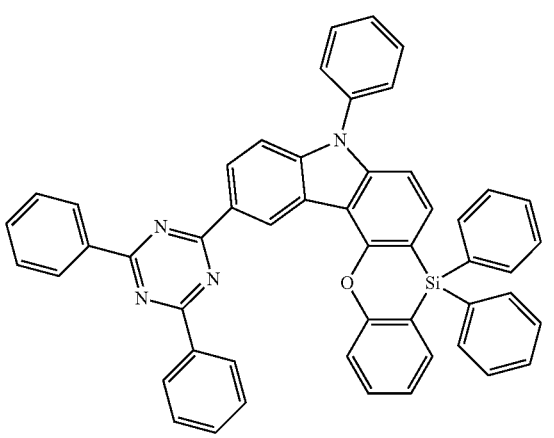

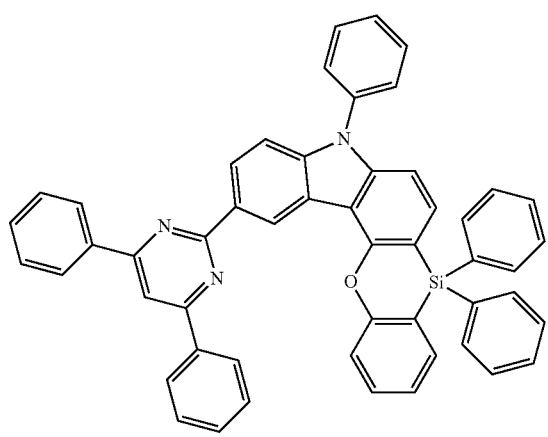
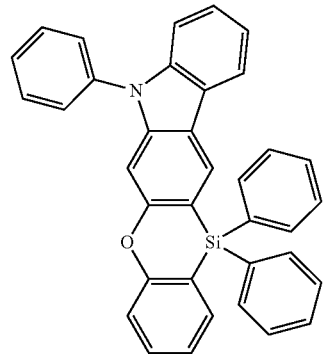
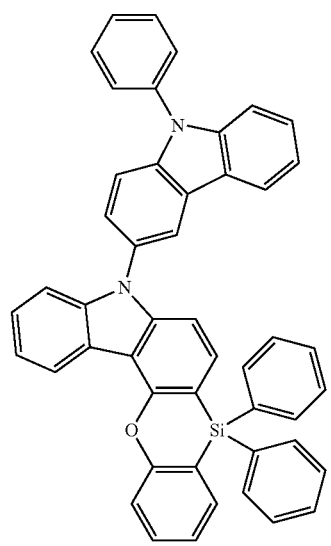
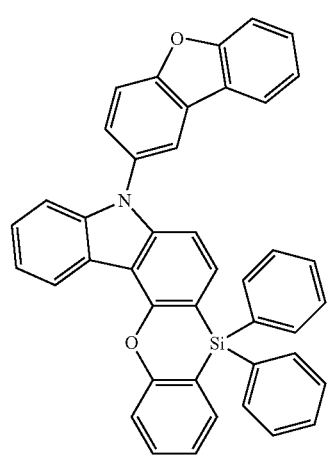

33
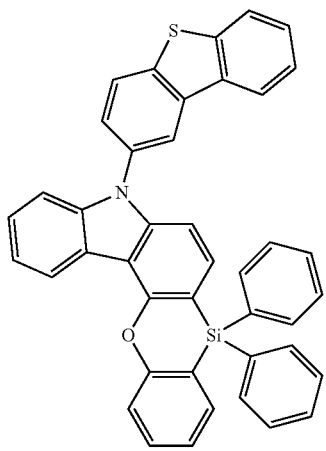
34
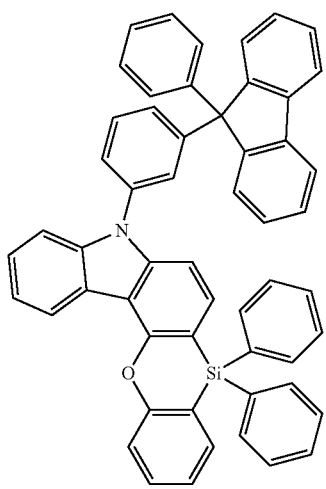
35
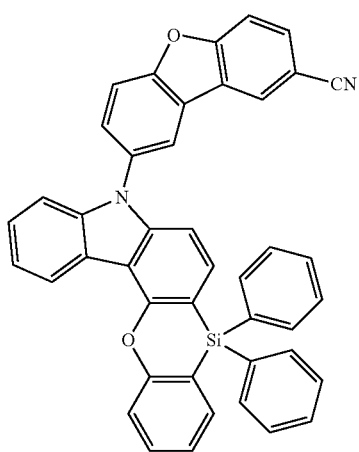
36
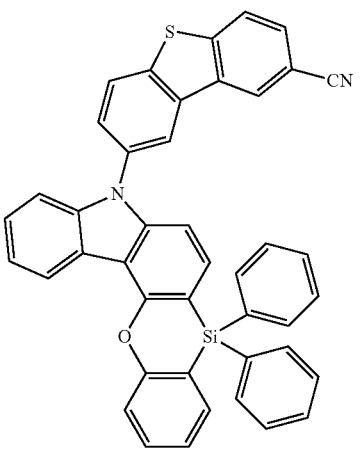
37
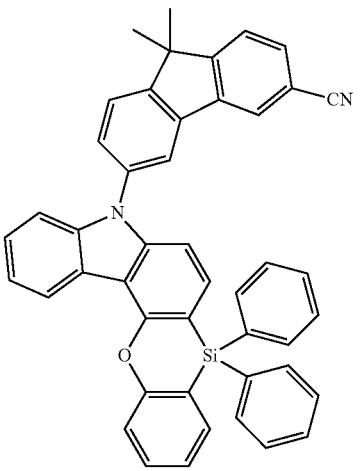
38
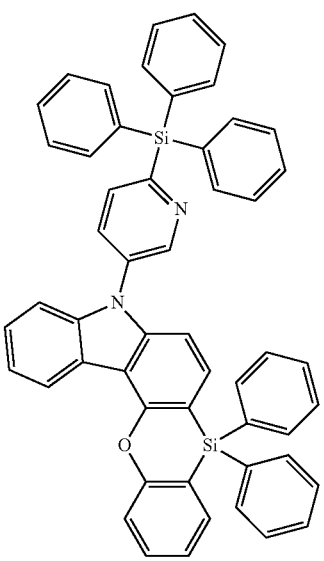

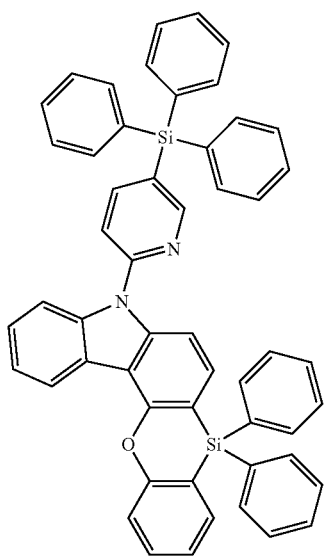
39
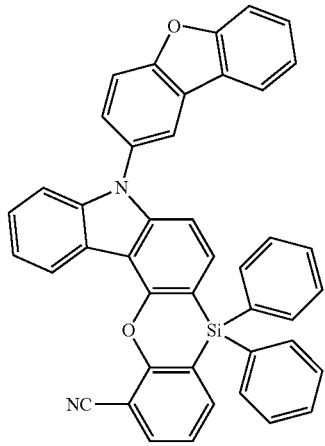
42
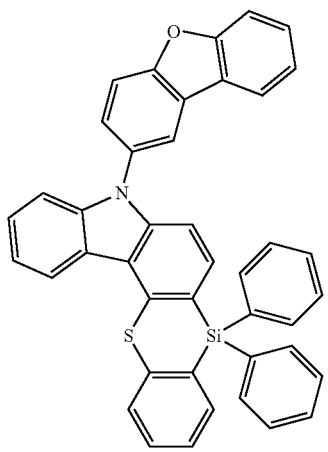
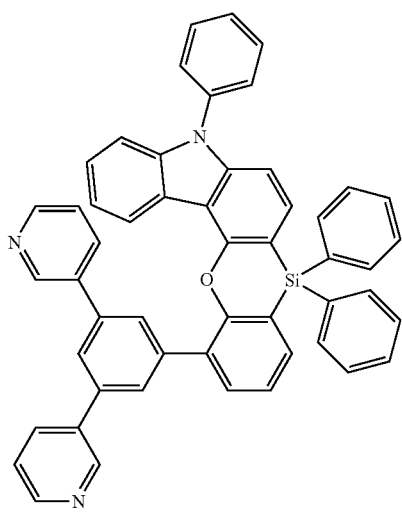
43
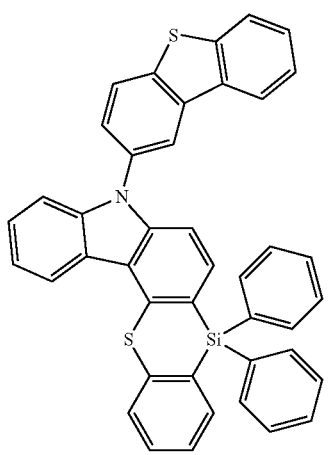
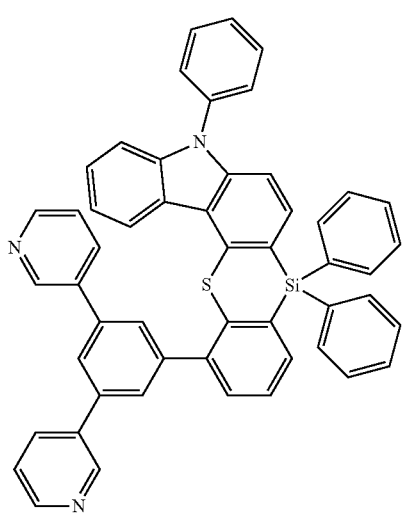
44

45
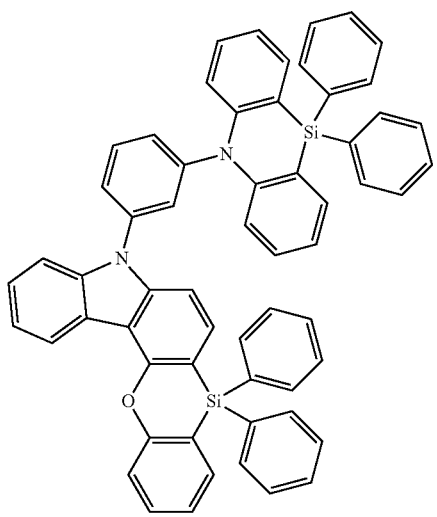
46
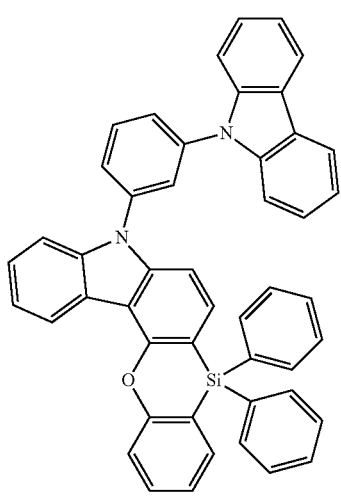
47
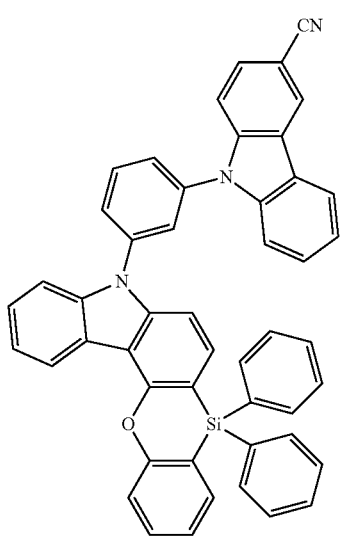
48
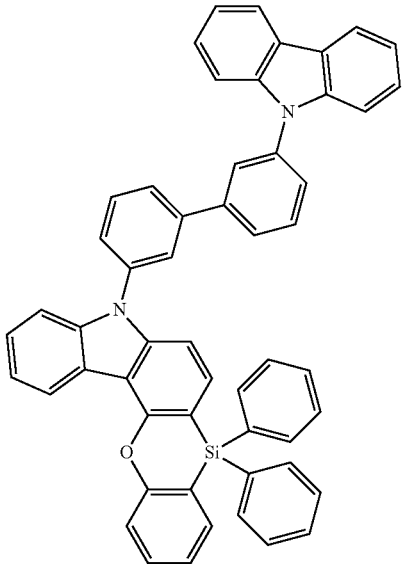
49
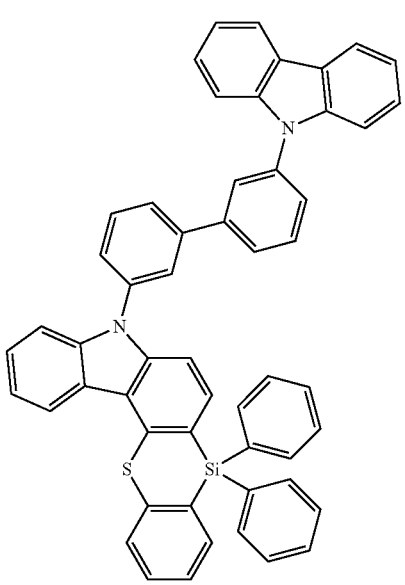
50
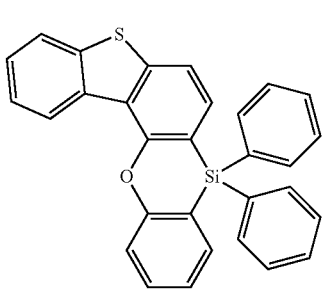

-continued

51

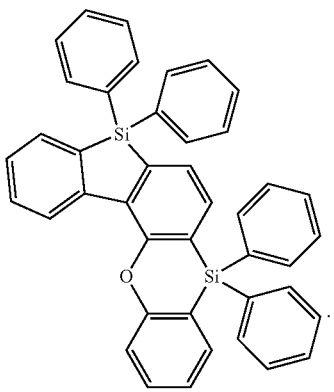

The embodiments may be realized by providing an organic electroluminescence device including a first electrode; a hole transport region on the first electrode; an emission layer on the hole transport region; an electron transport region on the emission layer; and a second electrode on the electron transport region, wherein the emission layer includes a heterocyclic compound represented by the following Formula 1:

[Formula 1]

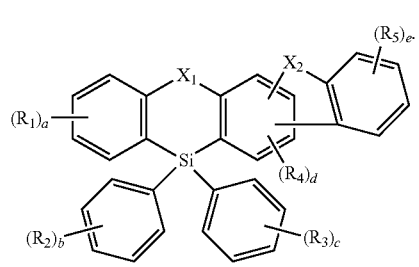

wherein, in Formula 1, $X_1$ may be O, S, SO, or $SO_2$, $X_2$ may be $NR_6$, $CR_7R_8$, $SiR_9R_{10}$, O, or S, $R_1$ to $R_{10}$ may be each independently a hydrogen atom, a deuterium atom, a cyano group, a substituted or unsubstituted silyl group, a substituted or unsubstituted phosphine oxide group, a substituted or unsubstituted alkyl group having 1 to 10 carbon atoms, a substituted or unsubstituted alkenyl group having 2 to 10 carbon atoms, a substituted or unsubstituted aryl group having 6 to 60 ring carbon atoms, or a substituted or unsubstituted heteroaryl group having 2 to 60 ring carbon atoms, "a" and "e" may be each independently an integer of 0 to 4, "b" and "c" may be each independently an integer of 0 to 5, and "d" may be an integer of 0 to 2.

The emission layer may include a host and a dopant, and the host may include the heterocyclic compound represented by Formula 1.

The emission layer may include a host and a dopant, and the dopant may include the heterocyclic compound represented by Formula 1.

The compound represented by Formula 1 may be represented by the following Formula 2:

[Formula 2]

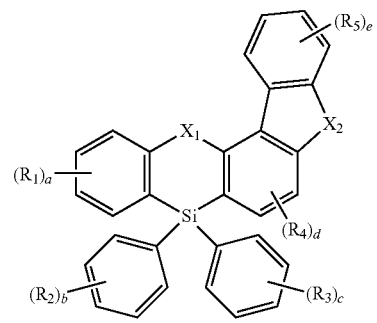

wherein, in Formula 2, $X_1$, $X_2$, $R_1$ to $R_5$, and "a" to "e" are defined the same as those of Formula 1.

$X_2$ may be $NR_6$, and $R_6$ may be a substituted or unsubstituted phosphine oxide group, a substituted or unsubstituted aryl group having 6 to 30 ring carbon atoms, or a substituted or unsubstituted heteroaryl group having 2 to 30 ring carbon atoms.

$X_2$ may be $NR_6$, and $R_6$ may be a diphenylphosphine oxide group, a substituted or unsubstituted phenyl group, a substituted or unsubstituted fluorene group, a substituted or unsubstituted pyridine group, a substituted or unsubstituted pyrimidyl group, a substituted or unsubstituted triazine group, a substituted or unsubstituted carbazole group, a substituted or unsubstituted dibenzofuran group, or a substituted or unsubstituted dibenzothiophene group.

The compound represented by Formula 1 may be represented by one of the following Formulae 2-1 to 2-3:

[Formula 2-1]

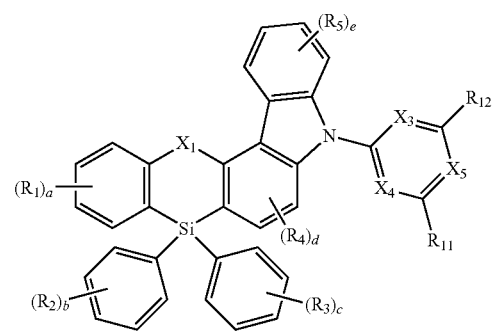

[Formula 2-2]

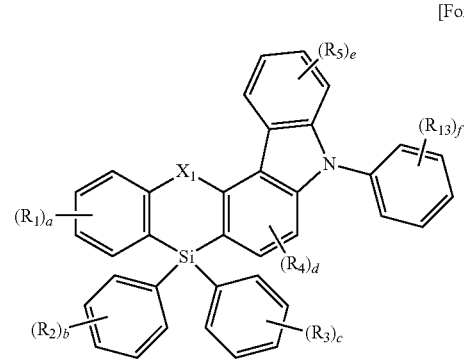

-continued

[Formula 2-3]

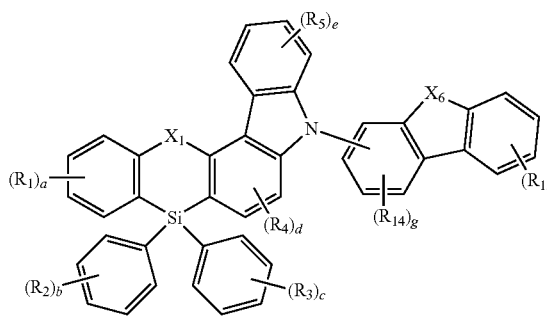

wherein, in Formula 2-1, $X_3$ to $X_5$ are each independently N or CH, at least one of $X_3$ to $X_5$ being N, $R_{11}$ and $R_{12}$ are defined the same as $R_1$ to $R_5$, wherein in Formula 2-2, $R_{13}$ is defined the same as $R_1$ to $R_5$, "f" is an integer of 0 to 5, wherein, in Formula 2-3, $X_6$ is O, S, $CR_{16}R_{17}$, or $NR_{18}$, $R_{14}$ to $R_{18}$ are defined the same as $R_1$ to $R_5$, "g" is an integer of 0 to 3, "h" is an integer of 0 to 4, and wherein, in Formulae 2-1 to 2-3, $X_1$, $R_1$ to $R_5$, and "a" to "e" are defined the same as those of Formula 1.

The compound represented by Formula 1 may be represented by the following Formula 3:

[Formula 3]

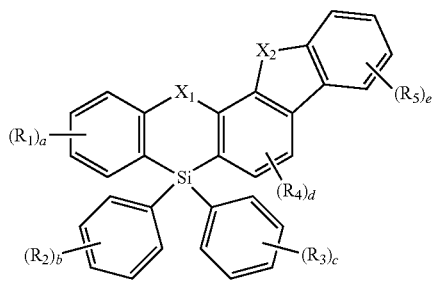

wherein, in Formula 3, $X_1$, $X_2$, $R_1$ to $R_5$ and "a" to "e" are defined the same as those of Formula 1.

The compound represented by Formula 1 may be represented by the following Formula 4:

[Formula 4]

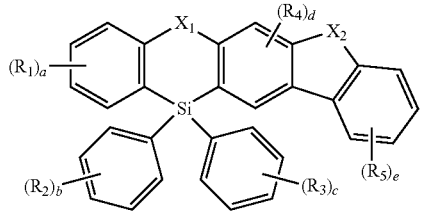

wherein, in Formula 4, $X_1$, $X_2$, $R_1$ to $R_5$ and "a" to "e" are defined the same as those of Formula 1.

The compound represented by Formula 1 may be represented by the following Formula 5:

[Formula 5]

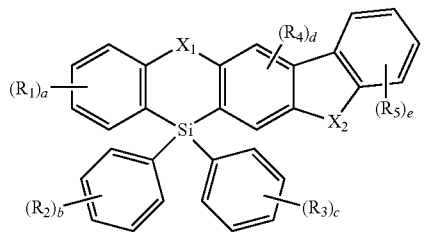

wherein, in Formula 5, $X_1$, $X_2$, $R_1$ to $R_5$ and "a" to "e" are defined the same as those of Formula 1.

The heterocyclic compound represented by Formula 1 may be a compound of the following Compound Group 1:

[Compound Group 1]

1

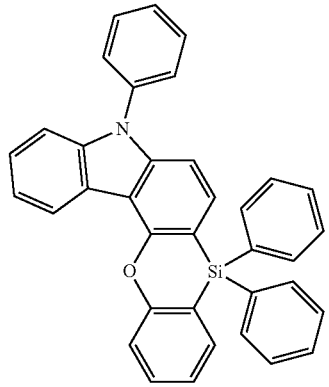

2

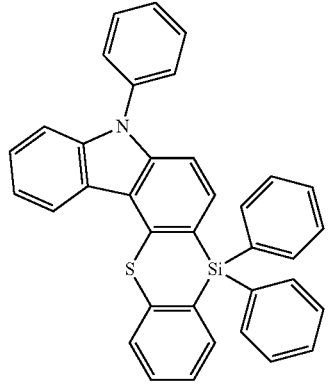

3

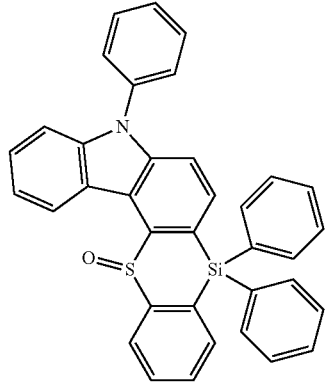

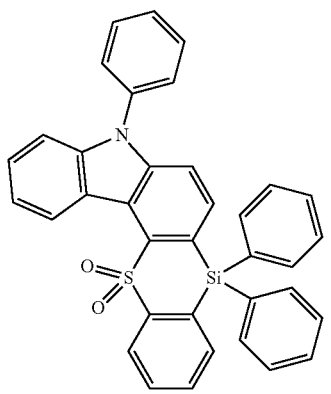
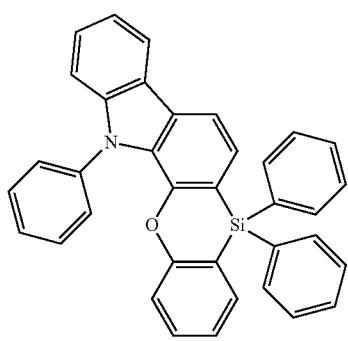
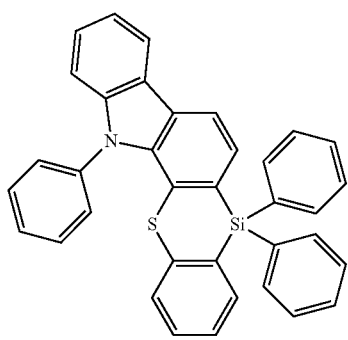
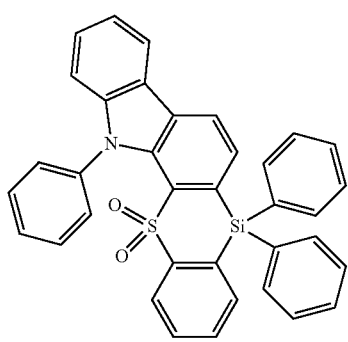
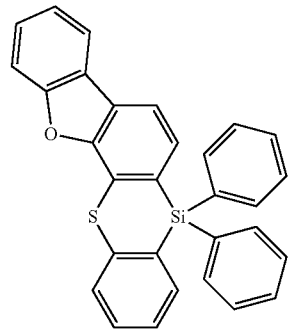
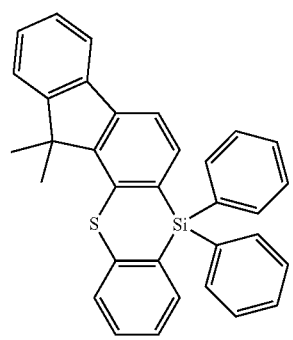
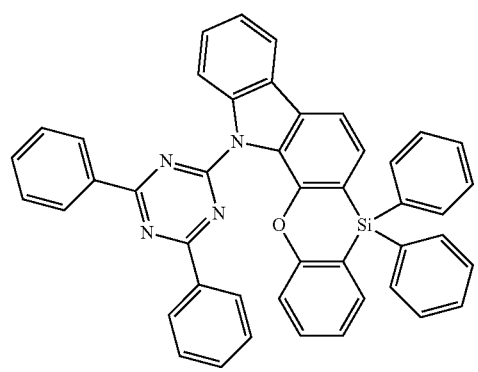
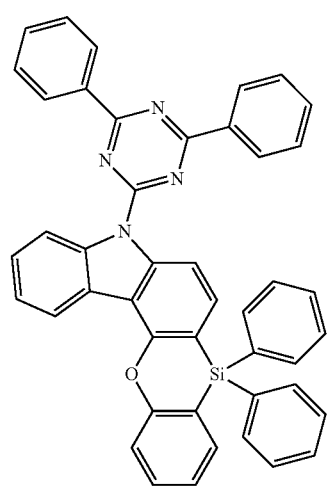

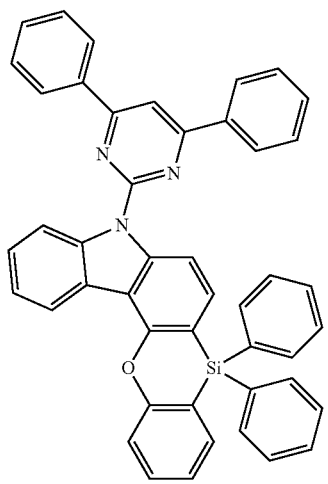
12
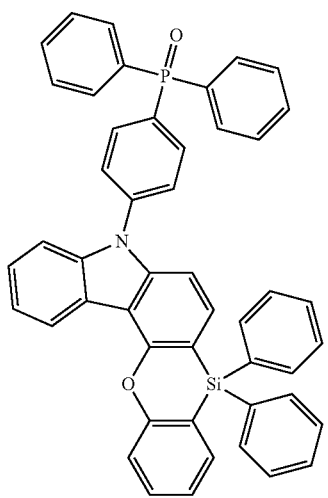
13
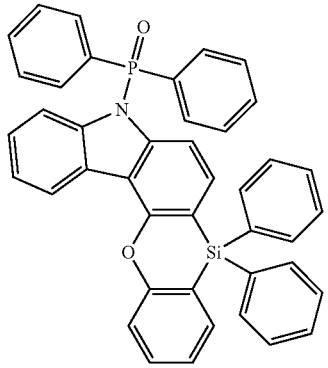
14
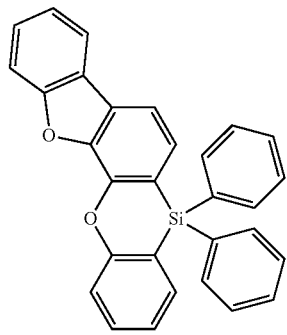
15
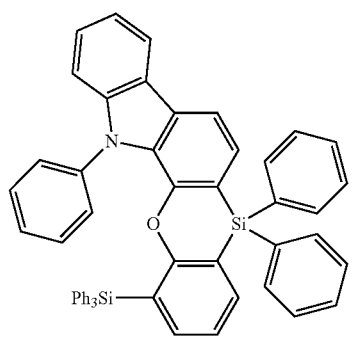
16
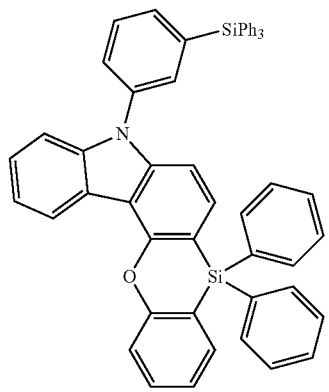
17
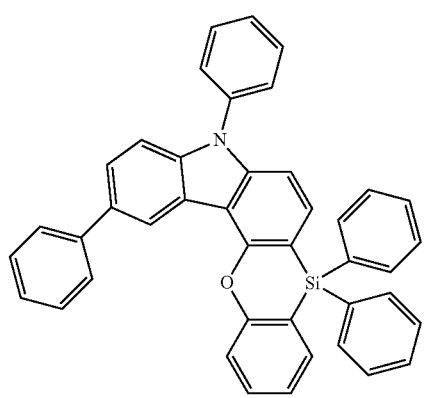
18

19
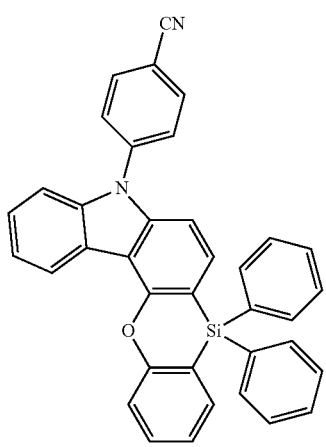
20
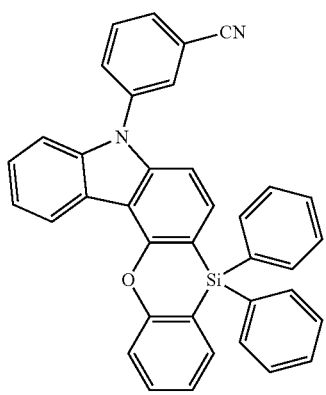
21
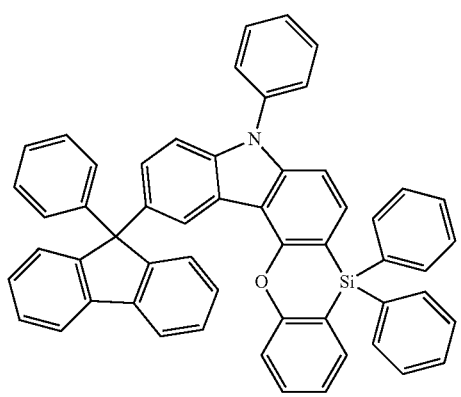
22
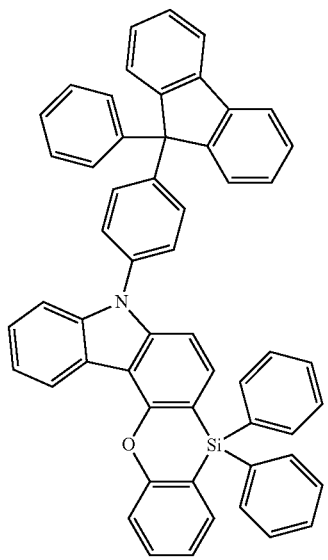
23
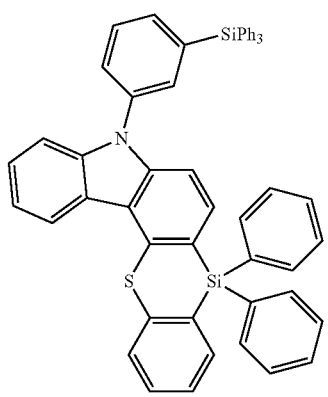
24
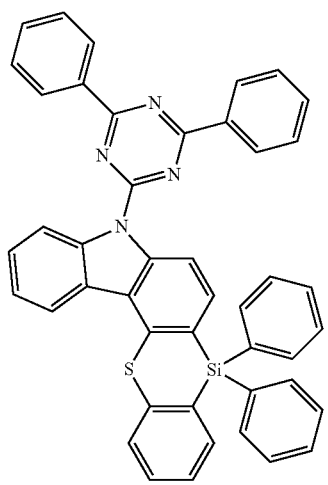

25
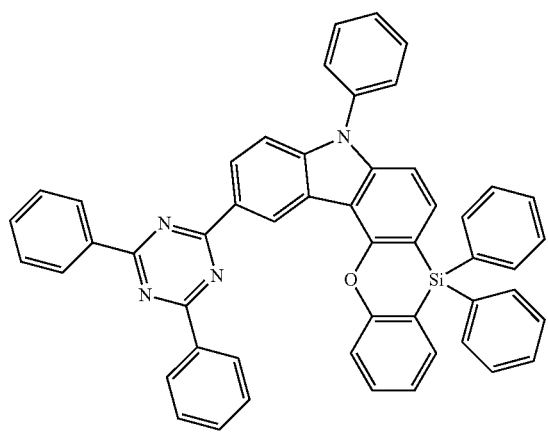
26
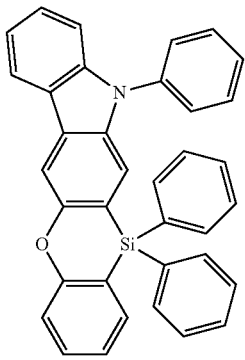
27
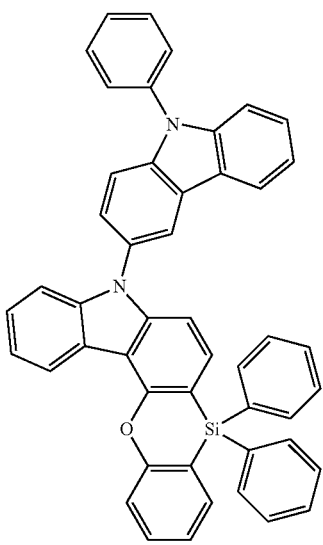
28
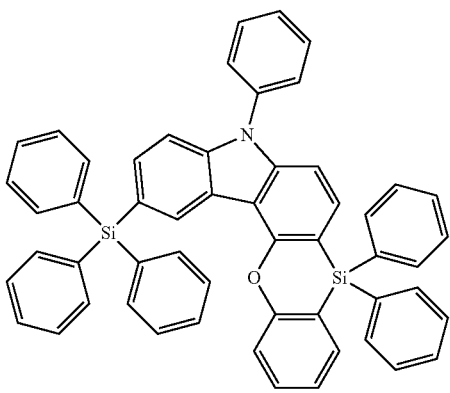
29
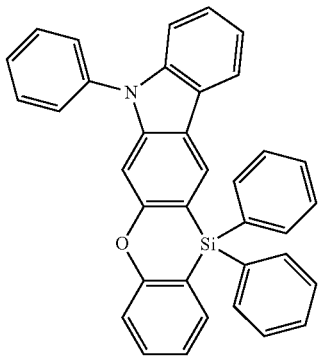
30
31

31
-continued
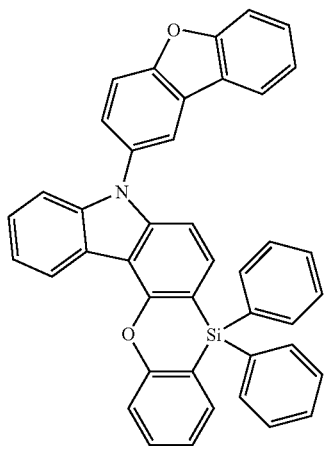
32
32
-continued
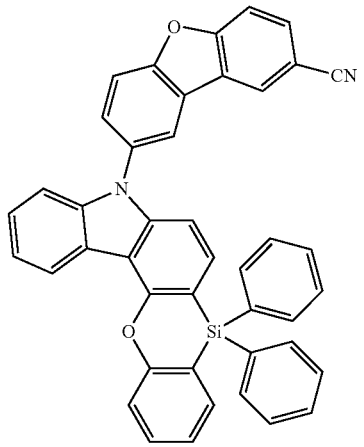
35
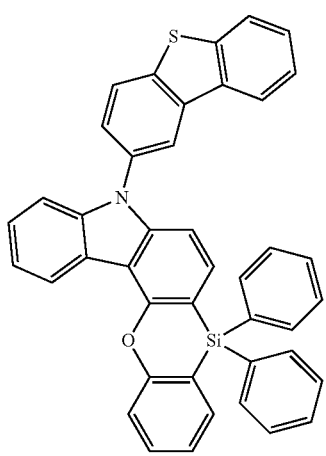
33
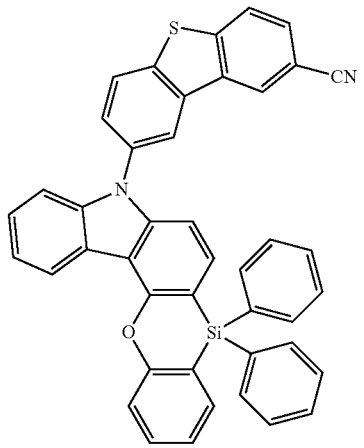
36
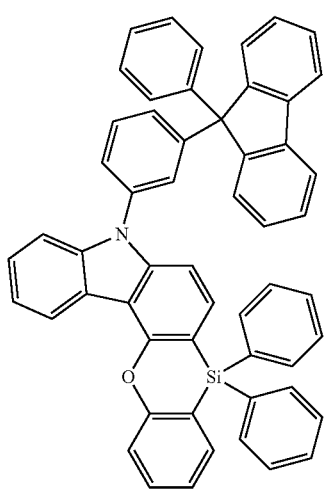
34
37

33
-continued
38
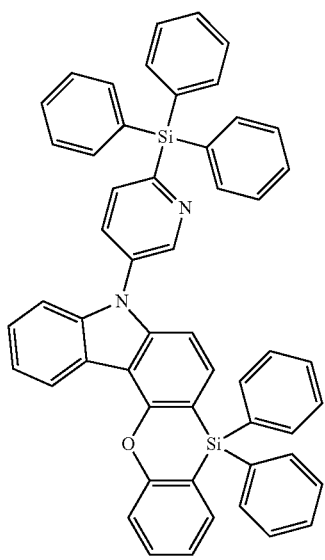
39
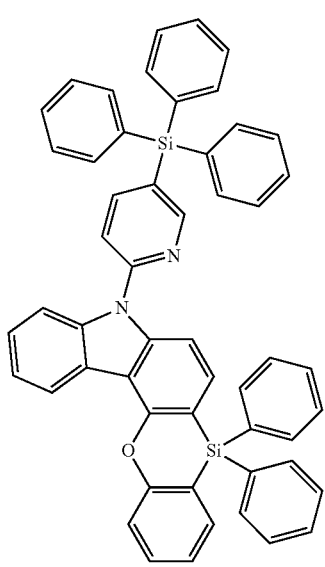
40
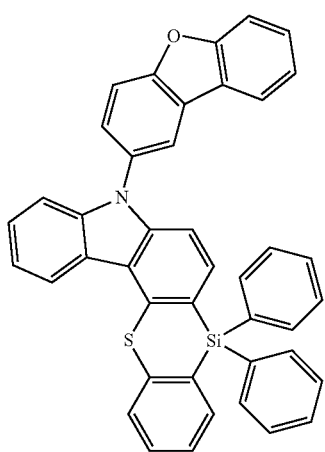
34
-continued
41
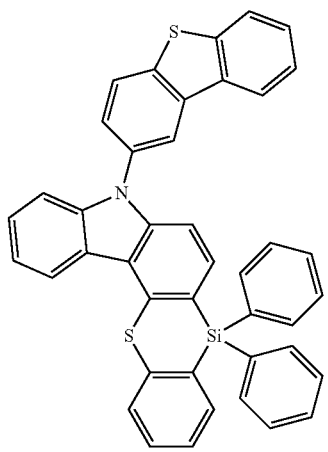
42
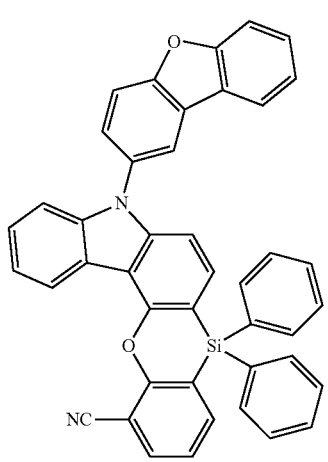
43
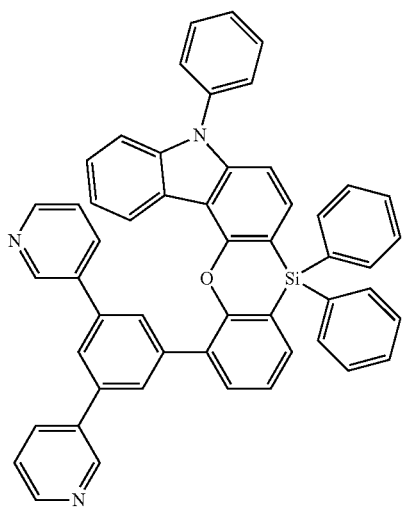

44
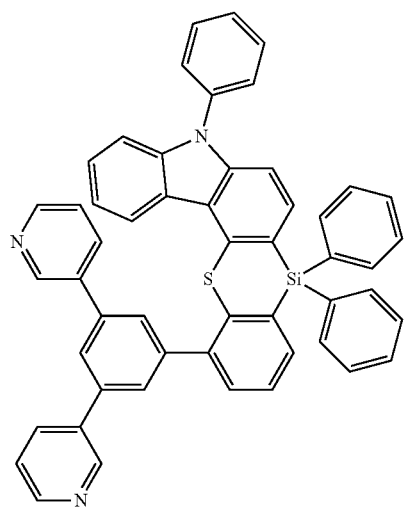
45
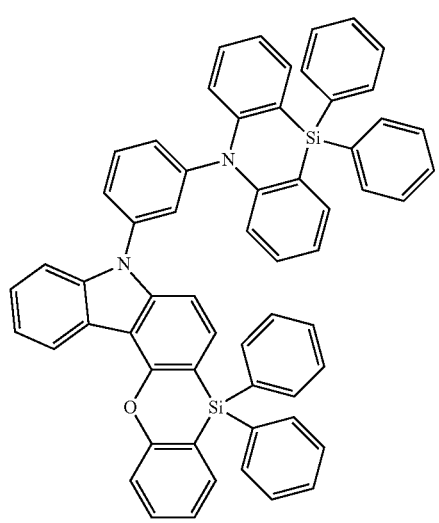
46
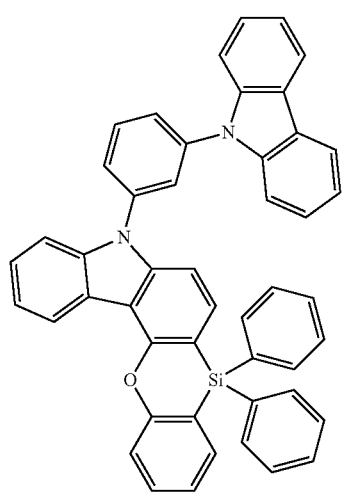
47
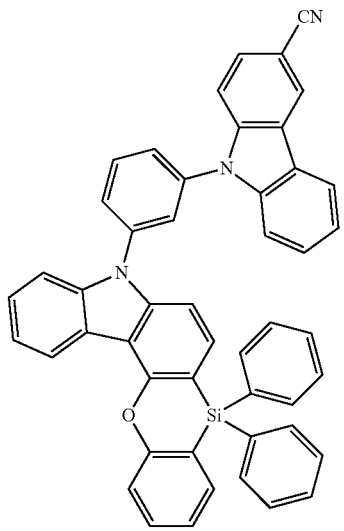
48
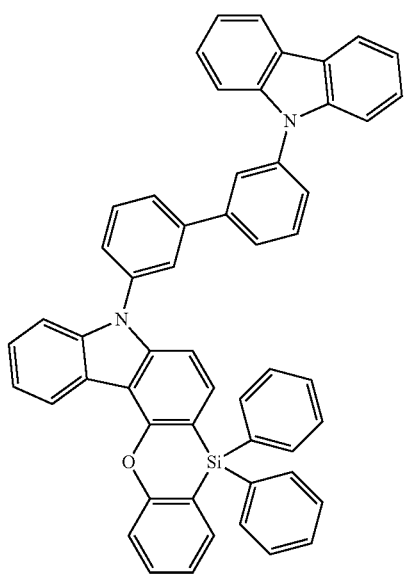
49
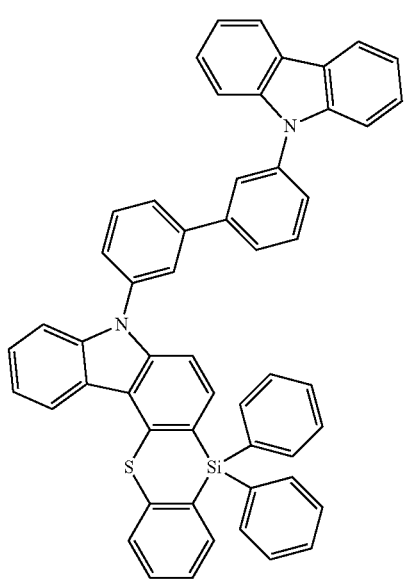

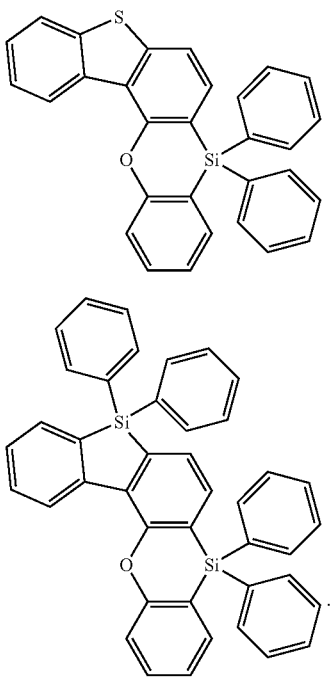

BRIEF DESCRIPTION OF THE FIGURES

Features will be apparent to those of skill in the art by describing in detail exemplary embodiments with reference to the attached drawings in which.

DETAILED DESCRIPTION

Figure 1:
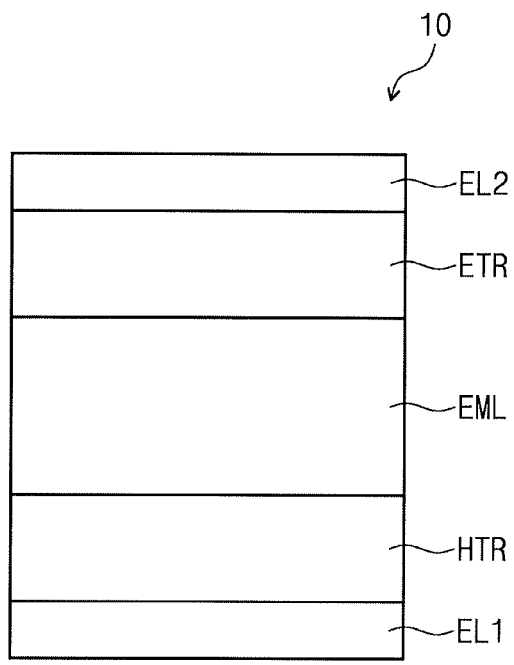
FIG. 1 illustrates a cross-sectional view of an organic electroluminescence device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Like reference numerals refer to like elements for explaining each drawing. In the drawings, the sizes of elements may be enlarged for clarity of the present disclosure. It will be understood that, although the terms first, second, etc. may be used herein to describe various elements, these elements should not be limited by these terms. These terms are only used to distinguish one element from another element. For example, a first element discussed below could be termed a second element, and similarly, a second element could be termed a first element. As used herein, the singular forms are intended to include the plural forms as well, unless the context clearly indicates otherwise.

It will be further understood that the terms "includes," "including," "comprises," or "comprising," when used in this specification, specify the presence of stated features, numerals, steps, operations, elements, parts, or a combination thereof, but do not preclude the presence or addition of one or more other features, numerals, steps, operations, elements, parts, or a combination thereof. It will also be understood that when a layer, a film, a region, a plate, etc. is referred to as being 'on' another part, it can be directly on the other part, or intervening layers may also be present. On the contrary, when a layer, a film, a region, a plate, etc. is referred to as being 'under' another part, it can be directly under the other part, or intervening layers may also be present. Herein, the term "or" is not an exclusive term, e.g., "A or B" includes A, B, or A and B.

In the present disclosure,

means a part to be connected or a bonding site.

In the present disclosure, "substituted or unsubstituted" may mean substituted with at least one substituent selected from the group consisting of a deuterium atom, a halogen atom, a cyano group, a nitro group, an amino group, a silyl group, a boron group, a phosphine oxide group, a phosphine sulfide group, an alkyl group, an alkenyl group, an aryl group, and a heterocycle, or unsubstituted. In addition, each of the substituent illustrated above may be substituted or unsubstituted. For example, a biphenyl group may be interpreted as an aryl group, or a phenyl group substituted with a phenyl group.

In the present disclosure, the term "forming a ring by combining with each other" may mean forming substituted or unsubstituted cyclic hydrocarbon, or substituted or unsubstituted heterocycle by combining with each other. The cyclic hydrocarbon may include aliphatic cyclic hydrocarbon and aromatic cyclic hydrocarbon. The heterocycle may include aliphatic heterocycle and aromatic heterocycle. The cyclic hydrocarbon and heterocycle may be a monocycle or polycycle. In addition, the ring formed by combining with an adjacent group may be connected with another ring to form a spiro structure.

In the present disclosure, a halogen atom may include a fluorine atom, a chlorine atom, a bromine atom, or an iodine atom.

In the present disclosure, the alkyl may have a linear or branched chain or a cycle shape. The carbon number of the alkyl may be 1 to 30, 1 to 20, 1 to 10, or 1 to 6. Examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldodecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyl eicosyl, 2-butyl eicosyl, 2-hexyl eicosyl, 2-octyl eicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the present disclosure, the alkenyl may have a linear chain, a branched chain, or a cyclic type. The carbon number of the alkenyl may be 2 to 30, 2 to 20, or 2 to 10, without specific limitation, and for the cyclic type, the carbon number may be 3 to 30, 3 to 20, or 3 to 10. Examples of the alkenyl may include vinyl, 1-butenyl, 1-pentenyl, 1,3-butadienyl aryl, styrenyl, styrylvinyl, etc., without limitation.

In the present disclosure, the aryl means any functional group or substituent derived from an aromatic cyclic hydrocarbon. The aryl may be monocyclic aryl or polycyclic aryl. The carbon number of the aryl for forming a ring may be 6 to 60, 6 to 30, 6 to 20, or 6 to 15. Examples of the aryl may include phenyl, naphthyl, fluorenyl, anthracenyl, phenanthryl, biphenyl, terphenyl, quaterphenyl, quinqphenyl, sexiphenyl, biphenylene, triphenylene, pyrenyl, benzofluoranthenyl, chrysenyl, etc., without limitation.

In the present disclosure, fluorenyl may be substituted, or two substituents may be combined with each other to form a spiro structure. Examples of the substituted fluorenyl are as follows. However, an embodiment of the present disclosure is not limited thereto.

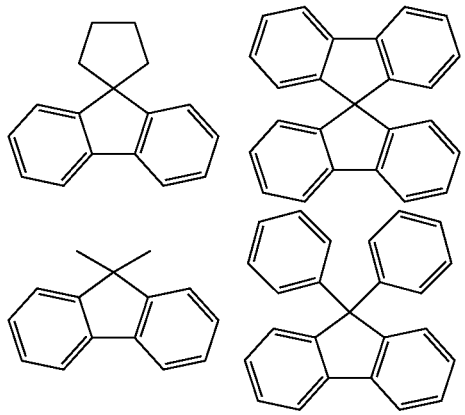

In the present disclosure, the heteroaryl may be heteroaryl including at least one of O, N, P, Si or S as a heteroatom. When the heteroaryl includes two heteroatoms, two heteroatoms may be the same or different from each other. The carbon number of the heteroaryl for forming a ring may be 2 to 60, 2 to 30, or 2 to 20. The heteroaryl may be monocyclic heteroaryl or polycyclic heteroaryl. The heteroaryl may have a structure, for example of two rings or three rings. Examples of the heteroaryl may include thiophene, furan, pyrrole, imidazole, thiazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phenoxazyl, phthalazinyl, pyrido pyrimidinyl, pyrido pyrazinyl, pyrazino pyrazinyl, isoquinoline, indole, carbazole, N-arylcarbazole, N-heteroaryl carbazole, N-alkyl carbazole, benzoxazole, benzoimidazole, benzothiazole, benzocarbazole, benzothiophene, dibenzothiophenyl, thienothiophene, benzofuranyl, phenanthroline, thiazolyl, isooxazolyl, oxadiazolyl, thiadiazolyl, benzothiazolyl, phenothiazinyl, dibenzosilole, dibenzofuranyl, etc., without limitation.

In the present disclosure, the silyl may include alkylsilyl and arylsilyl. Examples of the silyl may include trimethylsilyl, triethylsilyl, t-butyldimethylsilyl, vinyldimethylsilyl, propyldimethylsilyl, triphenylsilyl, diphenylsilyl, phenylsilyl, etc., without limitation.

In the present disclosure, the boron group may include alkyl boron and aryl boron. Examples of the boron group may include trimethylboron, triethylboron, t-butyldimethylboron, triphenylboron, diphenylboron, phenylboron, etc., without limitation.

In the present disclosure, the carbon number of the amino group is not specifically limited, but may be 1 to 30. The amino group may include an alkylamino group and arylamino group. Examples of the amino group may include a methylamino group, a dimethylamino group, a phenylamino group, a diphenylamino group, a naphthylamino group, a 9-methyl-anthracenylamino group, a triphenylamino group, etc., without limitation.

In the present disclosure, the phosphine oxide may be substituted with at least one of alkyl or aryl. Examples of the phosphine oxide may include phenylphosphine oxide, diphenylphosphine oxide, etc., without limitation.

First, the heterocyclic compound according to an embodiment of the present disclosure will be explained.

The heterocyclic compound according to an embodiment of the present disclosure may be represented by Formula 1 below.

[Formula 1]

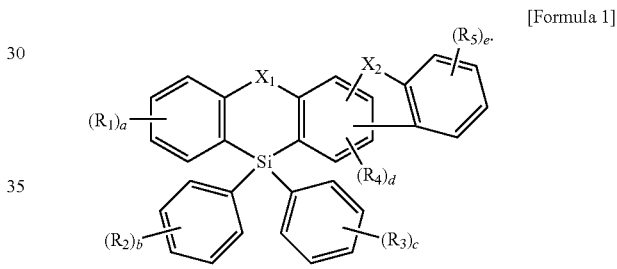

In Formula 1, $X_1$ may be, e.g., O, S, SO, or $SO_2$. $X_2$ may be, e.g., $NR_6$, $CR_7R_8$, $SiR_9R_{10}$, O, or S. $R_1$ to $R_{10}$ may each independently be or include, e.g., a hydrogen atom, a deuterium atom, a substituted or unsubstituted silyl group, a substituted or unsubstituted phosphine oxide group, a substituted or unsubstituted alkyl group having 1 to 10 carbon atoms, a substituted or unsubstituted alkenyl group having 2 to 10 carbon atoms, a substituted or unsubstituted aryl group having 6 to 60 ring carbon atoms, or a substituted or unsubstituted heteroaryl group having 2 to 60 ring carbon atoms. "a" and "e" may each independently be, e.g., an integer of 0 to 4. "b" and "c" may each independently be, e.g., an integer of 0 to 5. "d" may be, e.g., an integer of 0 to 2.

In the case where "a" is 2, 3, or 4, the 2, 3, or 4 $R_1$ may be the same or different. In the case where "b" is 2, 3, 4, or 5, the 2, 3, 4, or 5 $R_2$ may be the same or different. In the case where "c" is 2, 3, 4, or 5, the 2, 3, 4, or 5 $R_3$ may be the same or different. In the case where "d" is 2, the 2 $R_4$ may be the same or different. In the case where "e" is 2, 3, or 4, the 2, 3, or 4 $R_5$ may be the same or different.

In the case where "a" is 2 or more, adjacent $R_1$ groups may be combined with each other to form a ring. In the case where "b" is 2 or more, adjacent $R_2$ groups may be combined with each other to form a ring. In the case where "c" is 2 or more, adjacent $R_3$ groups may be combined with each other to form a ring. In the case where "d" is 2, adjacent $R_4$ groups may be combined with each other to form a ring. In the case where "e" is 2 or more, adjacent $R_5$ groups may be combined with each other to form a ring.

In an implementation, "a" may be, e.g., 0. In an implementation, "a" may be, e.g., 1, and $R_1$ may be or may include, e.g., a substituted or unsubstituted heteroaryl having 2 to 60 ring carbon atoms or a substituted or unsubstituted silyl group.

In an implementation, "b" and "c" may be, e.g., 0. In an implementation, at least one of "b" and "c" may be, e.g., 1 or more, at least one of $R_1$ and $R_3$ may be or may include, e.g., a deuterium atom, a halogen group, a substituted or unsubstituted alkyl group having 1 to 10 carbon atoms, or the like.

In an implementation, "d" may be, e.g., 0.

In an implementation, "e" may be, e.g., 0 or 1. In the case where "e" is 1, $R_5$ may be or may include, e.g., a substituted or unsubstituted aryl group having 6 to 60 ring carbon atoms, a substituted or unsubstituted heteroaryl group having 2 to 60 ring carbon atoms, or a substituted or unsubstituted silyl group.

$X_1$ may be, e.g., O or S. $X_1$ may be, e.g., O. $X_1$ may be, e.g., S. $X_1$ may be, e.g., SO. $X_1$ may be, e.g., $SO_2$.

$X_2$ may be, e.g., $NR_6$. $R_6$ may be or may include, e.g., a substituted or unsubstituted phosphine oxide group, a substituted or unsubstituted aryl group having 6 to 30 ring carbon atoms, or a substituted or unsubstituted heteroaryl group having 2 to 30 ring carbon atoms. In an implementation, $R_6$ may be or may include, e.g., a substituted or unsubstituted phenyl group. In an implementation, $R_6$ may be or may include, e.g., a phenyl group substituted with at least one of a substituted or unsubstituted phosphine oxide group, a cyano group, a substituted or unsubstituted silyl group, a substituted or unsubstituted aryl group, or a substituted or unsubstituted heteroaryl group. In an implementation, $R_6$ may be, e.g., an unsubstituted phenyl group. In an implementation, $R_6$ may be or may include, e.g., a substituted or unsubstituted fluorene group. In an implementation, when $R_6$ is the fluorene group, the fluorene group may be unsubstituted or substituted with at least one of alkyl, aryl, or nitro.

In an implementation, $R_6$ may be or may include, e.g., a substituted or unsubstituted triazine group, a substituted or unsubstituted pyrimidine group, or a diphenylphosphine oxide group. In an implementation, $R_6$ may be or may include, e.g., a substituted or unsubstituted carbazole group, a substituted or unsubstituted dibenzofuran group, or a substituted or unsubstituted dibenzothiophene group. In an implementation, when $R_6$ is the carbazole group, the carbazole group may be unsubstituted or substituted with a phenyl group. In an implementation, when $R_6$ is the dibenzofuran group or the dibenzothiophene group, the dibenzofuran group or the dibenzothiophene group may be unsubstituted or substituted with, e.g., a nitro group.

$X_2$ may be, e.g., $CR_7R_8$. $R_7$ and $R_8$ may each independently be or include, e.g., a hydrogen atom, a deuterium atom, a substituted or unsubstituted alkyl group having 1 to 10 carbon atoms, a substituted or unsubstituted aryl group having 6 to 30 ring carbon atoms, or a substituted or unsubstituted heteroaryl group having 2 to 30 ring carbon atoms. $R_7$ and $R_8$ may be the same or different. In an implementation, $R_7$ and $R_3$ may each independently be or include, e.g., a substituted or unsubstituted alkyl group having 1 to 10 carbon atoms. In an implementation, each of $R_7$ and $R_8$ may be, e.g., a methyl group.

In an implementation, $X_2$ may be, e.g., O, S, or $SiR_9R_{10}$. $R_9$ and $R_{10}$ may each independently be or include, e.g., a hydrogen atom, a deuterium atom, a substituted or unsubstituted alkyl group having 1 to 10 carbon atoms, a substituted or unsubstituted aryl group having 6 to 30 ring carbon atoms, or a substituted or unsubstituted heteroaryl group having 2 to 30 ring carbon atoms. $R_9$ and $R_{10}$ may be the same or different. In an implementation, $R_9$ and $R_{10}$ may each independently be or include, e.g., a substituted or unsubstituted alkyl group having 1 to 10 carbon atoms. In an implementation, each of $R_9$ and $R_{10}$ may be, e.g., a methyl group.

In an implementation, $R_1$ to $R_{10}$ may each independently be or include, e.g., a hydrogen atom or a methyl group, or at least one of $R_1$ to $R_{10}$ may be represented by one of the structures below. Each of the structures may be substituted or unsubstituted.

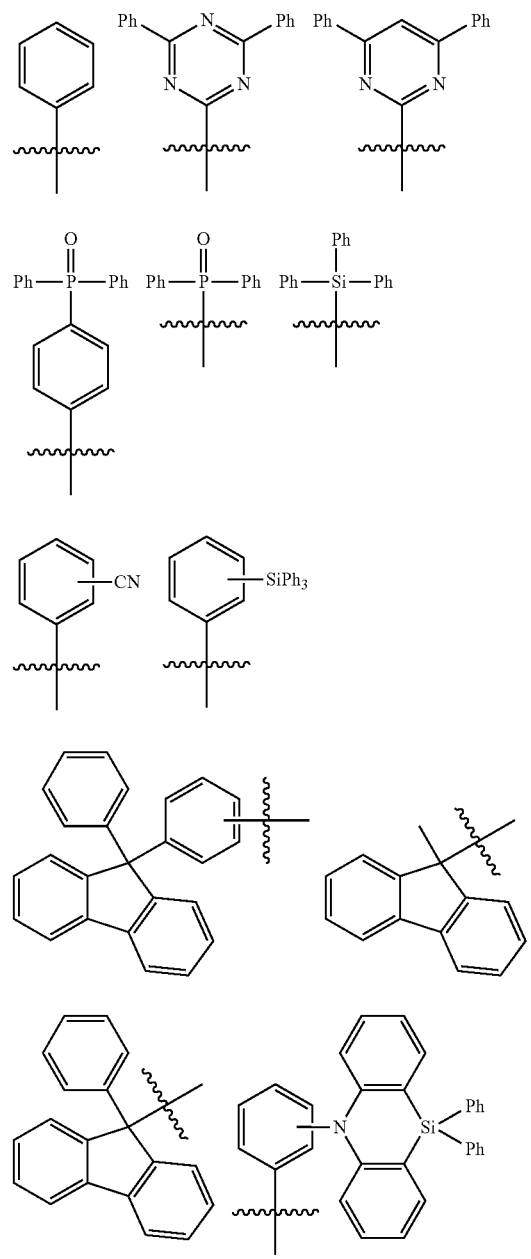

-continued

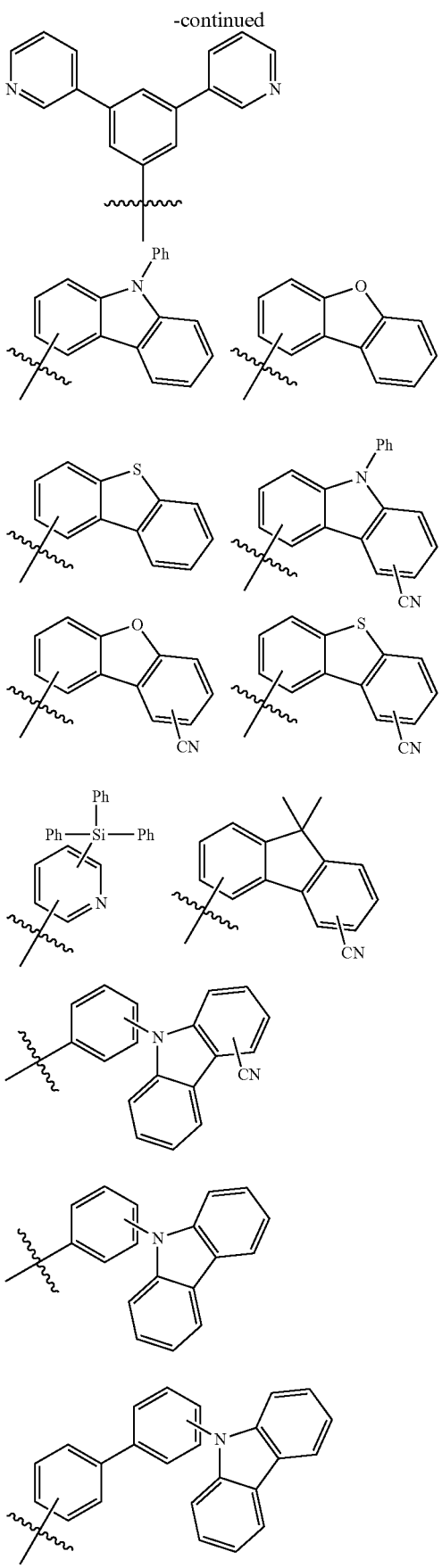

In the structures, Ph means a phenyl group.

In an implementation, the compound represented by Formula 1 may be represented by Formula 2 below.

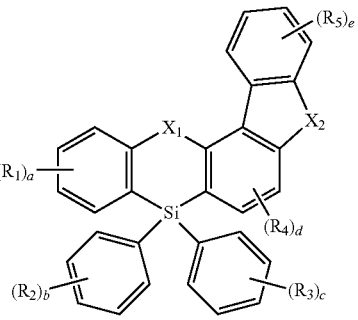

[Formula 2]

In Formula 2, $X_1$, $X_2$, $R_1$ to $R_5$, and "a" to "e" may be the same as described above.

In an implementation, in Formula 2, $X_2$ may be, e.g., $NR_6$, and $R_6$ may be or may include, e.g., a substituted or unsubstituted phosphine oxide group, a substituted or unsubstituted aryl group having 6 to 30 ring carbon atoms, or a substituted or unsubstituted heteroaryl group having 2 to 30 ring carbon atoms.

In an implementation, in Formula 2, $X_2$ may be, e.g., $NR_6$, and $R_6$ may be or may include, e.g., a diphenylphosphine oxide group, a substituted or unsubstituted phenyl group, a substituted or unsubstituted fluorene group, a substituted or unsubstituted pyridine group, a substituted or unsubstituted pyrimidyl group, a substituted or unsubstituted triazine group, a substituted or unsubstituted carbazole group, a substituted or unsubstituted dibenzofuran group, or a substituted or unsubstituted dibenzothiophene group.

In an implementation, in Formula 2, $X_2$ may be, e.g., $NR_6$, and $R_6$ may be, e.g., a monocyclic heteroaryl group substituted with a substituted or unsubstituted silyl group, for example, a pyridine group substituted with an arylsilyl group, or a pyridine group substituted with a triphenylsilyl group.

In an implementation, the compound represented by Formula 2 may be, e.g., represented by one of Formulae 2-1 to 2-3 below.

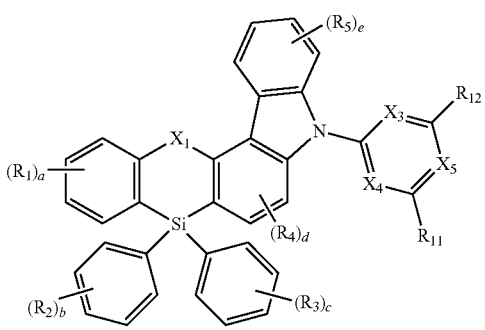

[Formula 2-1]

-continued

[Formula 2-2]

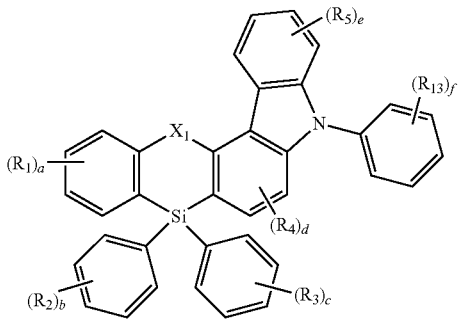

[Formula 2-3]

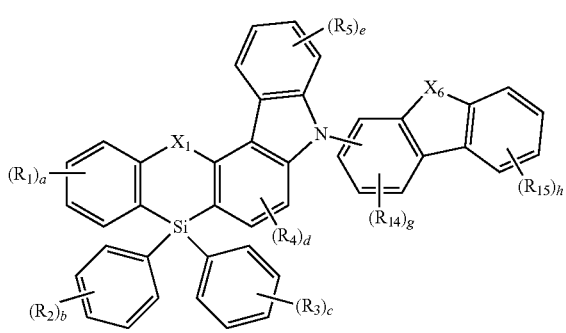

In Formula 2-1, $X_3$ to $X_5$ may each independently be, e.g., N or CH, at least one of $X_3$ to $X_5$ being N. The definition on $R_{11}$ and $R_{12}$ may be the same as that of $R_1$ to $R_5$, and $X_1$, $R_1$ to $R_5$, and "a" to "e" are the same as described above.

In Formula 2-2, the definition on $R_{13}$ may be the same as that of $R_1$ to $R_5$, "f" may be, e.g., an integer of 0 to 5, and $X_1$, $R_1$ to $R_5$, and "a" to "e" may be the same as described above.

In Formula 2-3, $X_6$ may be, e.g., O, S, $CR_{16}R_{17}$, or $NR_{18}$, the definition of $R_{14}$ to $R_{18}$ may be the same as that of $R_1$ to $R_5$, "g" may be, e.g., an integer of 0 to 3, "h" may be, e.g., an integer of 0 to 4, and $X_1$, $R_1$ to $R_5$, and "a" to "e" may be the same as described above.

In Formula 2-1, $R_{11}$ and $R_{12}$ may each independently be or include, e.g., a substituted or unsubstituted aryl group having 6 to 30 ring carbon atoms.

In Formula 2-1, $R_{11}$ and $R_{12}$ may each independently be or include, e.g., a substituted or unsubstituted phenyl group.

In Formula 2-2, in the case where "f" is 2 or more, a plurality of $R_{13}$ may be the same or different.

In an implementation, in Formula 2-2, "f" may be, e.g., 0 or 1. In the case where "f" is 1, $R_{13}$ may be or may include, e.g., a cyano group, a substituted or unsubstituted silyl group, or a substituted or unsubstituted aryl group having 6 to 30 ring carbon atoms.

In Formula 2-3, in the case where "g" is 2 or more, a plurality of $R_{14}$ may be the same or different, and in the case where "h" is 2 or more, a plurality of $R_{15}$ may be the same or different.

In an implementation, the compound represented by Formula 1 may be, e.g., represented by Formula 3 below.

[Formula 3]

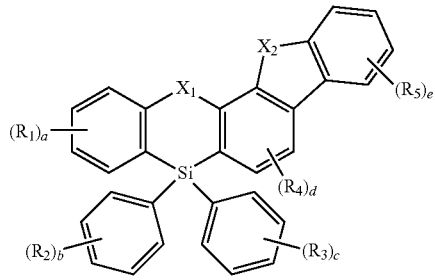

In Formula 3, $X_1$, $X_2$, $R_1$ to $R_5$ and "a" to "e" may be the same as described above.

In an implementation, the compound represented by Formula 1 may be, e.g., represented by Formula 4 below.

[Formula 4]

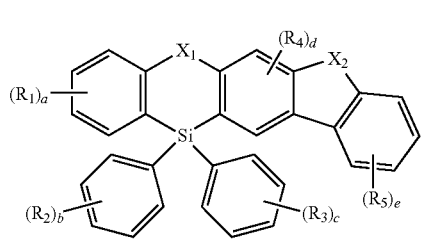

In Formula 4, $X_1$, $X_2$, $R_1$ to $R_5$ and "a" to "e" may be the same as described above.

In an implementation, in Formula 4, $X_1$ may be, e.g., O or S.

In an implementation, in Formula 4, $X_2$ may be, e.g., $NR_5$. In an implementation, $R_6$ may be or may include, e.g., a substituted or unsubstituted aryl group having 6 to 30 ring carbon atoms or a substituted or unsubstituted heteroaryl group having 2 to 30 ring carbon atoms.

In an implementation, the compound represented by Formula 1 may be, e.g., represented by Formula 5 below.

[Formula 5]

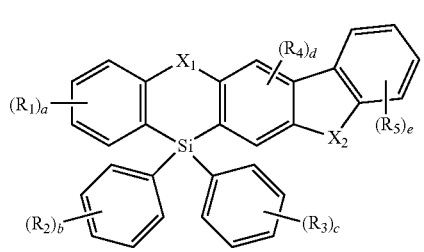

In Formula 5, $X_1$, $X_2$, $R_1$ to $R_5$ and "a" to "e" may be the same as described above.

In an implementation, in Formula 5, $X_1$ may be, e.g., O or S.

In an implementation, in Formula 5, $X_2$ may be, e.g., $NR_6$. In an implementation, $R_6$ may be or may include, e.g., a substituted or unsubstituted aryl group having 6 to 30 ring carbon atoms or a substituted or unsubstituted heteroaryl group having 2 to 30 ring carbon atoms.

In an implementation, the heterocyclic compound represented by Formula 1 may be, e.g., a compound of Compound Group 1 below.

[Compound Group 1]
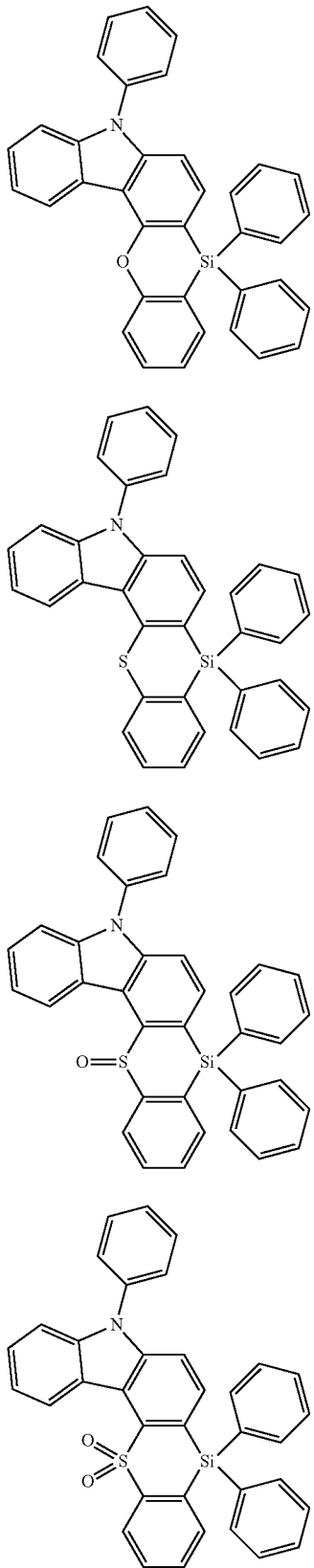
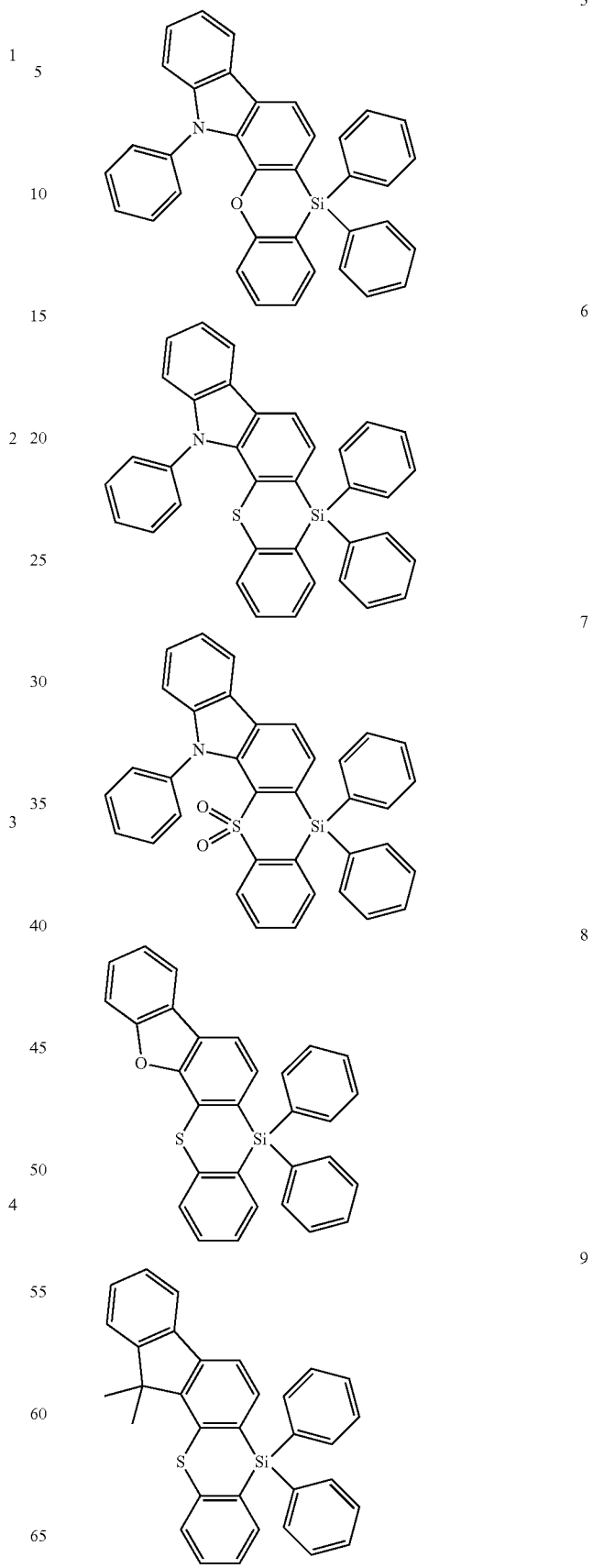

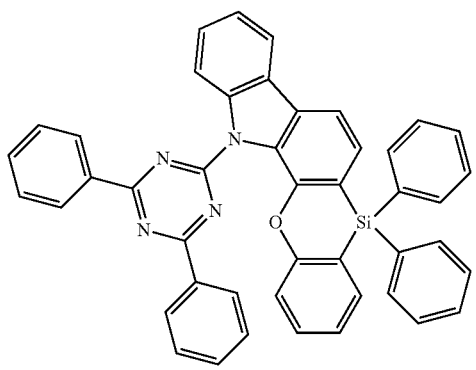
10
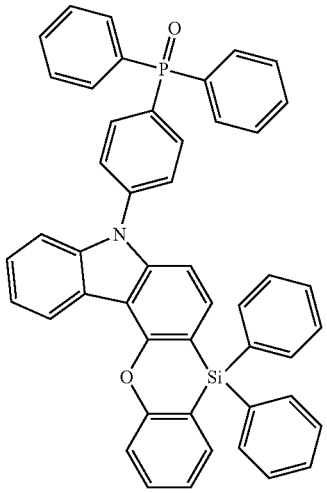
13
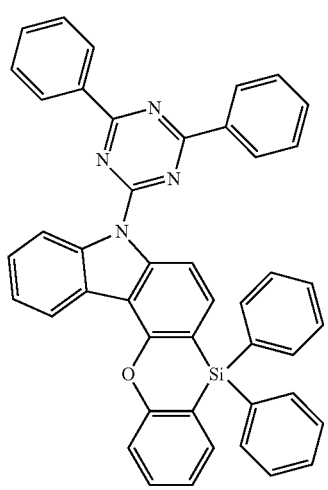
11
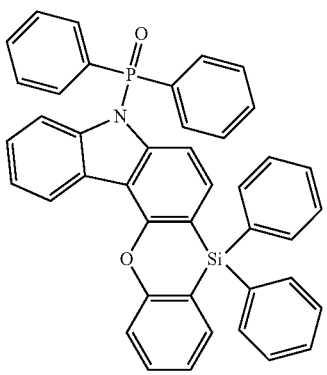
14
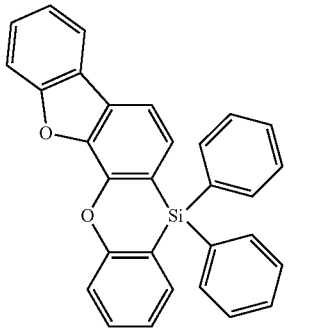
15
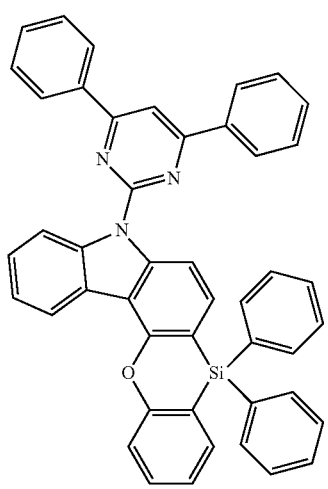
12
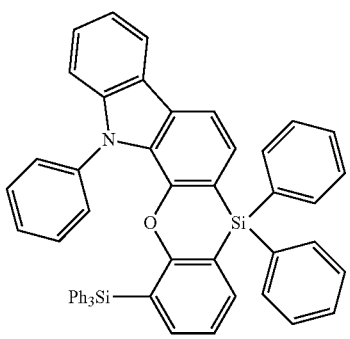
16

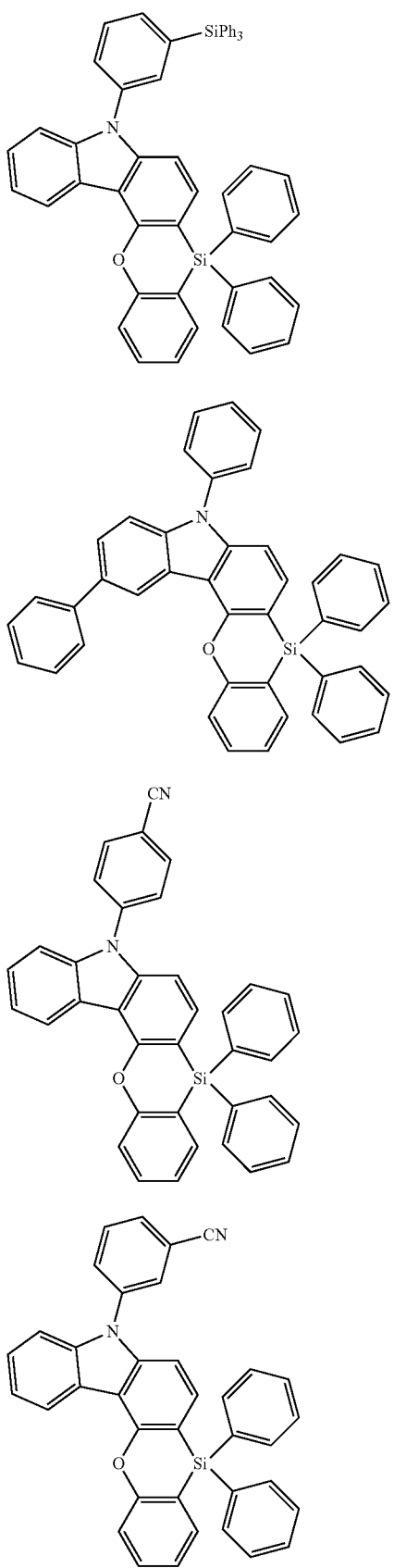
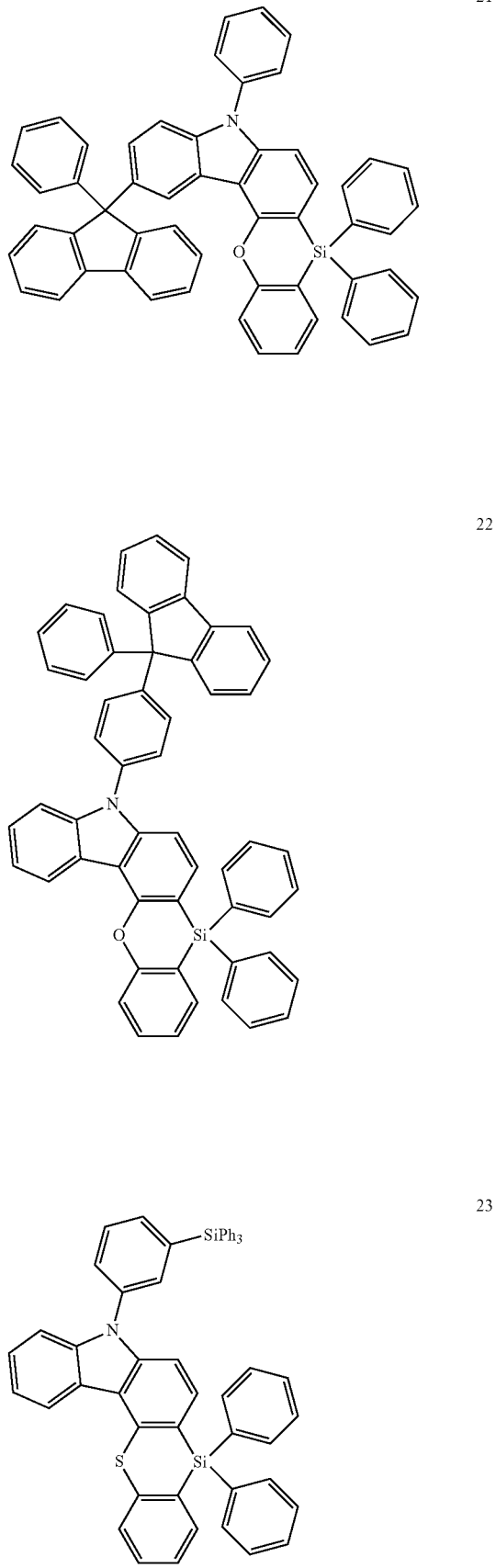

53
-continued
24
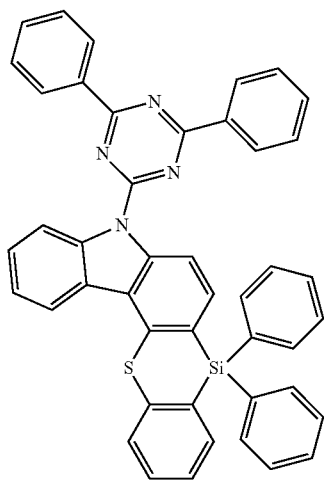
25
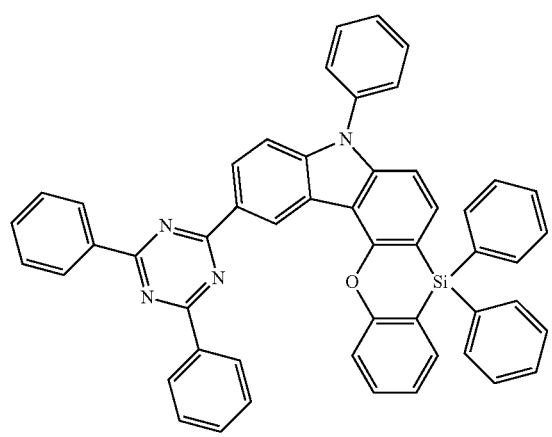
26
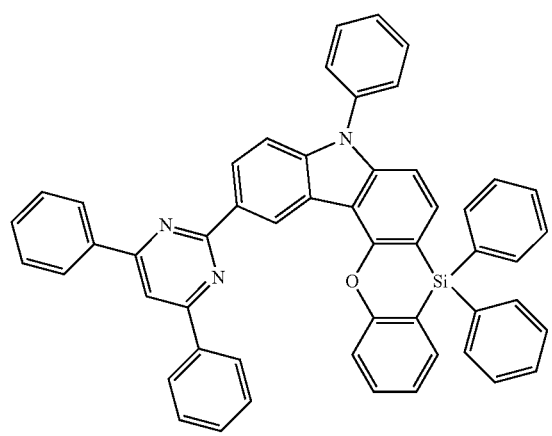
54
-continued
27
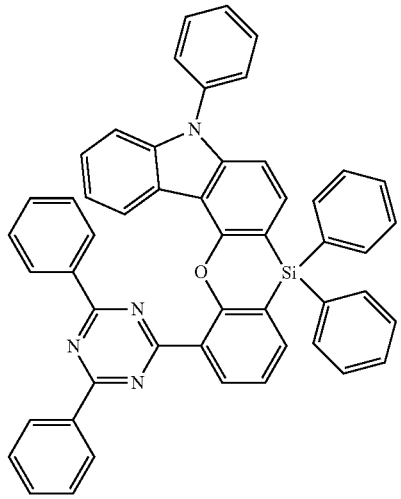
28
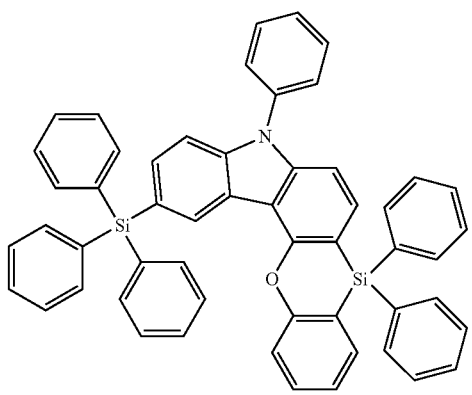
29
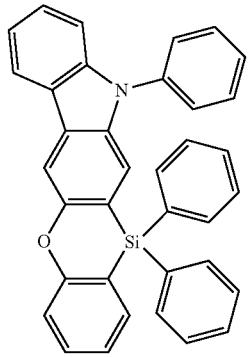
30
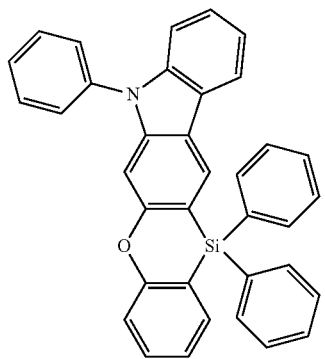

31
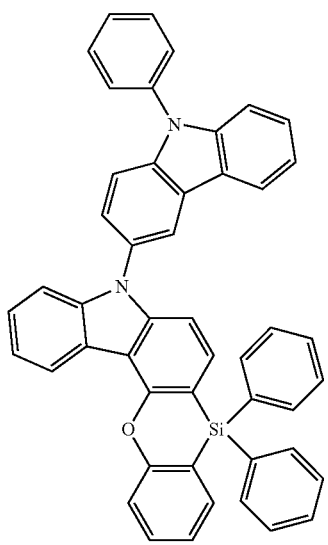
32
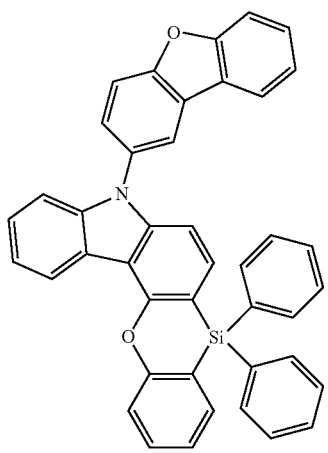
33
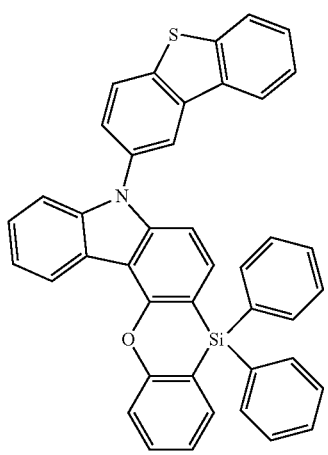
34
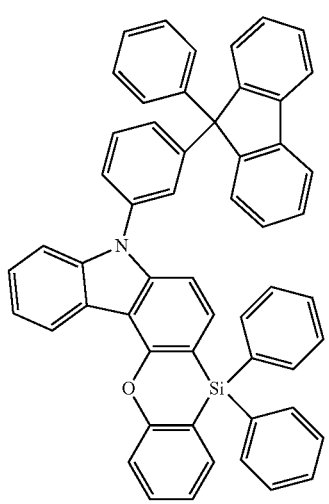
35
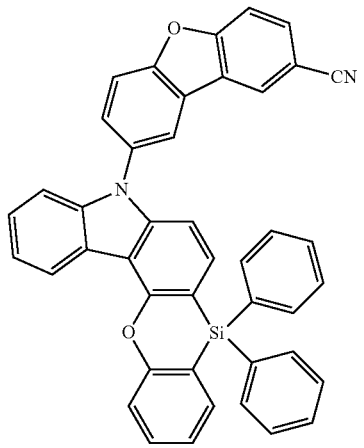
36
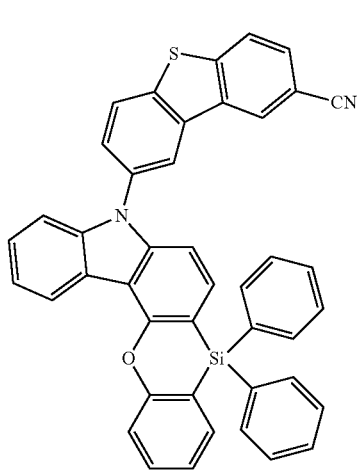

37
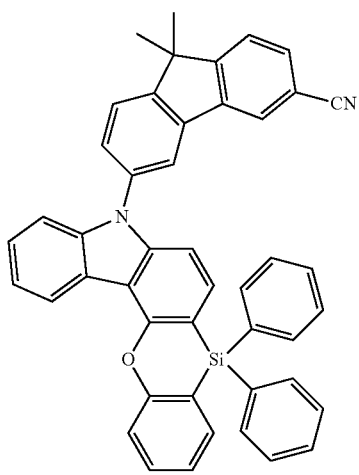
38
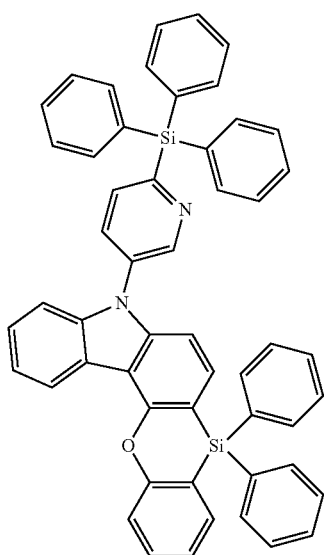
39
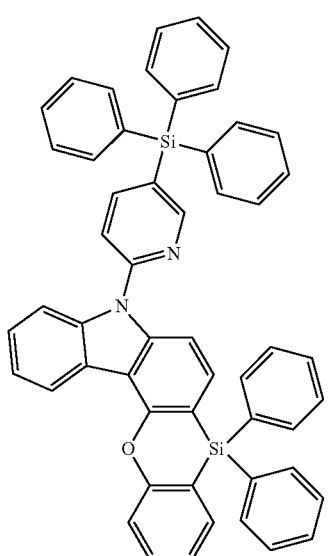
40
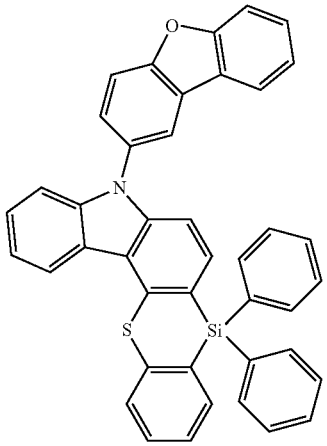
41
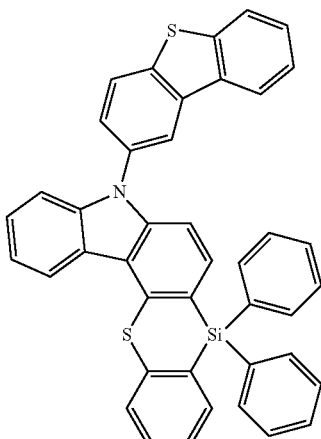
42
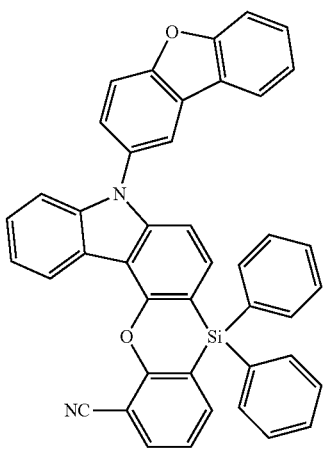

43
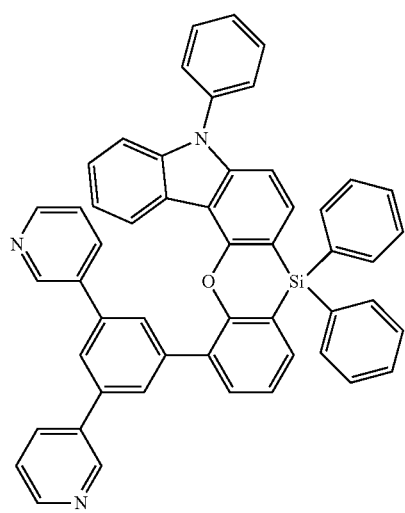
44
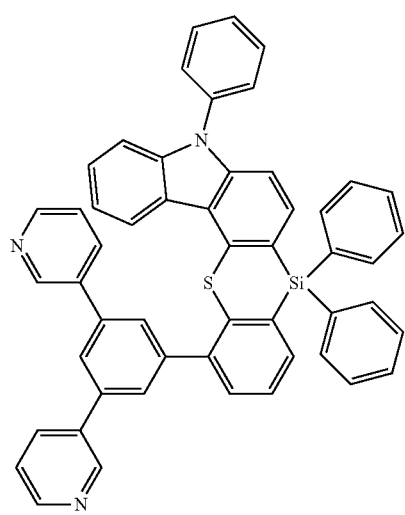
45
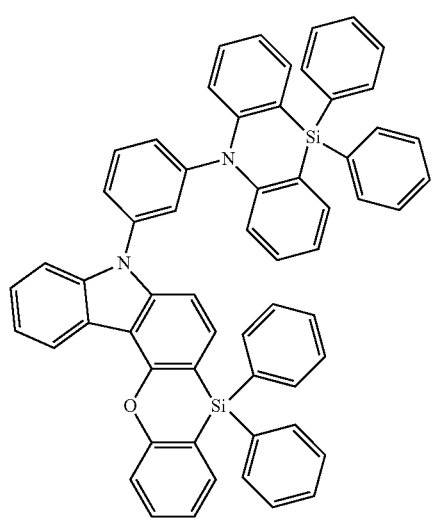
46
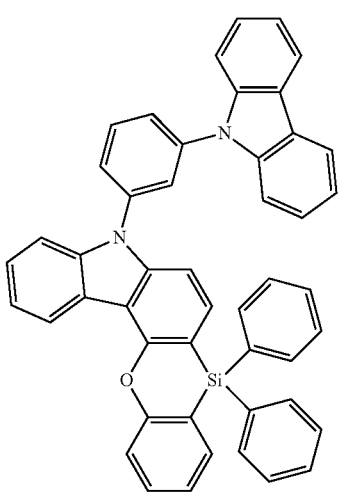
47
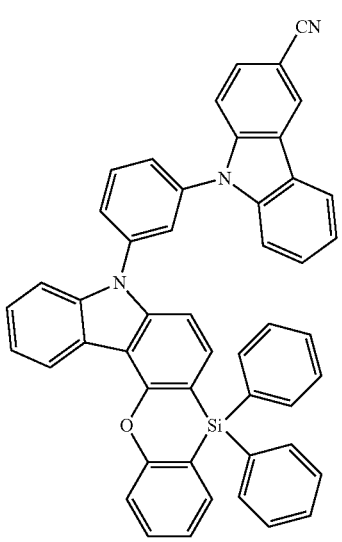
48
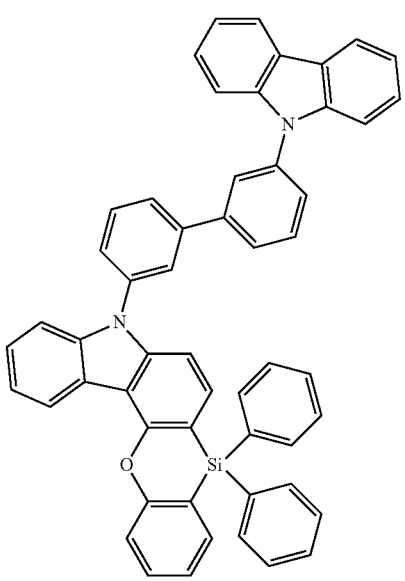

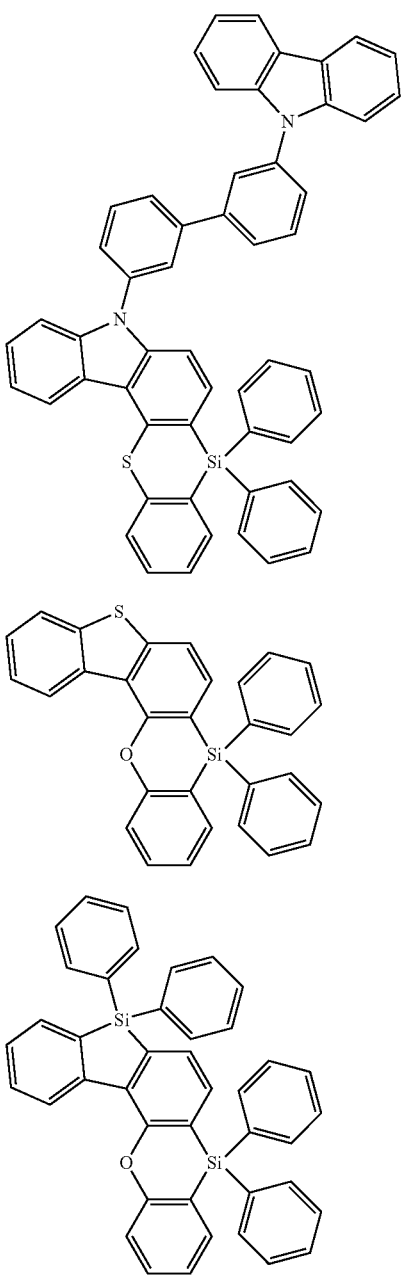

The heterocyclic compound according to an embodiment of the present disclosure may include a silicon bridge in a molecule, restraining effect of conjugation in a molecule may be attained, and thus, relatively high triplet energy may be obtained. For example, steric effect may be increased due to the effect of Si, and thus interatomic dihedral angle may be increased, and conjugation may be broken. Accordingly, the heterocyclic compound according to an embodiment of the present disclosure may be efficiently used as a blue phosphorescence emitting host. In an implementation, the heterocyclic compound may be used as, e.g., a material for thermally activated delayed fluorescence (TADF) by introducing an appropriate substituent.

In an implementation, the heterocyclic compound according to an embodiment of the present disclosure may introduce various substituents, and thus, the control of an energy level and molecular polarity in line with a device configuration may be favorable. In an implementation, the structure represented of the heterocyclic compound according to an embodiment of the present disclosure, represented by Formula 1 may be favorable in consideration of emission efficiency and energy transfer.

In an implementation, the heterocyclic compound according to an embodiment of the present disclosure may function as a luminescent material of an organic electroluminescence device. Accordingly, an organic electroluminescent device including the heterocyclic compound according to an embodiment of the present disclosure is favorable for attaining high efficiency, long life, and a low driving voltage.

In an implementation, the heterocyclic compound represented by Formula 1 may be prepared based on synthetic embodiments which will be described later.

Hereinafter, an organic electroluminescence device according to an embodiment will be explained. The explanation will be mainly with the difference in the heterocyclic compound according to an embodiment of the present disclosure, and unexplained part will follow the above-description on the heterocyclic compound according to an embodiment of the present disclosure.

The organic electroluminescence device according to an embodiment of the present disclosure may include the above-described heterocyclic compound.

Figure 2:
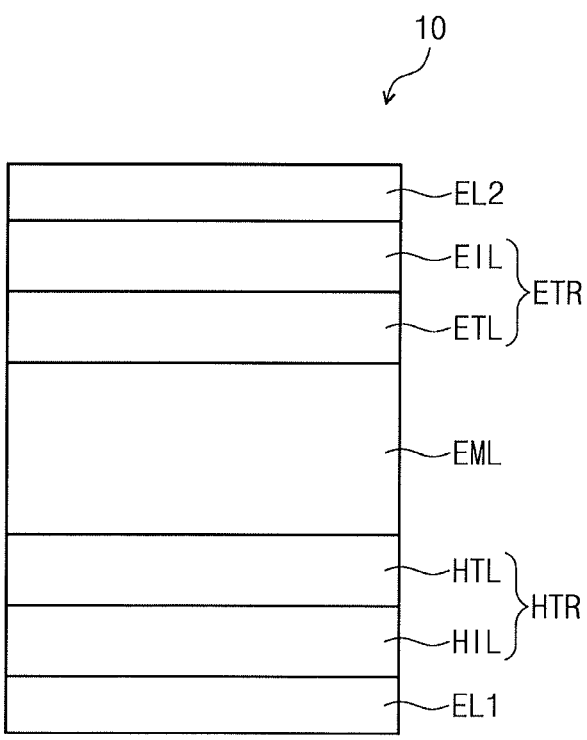
FIG. 2 illustrates a cross-sectional view of an organic electroluminescence device according to an embodiment of the present disclosure.

FIG. 1 illustrates a cross-sectional view of an organic electroluminescence device according to an embodiment of the present disclosure. FIG. 2 illustrates a cross-sectional view of an organic electroluminescence device according to an embodiment of the present disclosure.

Referring to FIGS. 1 and 2, an organic electroluminescence device 10 according to an embodiment of the present disclosure may include, e.g., a first electrode EL1, a hole transport region HTR, an emission layer EML, an electron transport region ETR, and a second electrode EL2.

The first electrode EL1 and the second electrode EL2 may be oppositely disposed to each other, and a plurality of organic layers may be disposed between the first electrode EL1 and the second electrode EL2. The plurality of the organic layers may include, e.g., a hole transport region HTR, an emission layer EML, and an electron transport region ETR.

The organic electroluminescence device 10 according to an embodiment of the present disclosure may include the heterocyclic compound in at least one of the plurality of the organic layers disposed between the first electrode EL1 and the second electrode EL2.

Hereinafter, an embodiment of including the heterocyclic compound in the emission layer EML will be explained. In an implementation, the hole transport region HTR may include the heterocyclic compound.

The first electrode EL1 has conductivity. The first electrode EL1 may be a pixel electrode or an anode. The first electrode EL1 may be a transmissive electrode, a transflective electrode, or a reflective electrode. In the case where the first electrode EL1 is the transmissive electrode, the first electrode EL1 may be formed using a transparent metal oxide such as indium tin oxide (ITO), indium zinc oxide (IZO), zinc oxide (ZnO), or indium tin zinc oxide (ITZO). In the case where the first electrode EL1 is the transflective electrode or reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may include a plurality of layers including the reflective layer or transflective layer formed using the above materials, or a transparent layer formed using ITO, IZO, ZnO, or ITZO. For example, the first electrode EL1 may have a three-layer structure of ITO/Ag/ITO.

The thickness of the first electrode EL1 may be from about 1,000 Å to about 10,000 Å, e.g., from about 1,000 Å to about 3,000 Å.

The hole transport region HTR may be provided on the first electrode EL1. The hole transport region HTR may include at least one of a hole injection layer HIL, a hole transport layer HTL, a hole buffer layer, or an electron blocking layer. The thickness of the hole transport region HTR may be, e.g., from about 1,000 Å to about 1,500 Å.

The hole transport region HTR may have a single layer formed using a single material, a single layer formed using a plurality of different materials, or a multilayer structure including a plurality of layers formed using a plurality of different materials.

For example, the hole transport region HTR may have the structure of a single layer such as a hole injection layer HIL and a hole transport layer HTL, or may have a structure of a single layer formed using a hole injection material and a hole transport material. In an implementation, the hole transport region HTR may have a structure of a single layer formed using a plurality of different materials, or a structure laminated one by one from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole injection layer HIL may include, e.g., a phthalocyanine compound such as copper phthalocyanine; N,N'-diphenyl-N,N'-bis-[4-(phenyl-m-tolyl-amino)-phenyl]-biphenyl-4,4'-diamine (DNTPD), 4,4',4''-tris(3-methylphenylphenylamino)triphenylamine (m-MTDATA), 4,4',4''-tris(N,N-diphenylamino)triphenylamine (TDATA), 4,4',4''-tris{N-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-dinaphthalene-1-yl)-N,N'-diphenyl-benzidine (NPB), triphenylamine-containing polyether ketone (TPAPEK), 4-isopropyl-4'-methyldiphenyliodonium tetrakis(pentafluorophenyl)borate, dipyrazino[2,3-f: 2',3'-h] quinoxaline-2,3,6,7,10,11-hexacarbonitrile (HAT-CN), etc.

The hole transport layer HTL may include, e.g., carbazole derivatives such as N-phenyl carbazole and polyvinyl carbazole, fluorine-based derivatives, N,N'-bis(3-methylphenyl)-N,N'-diphenyl-[1,1-biphenyl]-4,4'-diamine (TPD), triphenylamine-based derivatives such as 4,4',4''-tris(N-carbazolyl)triphenylamine (TCTA), N,N'-di(1-naphthyl)-N,N'-diphenylbenzidine (NPB), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 1,3-bis(N-carbazolyl)benzene (mCP), etc.

The thickness of the hole transport region HTR may be from about 100 Å to about 10,000 Å, e.g., from about 100 Å to about 1,000 Å. In the case where the hole transport region HTR includes both the hole injection layer HIL and the hole transport layer HTL, the thickness of the hole injection layer HIL may be from about 100 Å to about 10,000 Å, e.g., from about 100 Å to about 1,000 Å, and the thickness of the hole transport layer HTL may be from about 30 Å to about 1,000 Å. In the case where the thicknesses of the hole transport region HTR, the hole injection layer HIL, and the hole transport layer HTL satisfy the above-described ranges, satisfactory hole transport properties may be obtained without the substantial increase of a driving voltage.

The hole transport region HTR may further include a charge generating material other than the above-described materials to improve conductivity. The charge generating material may be dispersed in the hole transport region HTR uniformly or non-uniformly. The charge generating material may be, for example, a p-dopant. The p-dopant may be one of quinone derivatives, metal oxides, or cyano group-containing compounds. Examples of the p-dopant may include quinone derivatives such as tetracyanoquinodimethane (TCNQ) and 2,3,5,6-tetrafluoro-tetracyanoquinodimethane (F4-TCNQ), and metal oxides such as tungsten oxide and molybdenum oxide.

As described above, the hole transport region HTR may further include one of a hole buffer layer or an electron blocking layer other than the hole injection layer HIL and the hole transport layer HTL. The hole buffer layer may compensate an optical resonance distance according to the wavelength of light emitted from the emission layer EML and increase light emission efficiency. Materials included in the hole transport region HTR may be used as materials included in the hole buffer layer. The electron blocking layer is a layer preventing electron injection from the electron transport region ETR to the hole transport region HTR.

The emission layer EML may be provided on the hole transport region HTR. The thickness of the emission layer EML may be, e.g., from about 100 Å to about 1,000 Å, or from about 100 Å to about 300 Å. The emission layer EML may have a single layer formed using a single material, a single layer formed using a plurality of different materials, or a multilayer structure having a plurality of layers formed using a plurality of different materials.

The emission layer EML may include the heterocyclic compound according to an embodiment of the present disclosure. For example, the emission layer EML may include a heterocyclic compound represented by Formula 1 below.

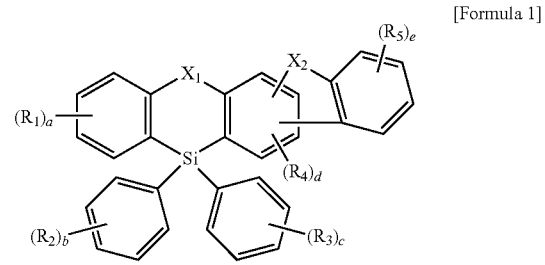

[Formula 1]

In Formula 1, particular explanation on $X_1$, $X_2$, $R_1$ to $R_5$, and "a" to "e" may be the same as described above, and will be omitted.

The emission layer EML may include one or two or more kinds of the heterocyclic compounds represented by Formula 1. The emission layer may further include another material in addition to the heterocyclic compound represented by Formula 1. For example, a fluorescent material including spiro-DPVBi, 2,2',7,7'-tetrakis(biphenyl-4-yl)-9, 9'-spirobifluorene (spiro-6P, spiro-sexiphenyl), distyryl-benzene (DSB), distyryl-arylene (DSA), a polyfluorene (PFO)-based polymer, and a poly(p-phenylene vinylene) (PPV)-based polymer may be further included. For example, an anthracene-based compound, an arylamine-based compound, or a styryl-based compound may be included. In addition, the emission layer EML may include a suitable phosphorescent material.

The emission layer EML may include a host and a dopant. In an implementation, the host may include the heterocyclic compound according to an embodiment of the present disclosure. In an implementation, the dopant may include the heterocyclic compound according to an embodiment of the present disclosure.

In an implementation, the host may include a suitable material, e.g., tris(8-hydroxyquinolino)aluminum (Alq3), 4,4'-bis(N-carbazolyl)-1,1'-biphenyl (CBP), poly(n-vinylcarbazole) (PVK), 9,10-di(naphthalene-2-yl)anthracene (ADN), 4,4',4''-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethylbiphenyl (CDBP), 2-methyl-9,10-bis(naphthalen-2-yl)anthracene (MADN), bis[2-(diphenylphosphino)phenyl] ether oxide (DPEPO), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), 2,8-bis(diphenylphosphoryl)dibenzofuran (PPF), etc.

In an implementation, the dopant may include, e.g., styryl derivatives (such as 1,4-bis[2-(3-N-ethylcarbazolyl)vinyl] benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalene-2-yl)vinyl)phenyl-N-phenylbenzeneamine (N-BDAVBi)), perylene and the derivatives thereof (such as 2,5,8,11-tetra-t-butylperylene (TBP)), pyrene and the derivatives thereof (such as 1,1-dipyrene, 1,4-dipyrenylbenzene, and 1,4-bis(N,N-diphenylamino)pyrene), [bis-(1-phenylisoquinolyl)iridium(III) acetylacetonate ($Ir(ppy)_3$), etc.

The emission layer EML may emit phosphorescence or fluorescence. In an implementation, the emission layer EML may emit thermally activated delayed fluorescence, and the heterocyclic compound according to an embodiment of the present disclosure may function as a material for emitting thermally activated delayed fluorescence.

The emission layer EML may emit one of red light, green light, blue light, white light, yellow light, or cyan light. In an implementation, the emission layer EML including the heterocyclic compound according to an embodiment of the present disclosure may be, e.g., a blue emission layer emitting blue light.

The electron transport region ETR may be provided on the emission layer EML. In an implementation, the electron transport region ETR may include at least one of an electron blocking layer, an electron transport layer ETL, or an electron injection layer EIL.

The electron transport region ETR may have a single layer formed using a single material, a single layer formed using a plurality of different materials, or a multilayer structure including a plurality of layers formed using a plurality of different materials.

For example, the electron transport region ETR may have the structure of a single layer such as an electron injection layer EIL and an electron transport layer ETL, or a single layer structure formed using an electron injection material and an electron transport material. In an implementation, the electron transport region ETR may have a single layer structure formed using a plurality of different materials, or a structure laminated one by one from the first electrode EL1 of electron transport layer ETL/electron injection layer EIL, or hole blocking layer/electron transport layer ETL/electron injection layer EIL. The thickness of the electron transport region ETR may be, e.g., from about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

In the case where the electron transport region ETR includes the electron transport layer ETL, the electron transport region ETR may include an anthracene-based compound. In an implementation, the electron transport region may include, e.g., tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate (Bebq2), 9,10-di(naphthalene-2-yl)anthracene (ADN), or a mixture thereof. The thickness of the electron transport layer ETL may be from about 100 Å to about 1,000 Å, e.g., from about 150 Å to about 500 Å. If the thickness of the electron transport layer ETL satisfies the above-described range, satisfactory electron transport properties may be obtained without the substantial increase of a driving voltage.

In the case where the electron transport region ETR includes the electron injection layer EIL, the electron transport region ETR may include LiF, lithium quinolate (LiQ), $Li_2O$, BaO, NaCl, CsF, a metal in lanthanoides such as Yb, or a metal halide such as RbCl and RbI. The electron injection layer EIL also may be formed using a mixture material of an electron transport material and an insulating organo metal salt. The organo metal salt may be a material having an energy band gap of about 4 eV or more. Particularly, the organo metal salt may include, for example, a metal acetate, a metal benzoate, a metal acetoacetate, a metal acetylacetonate, or a metal stearate. The thickness of the electron injection layer EIL may be from about 1 Å to about 100 Å, and from about 3 Å to about 90 Å. In the case where the thickness of the electron injection layer EIL satisfies the above described range, satisfactory electron injection properties may be obtained without inducing the substantial increase of a driving voltage.

The electron transport region ETR may include a hole blocking layer, as described above. In an implementation, the hole blocking layer may include, e.g., at least one of 2,9-dimethyl-4,7-diphenyl-1,10-phenanthroline (BCP), or 4,7-diphenyl-1,10-phenanthroline (Bphen).

The second electrode EL2 may be provided on the electron transport region ETR. The second electrode EL2 may be a common electrode or a cathode. The second electrode EL2 may be a transmissive electrode, a transflective electrode or a reflective electrode. In the case where the second electrode EL2 is the transmissive electrode, the second electrode EL2 may include a transparent metal oxide, e.g., ITO, IZO, ZnO, ITZO, etc.

In the case where the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound including thereof, or a mixture thereof (for example, a mixture of Ag and Mg). The second electrode EL2 may have a multilayered structure including a reflective layer or a transflective layer formed using the above-described materials or a transparent conductive layer formed using ITO, IZO, ZnO, ITZO, etc.

In an implementation, the second electrode EL2 may be connected with an auxiliary electrode. If the second electrode EL2 is connected with the auxiliary electrode, the resistance of the second electrode EL2 may be decreased.

In the organic electroluminescence device 10, voltages may be applied to each of the first electrode EL1 and the second electrode EL2, and holes injected from the first electrode EL1 move via the hole transport region HTR to the emission layer EML, and electrons injected from the second electrode EL2 move via the electron transport region ETR to the emission layer EML. The electrons and holes are recombined in the emission layer EML to generate excitons, and the excitons may emit light via transition from an excited state to a ground state.

In the case where the organic electroluminescence device 10 is a top emission type, the first electrode EL1 may be a reflective electrode, and the second electrode EL2 may be a transmissive electrode or a transflective electrode. In the case where the organic electroluminescence device 10 is a bottom emission type, the first electrode EL1 may be the transmissive electrode or the transflective electrode, and the second electrode EL2 may be the reflective electrode.

The organic electroluminescence device according to an embodiment of the present disclosure is characterized in including the heterocyclic compound represented by Formula 1 and may accomplish long life, high efficiency and a low driving voltage.

Hereinafter, the present disclosure will be explained more particularly referring to preferred embodiments and comparative embodiments. The following embodiments are only for illustration to assist the understanding of the present disclosure, but the scope of the present disclosure is not limited thereto.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

SYNTHETIC EXAMPLES

The heterocyclic compound according to an embodiment of the present disclosure may be synthesized, e.g., as follows.

Synthetic Example 1: Synthesis of Compound 1

Compound 1 was synthesized by the following reaction.

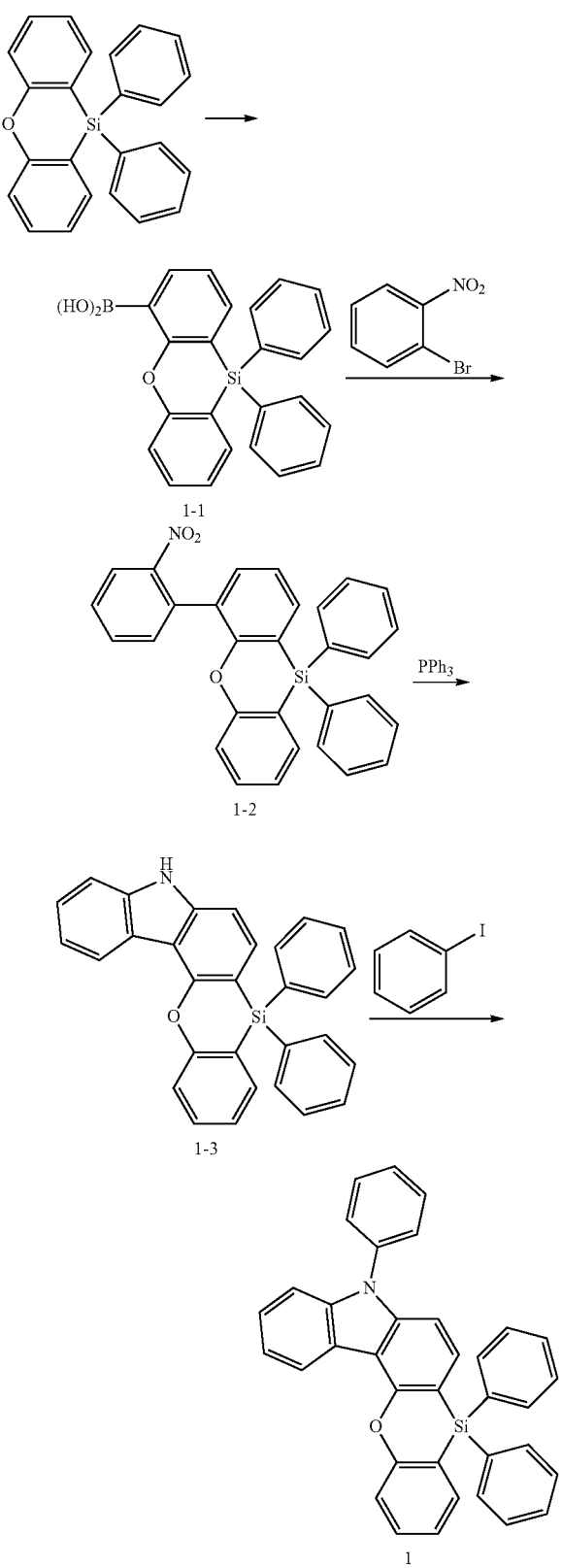

Synthesis of Intermediate 1-1

10,10-diphenyl-10H-dibenzo[b,e][1,4]oxacilline (CAS #=18733-65-8) was reacted with nBuLi, and then, reacted with trimethylborate to obtain Intermediate 1-1. Intermediate 1-1 was identified by LC-MS.

$C_{24}H_{19}BO_3Si$: M+1 395.22

Synthesis of Intermediate 1-2

Intermediate 1-1 and 2-bromonitrobenzene were reacted in the presence of a Pd catalyst to obtain Intermediate 1-2. Intermediate 1-2 was identified by LC-MS.

$C_{30}H_{21}NO_3Si$: M+1 472.15

Synthesis of Intermediate 1-3

Intermediate 1-2 and triphenylphosphine were reacted to obtain Intermediate 1-3. Intermediate 1-3 was identified by LC-MS.

$C_{30}H_{21}NOSi$: M+1 440.33

Synthesis of Compound 1

2.9 g of Intermediate 1-3, 1.3 g of iodobenzene, 0.5 g of copper iodide, 0.5 g of 1,10-phenanthroline, and 1.8 g of potassium carbonate were dissolved in 40 ml of DMF, followed by refluxing for about 24 hours. After finishing the reaction, the reaction solution was extracted with ethyl acetate, a collected organic layer was dried with magnesium sulfate, and solvents were evaporated. The residue thus obtained was separated by silica gel column chromatography to obtain 2.7 g (yield: 81%) of Compound 1. Compound 1 was identified with LC-MS and $^1$H-NMR.

Synthetic Example 2: Synthesis of Compound 2

Synthesis of Compound 2

The same synthetic method was conducted as described in the synthetic process of Compound 1 except for using 10,10-diphenyl-10H-dibenzo[b,e][1,4]thiasiline (CAS #=18737-37-6) instead of 10,10-diphenyl-10H-dibenzo[b,e][1,4]oxacilline (CAS #=18733-65-8. 2.7 g (yield 77%) to obtain Compound 2. Compound 2 was identified using LC-MS and $^1$H-NMR.

Synthetic Example 3: Synthesis of Compound 5

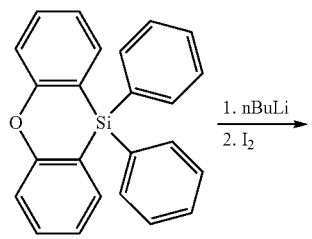

Synthesis of Intermediate 5-1

10,10-diphenyl-10H-dibenzo[b,e][1,4]oxacilline (CAS #=18733-65-8) was reacted with nBuLi, and then, reacted with iodine to obtain Intermediate 5-1. Intermediate 5-1 was identified by LC-MS.

$C_{24}H_{17}IOSi$: M+1 477.11

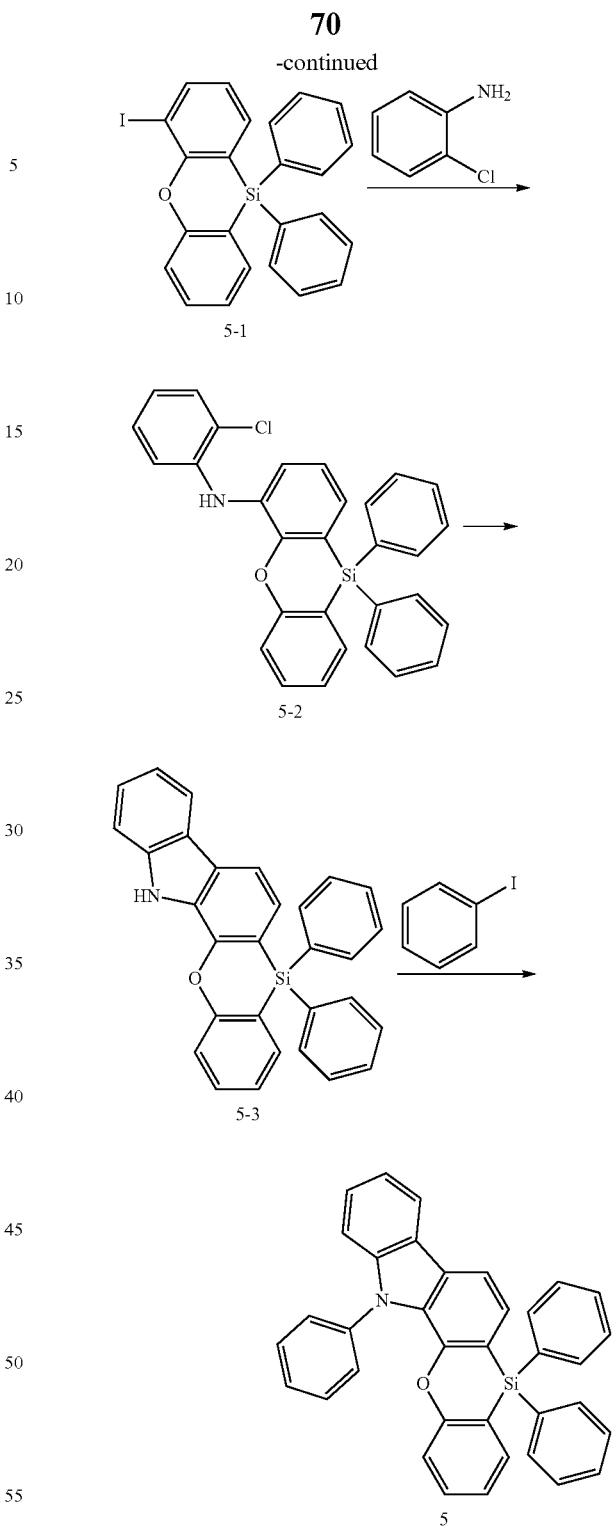

Synthesis of Intermediate 5-2

Intermediate 5-1 and 2-chloroaniline were reacted in the presence of a Pd catalyst to obtain Intermediate 5-2. Intermediate 5-2 was identified using LC-MS.
$C_{30}H_{22}ClNOSi$: M+1 476.33

Synthesis of Intermediate 5-3

Intermediate 5-2 was reacted in the presence of a Pd catalyst to obtain Intermediate 5-3. Intermediate 5-3 was identified using LC-MS.
$C_{30}H_{21}NOSi$: M+1 440.11

Synthesis of Compound 5

3.1 g of Intermediate 5-3, 1.4 g of iodobenzene, 0.5 g of copper iodide, 0.5 g of 1,10-phenanthroline, and 2.0 g of potassium carbonate were dissolved in 40 ml of DMF, followed by refluxing for about 24 hours. After finishing the reaction, the reaction solution was extracted with ethyl acetate, a collected organic layer was dried with magnesium sulfate, and solvents were evaporated. The residue thus obtained was separated by silica gel column chromatography to obtain 2.7 g (yield: 75%) of Compound 5. Compound 5 was identified with LC-MS and $^1$H-NMR.

Synthetic Example 4: Synthesis of Compound 17

Synthesis of Compound 17

2.4 g of Intermediate 1-3, 2.9 g of (3-bromophenyl)triphenylsilane, 0.5 g of copper iodide, 0.5 g of 1,10-phenanthroline, and 2 g of potassium carbonate were dissolved in 30 ml of DMF, followed by refluxing for about 24 hours. After finishing the reaction, the reaction solution was extracted with ethyl acetate, a collected organic layer was dried with magnesium sulfate, and solvents were evaporated. The residue thus obtained was separated by silica gel column chromatography to obtain 1.7 g (yield: 62%) of Compound 17. Compound 17 was identified with LC-MS and $^1$H-NMR.

Synthetic Example 5: Synthesis of Compound 29

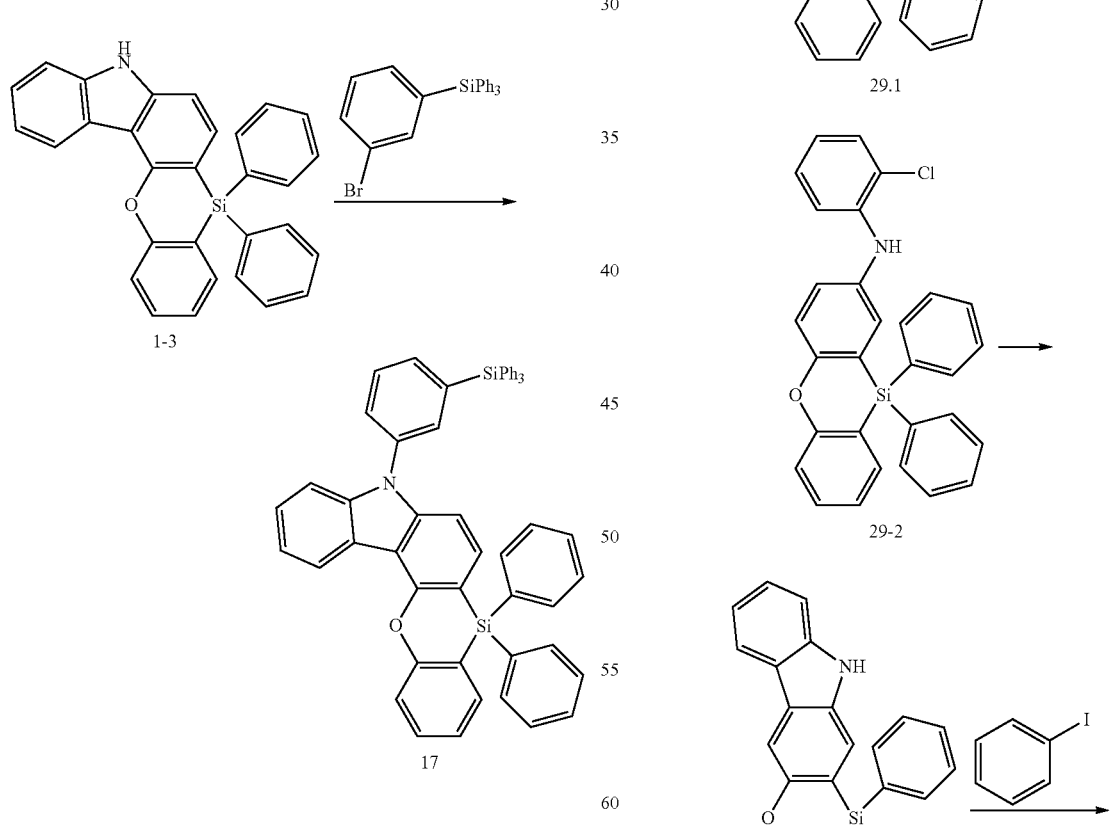

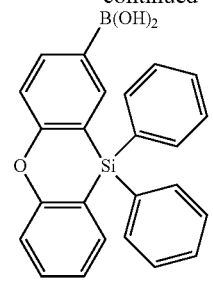

29

Synthesis of Intermediate 29-1

10,10-diphenyl-10H-dibenzo[b,e][1,4]oxacilline (CAS #=18733-65-8) was reacted with NBS to obtain Intermediate 29-1. Intermediate 29-1 was identified using LC-MS.
$C_{24}H_{17}BrOSi$: M+1 429.09

Synthesis of Intermediate 29-2

Intermediate 29-1 and 2-chloroaniline were reacted in the presence of a Pd catalyst to obtain Intermediate 29-2. Intermediate 29-2 was identified using LC-MS.
$C_{30}H_{22}ClNOSi$: M+1 476.29

Synthesis of Intermediate 29-3

Intermediate 29-2 was reacted in the presence of a Pd catalyst to obtain Intermediate 29-3. Intermediate 29-3 was identified using LC-MS.
$C_{30}H_{21}NOSi$: M+1 440.21

Synthesis of Compound 29

4.5 g of Intermediate 29-3, 2.1 g of iodobenzene, 1.0 g of copper iodide, 1.0 g of 1,10-phenanthroline, and 2.8 g of potassium carbonate were dissolved in 50 ml of DMF, followed by refluxing for about 24 hours. After finishing the reaction, the reaction solution was extracted with ethyl acetate, a collected organic layer was dried with magnesium sulfate, and solvents were evaporated. The residue thus obtained was separated by silica gel column chromatography to obtain 3.1 g (yield: 59%) of Compound 29. Compound 29 was identified with LC-MS and $^1$H-NMR.

Synthetic Example 6: Synthesis of Compound 30

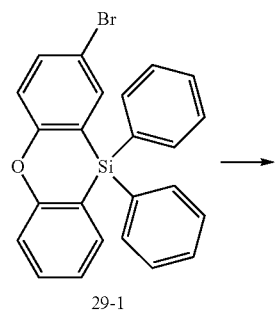

29-1

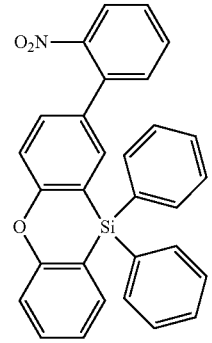

30-1

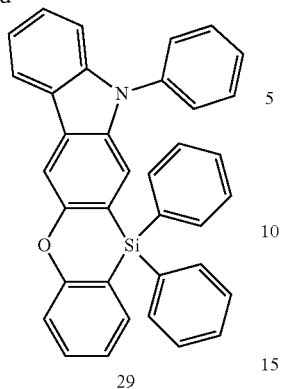

30-2

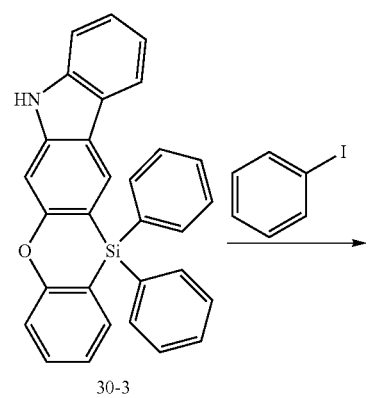

30-3

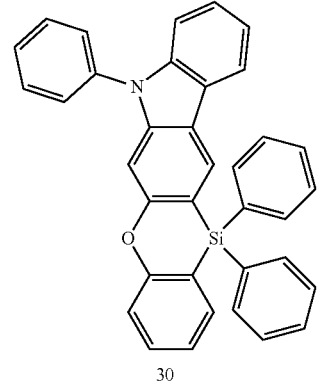 [SMILES: c1ccc(-n2c3ccccc3c3cc4c(cc32)Oc2ccccc2[Si]4(c2ccccc2)c2ccccc2)cc1]

30

Synthesis of Intermediate 30-1

Intermediate 29-1 was reacted with n-BuLi and then was reacted with trimethylborate to obtain Intermediate 30-1. Intermediate 30-1 was identified using LC-MS.
$C_{24}H_{19}BO_3Si$: M+1 395.33

Synthesis of Intermediate 30-2

Intermediate 30-1 and 2-bromonitrobenzene were reacted in the presence of a Pd catalyst to obtain Intermediate 30-2. Intermediate 30-2 was identified using LC-MS.
$C_{30}H_{21}NO_3Si$: M+1 472.17

Synthesis of Intermediate 30-3

Intermediate 30-2 and triphenylphosphine were reacted to obtain Intermediate 30-3. Intermediate 30-3 was identified using LC-MS.
$C_{30}H_{21}NOSi$: M+1 440.22

Synthesis of Compound 30

2.2 g of Intermediate 30-3, 1.0 g of iodobenzene, 0.5 g of copper iodide, 0.5 g of 1,10-phenanthroline, and 1.4 g of potassium carbonate were dissolved in 30 ml of DMF, followed by refluxing for about 24 hours. After finishing the reaction, the reaction solution was extracted with ethyl acetate, a collected organic layer was dried with magnesium sulfate, and solvents were evaporated. The residue thus obtained was separated by silica gel column chromatography to obtain 1.6 g (yield: 64%) of Compound 30. Compound 30 was identified with LC-MS and $^1$H-NMR.

Synthetic Example 7: Synthesis of Compound 32

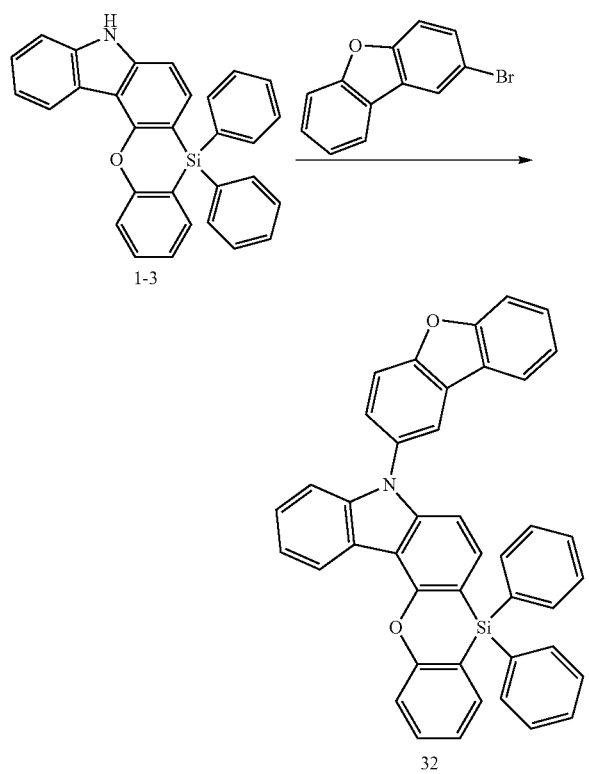

Synthesis of Compound 32

3.7 g of Intermediate 1-3, 2.0 g of 2-bromodibenzo[b,d]furan, 0.8 g of copper iodide, 0.8 g of 1,10-phenanthroline, and 2.3 g of potassium carbonate were dissolved in 50 ml of DMF, followed by refluxing for about 24 hours. After finishing the reaction, the reaction solution was extracted with ethyl acetate, a collected organic layer was dried with magnesium sulfate, and solvents were evaporated. The residue thus obtained was separated by silica gel column chromatography to obtain 3.6 g (yield: 71%) of Compound 32. Compound 32 was identified with LC-MS and $^1$H-NMR.

Synthetic Example 8: Synthesis of Compound 35

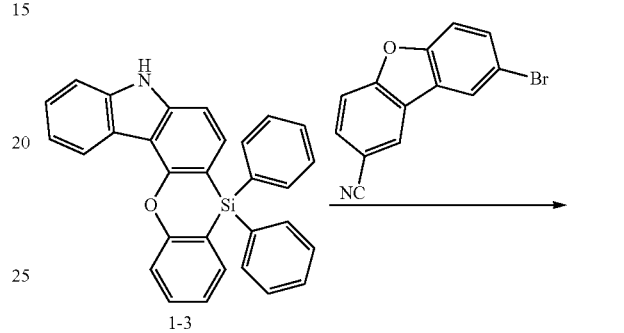

Synthesis of Compound 35

4.6 g of Intermediate 1-3, 2.8 g of 8-bromodibenzo[b,d]furan-2-carbonitrile, 1.0 g of copper iodide, 1.0 g of 1,10-phenanthroline, and 2.8 g of potassium carbonate were dissolved in 50 ml of DMF, followed by refluxing for about 24 hours. After finishing the reaction, the reaction solution was extracted with ethyl acetate, a collected organic layer was dried with magnesium sulfate, and solvents were evaporated. The residue thus obtained was separated by silica gel column chromatography to obtain 4.7 g (yield: 76%) of Compound 35. Compound 35 was identified with LC-MS and $^1$H-NMR.

$^1$H-NMR analysis results of the compounds synthesized by Synthetic Examples 1 to 8 are shown in Table 1 below.

TABLE 1

| Compound | $^1$H NMR (CDCl$_3$, 400 MHz) | MS/FAB Found [M + 1] | calc. |
|---|---|---|---|
| 1 | 8.53 (d, 1H), 7.92 (d, 1H), 7.62-7.31 (m, 20H), 7.15 (t, 1H), 7.11-7.08 (m, 2H) | 516.22 | 515.17 |
| 2 | 8.55 (d, 1H), 7.91 (d, 1H), 7.64-7.29 (m, 20H), 7.14 (t, 1H), 7.11-7.07 (m, 2H) | 532.14 | 531.15 |
| 5 | 8.55 (d, 1H), 7.96-7.92 (m, 2H), 7.62 (d, 2H), 7.57 (t, 1H), 7.51-7.42 (m, 5H), 7.39-7.34 (m, 7H), 7.25 (m, 4H), 7.16 (t, 1H), 7.12-7.08 (m, 2H) | 516.25 | 515.17 |
| 17 | 8.55 (d, 1H), 7.93 (d, 1H), 7.64 (s, 1H), 7.61-5.58 (m, 2H), 7.48-7.31 (m, 31H), 7.15 (t, 1H), 7.16 (t, 1H), 7.12-7.08 (m, 2H) | 774.29 | 773.26 |
| 29 | 8.18 (d, 1H), 8.11 (s, 1H), 7.63 (s, 1H), 7.62-7.59 (m, 4H), 7.51-7.49 (m, 3H), 7.48-7.38 (m, 12H), 7.21 (t, 1H), 7.13-7.07 (m, 2H) | 516.11 | 515.17 |
| 30 | 8.18 (d, 1H), 7.78 (s, 1H), 7.64 (t, 2H), 7.59-7.37 (m, 17H), 7.21 (t, 1H), 7.13 (s, 1H), 7.11-7.05 (m, 2H) | 516.32 | 515.17 |
| 32 | 8.55 (d, 1H), 7.99-7.92 (m, 2H), 7.72 (d, 1H), 7.61 (s, 1H), 7.53 (s, 1H), 7.42-7.29 (m, 18H), 7.17 (t, 1H), 7.12-7.08 (m, 2H) | 606.22 | 605.18 |
| 35 | 8.53 (d, 1H), 7.93 (d, 1H), 7.78-7.64 (m, 4H), 7.47-7.29 (m, 17H), 7.14 (t, 1H), 7.12-7.08 (m, 2H) | 631.65 | 630.18 |

Device Manufacturing Examples

Organic electroluminescence devices of Examples 1 to 8 were manufactured using Compounds 1, 2, 5, 17, 29, 30, 32, and 35 as emission layer materials.

Example Compounds

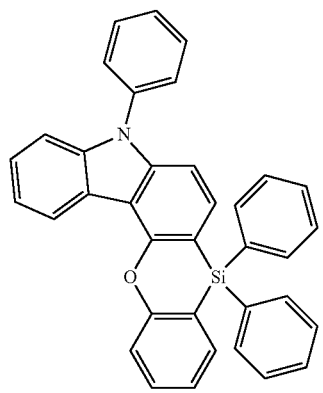

1

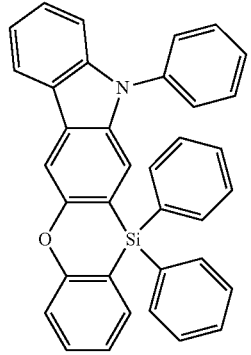

2

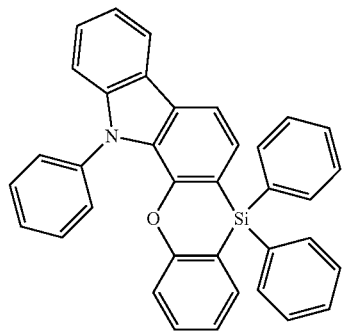

5

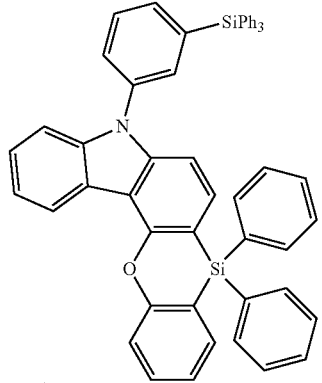

17

29

-continued

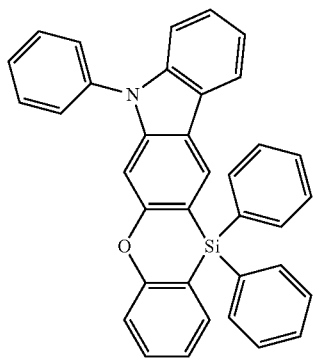

30

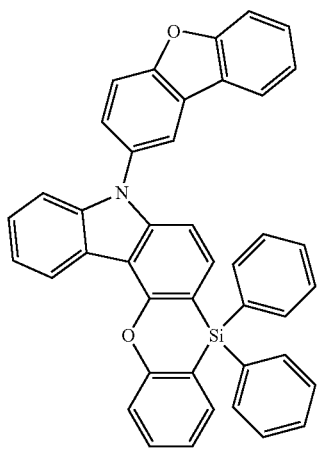

32

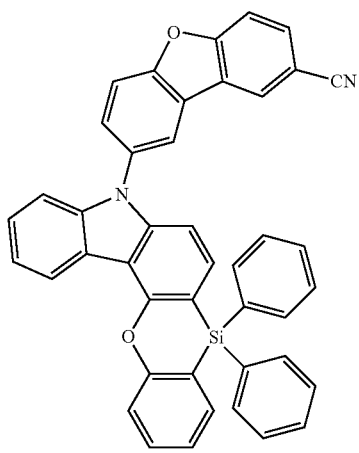

Organic electroluminescence devices of Comparative Examples 1 and 2 were manufactured using Comparative Compounds X-1 and X-2 as emission layer materials.

[Comparative Compounds]

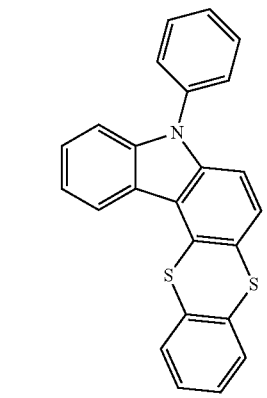
X-1

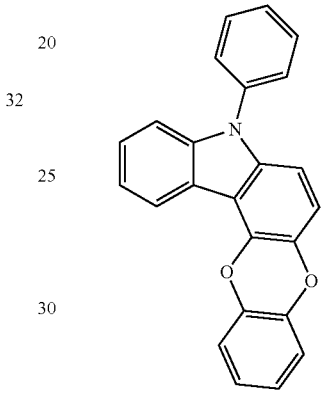
X-2

The organic electroluminescence devices of Examples 1 to 8 and Comparative Examples 1 and 2 were manufactured as follows.

A 15 Ω/cm² ITO glass substrate (manufactured by Corning Co., Ltd.) with a thickness of about 1,200 Å was cut into a size of 50 mm×50 mm×0.7 mm, and then, was ultrasonically washed using isopropyl alcohol and pure water for about 5 minutes, respectively, and washed by irradiating ultraviolet rays for about 30 minutes and ozone. Then, the ITO glass substrate (anode) was installed in a vacuum deposition apparatus.

NPB was vacuum deposited on the ITO glass substrate to form a hole injection layer with a thickness of about 300 Å, and on the hole injection layer, mCP was vacuum deposited to form a hole transport layer with a thickness of about 200 Å.

On the hole transport layer, the Example Compound or the Comparative Compound were co-deposited with Ir(dpbic)₃ in a weight ratio of about 92:8 to form an emission layer with a thickness of about 250 Å.

On the emission layer, TAZ was deposited to form an electron transport layer with a thickness of about 200 Å, and on the electron transport layer, LiF was deposited to form an electron injection layer with a thickness of about 10 Å.

On the electron injection layer, Al was deposited to form a second electrode having a LiF/Al structure with a thickness of about 100 Å.

Then, the driving voltage, current density, maximum quantum efficiency, and emission color of the organic electroluminescence devices thus manufactured were measured. The evaluation results are shown in Table 2 below. The properties of the organic electroluminescence devices were measured using Kethley SMU 236 and a brightness photometer PR650.

TABLE 2

| | Host of emission layer | Driving voltage (V) | Current density (mA/cm²) | Maximum quantum efficiency (%) | Emission color |
|---|---|---|---|---|---|
| Example 1 | Example Compound 1 | 4.2 | 2.7 | 17.2 | Blue |
| Example 2 | Example Compound 2 | 4.1 | 2.7 | 16.3 | Blue |
| Example 3 | Example Compound 5 | 4.3 | 2.7 | 18.2 | Blue |
| Example 4 | Example Compound 17 | 3.9 | 2.7 | 17.9 | Blue |
| Example 5 | Example Compound 29 | 4.1 | 2.7 | 18.3 | Blue |
| Example 6 | Example Compound 30 | 4.3 | 2.7 | 19.4 | Blue |
| Example 7 | Example Compound 32 | 3.9 | 2.7 | 21.4 | Blue |
| Example 8 | Example Compound 35 | 3.8 | 2.7 | 20.5 | Blue |
| Comparative Example 1 | Comparative Compound X-1 | 4.8 | 1 | 3.5 | Blue |
| Comparative Example 2 | Comparative Compound X-2 | 4.4 | 1 | 3.4 | Blue |

Referring to Table 2, it may be seen that the organic electroluminescence device including the heterocyclic compound of the Examples exhibited excellent maximum quantum efficiency and was favorable for decreasing a driving voltage. For example, the heterocyclic compound of the Examples had excellent efficiency in blue emission of which high efficiency is normally difficult to attain.

The organic electroluminescence device including the compound according to an embodiment of the present disclosure may have excellent efficiency.

The organic electroluminescence device including the compound according to an embodiment of the present disclosure may have improved life properties.

The organic electroluminescence device including the compound according to an embodiment of the present disclosure may be favorable in decreasing a driving voltage.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A heterocyclic compound represented by the following Formula 1:

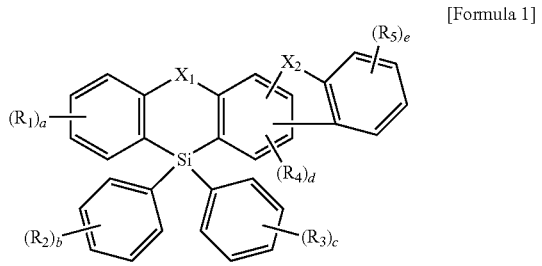

[Formula 1]

wherein, in Formula 1, $X_1$ is O, S, SO, or $SO_2$, $X_2$ is $NR_6$, $SiR_9R_{10}$, O, or S, $R_1$ to $R_6$, $R_9$, and $R_{10}$ are each independently a hydrogen atom, a deuterium atom, a cyano group, a substituted or unsubstituted silyl group, a substituted or unsubstituted phosphine oxide group, a substituted or unsubstituted alkyl group having 1 to 10 carbon atoms, a substituted or unsubstituted alkenyl group having 2 to 10 carbon atoms, a substituted or unsubstituted aryl group having 6 to 60 ring carbon atoms, or a substituted or unsubstituted heteroaryl group having 2 to 60 ring carbon atoms, "a" and "e" are each independently an integer of 0 to 4, "b" and "c" are each independently an integer of 0 to 5, and "d" is an integer of 0 to 2.

2. The heterocyclic compound as claimed in claim 1, wherein the compound represented by Formula 1 is represented by the following Formula 2:

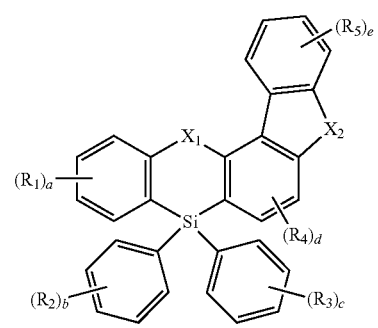

[Formula 2]

wherein, in Formula 2, $X_1$, $X_2$, $R_1$ to $R_5$, and "a" to "e" are defined the same as those of Formula 1.

3. The heterocyclic compound as claimed in claim 2, wherein:

$X_2$ is $NR_6$, and $R_6$ is a substituted or unsubstituted phosphine oxide group, a substituted or unsubstituted aryl group having 6 to 30 ring carbon atoms, or a substituted or unsubstituted heteroaryl group having 2 to 30 ring carbon atoms.

4. The heterocyclic compound as claimed in claim 2, wherein:

$X_2$ is $NR_6$, and $R_6$ is a diphenylphosphine oxide group, a substituted or unsubstituted phenyl group, a substituted or unsubstituted fluorene group, a substituted or unsubstituted pyridine group, a substituted or unsubstituted pyrimidyl group, a substituted or unsubstituted triazine group, a substituted or unsubstituted carbazole group, a substituted or unsubstituted dibenzofuran group, or a substituted or unsubstituted dibenzothiophene group.

5. The heterocyclic compound as claimed in claim 1, wherein the compound represented by Formula 1 is represented by one of the following Formulae 2-1 to 2-3:

[Formula 2-1]

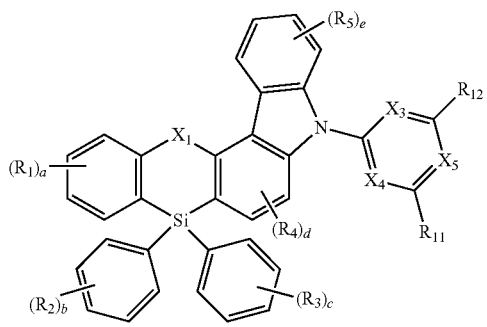

[Formula 2-2]

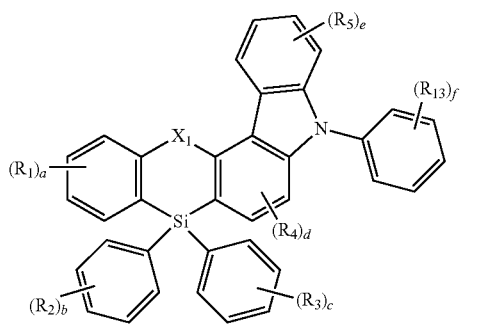

[Formula 2-3]

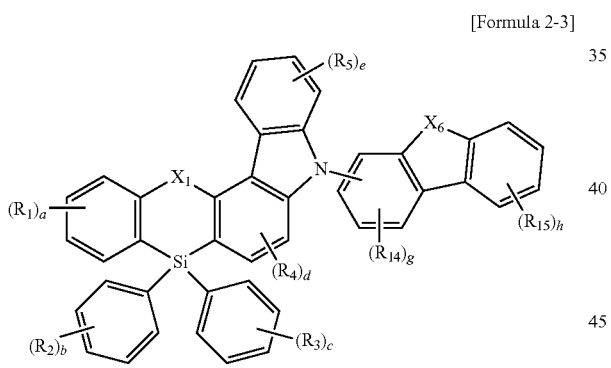

wherein, in Formula 2-1, $X_3$ to $X_5$ are each independently N or CH, at least one of $X_3$ to $X_5$ being N, $R_{11}$ and $R_{12}$ are defined the same as $R_1$ to $R_5$, wherein in Formula 2-2, $R_{13}$ is defined the same as $R_1$ to $R_5$, "f" is an integer of 0 to 5, wherein, in Formula 2-3, $X_6$ is O, S, $CR_{16}R_{17}$, or $NR_{18}$, $R_{14}$ to $R_{18}$ are defined the same as $R_1$ to $R_5$, "g" is an integer of 0 to 3, "h" is an integer of 0 to 4, and wherein, in Formulae 2-1 to 2-3, $X_1$, $R_1$ to $R_5$, and "a" to "e" are defined the same as those of Formula 1.

6. A heterocyclic compound represented by one selected from the following Formula 3, Formula 4, and Formula 5:

[Formula 3]

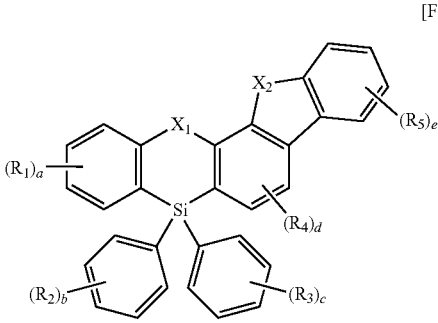

[Formula 4]

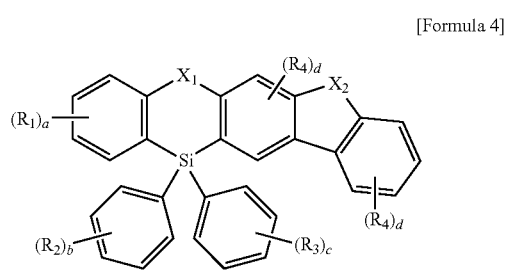

[Formula 5]

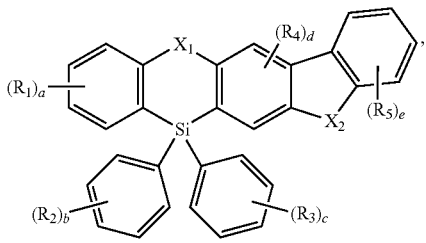

wherein, in Formulae 3, 4, and 5, $X_1$ is O, S, SO, or $SO_2$, $X_2$ is $NR_6$, $CR_7R_8$, $SiR_9R_{10}$, O, or S, $R_1$ to $R_{10}$ are each independently a hydrogen atom, a deuterium atom, a cyano group, a substituted or unsubstituted silyl group, a substituted or unsubstituted phosphine oxide group, a substituted or unsubstituted alkyl group having 1 to 10 carbon atoms, a substituted or unsubstituted alkenyl group having 2 to 10 carbon atoms, a substituted or unsubstituted aryl group having 6 to 60 ring carbon atoms, or a substituted or unsubstituted heteroaryl group having 2 to 60 ring carbon atoms, "a" and "e" are each independently an integer of 0 to 4, "b" and "c" are each independently an integer of 0 to 5, and "d" is an integer of 0 to 2.

7. The heterocyclic compound as claimed in claim 1, wherein the heterocyclic compound represented by Formula 1 is a compound of the following Compound Group 1:

[Compound Group 1]
1
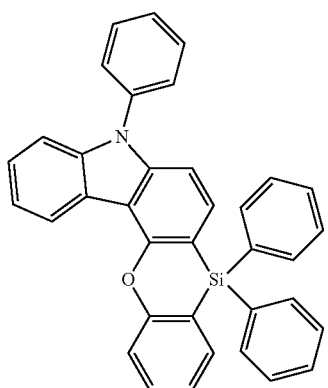
2
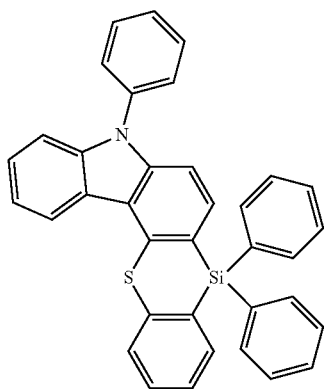
3
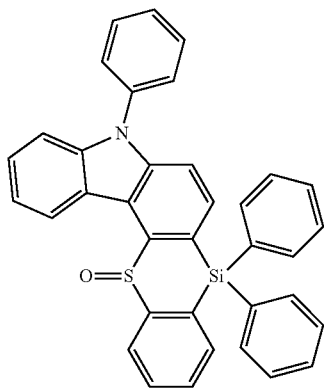
4
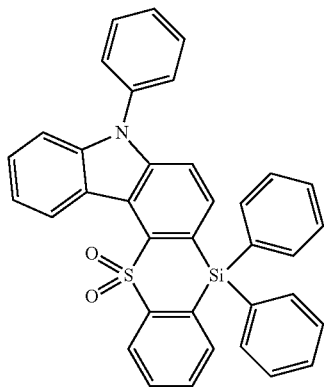
5
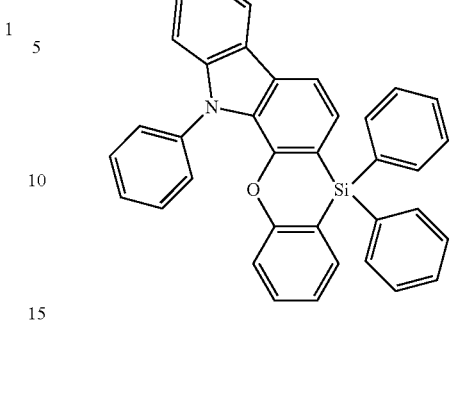
6
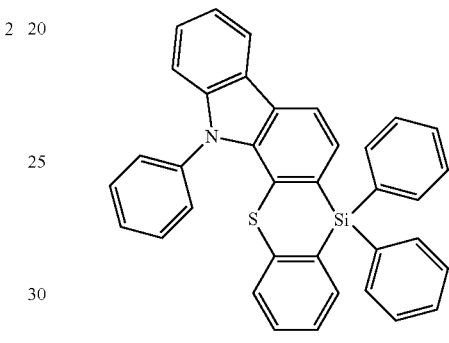
7
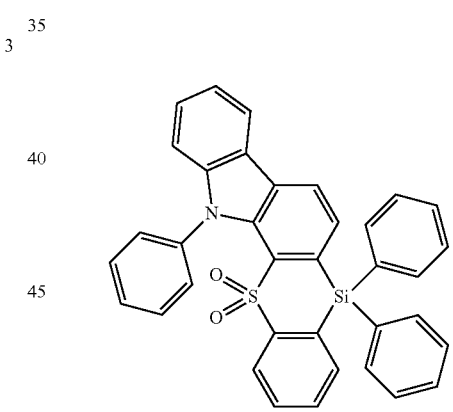
8
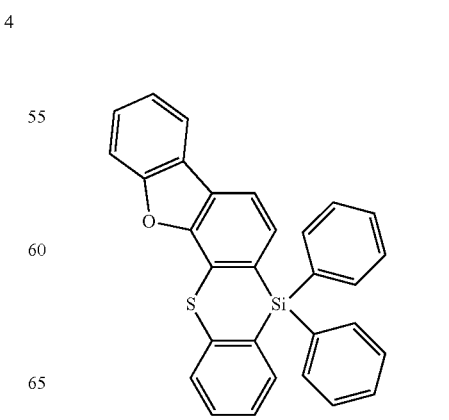

9
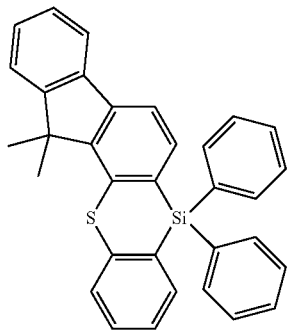
10
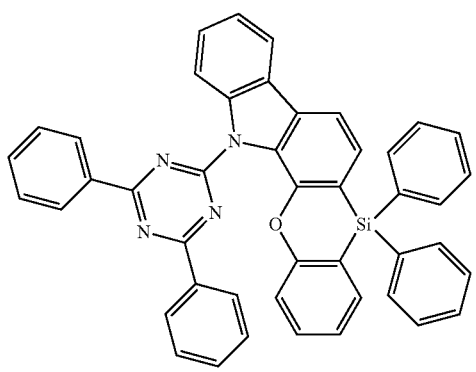
11
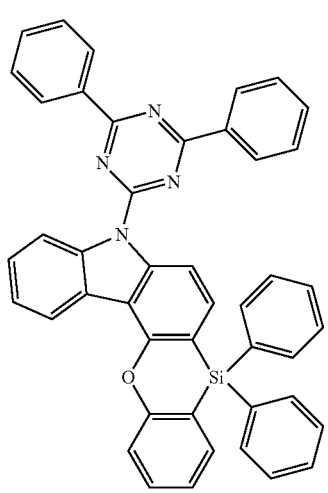
12
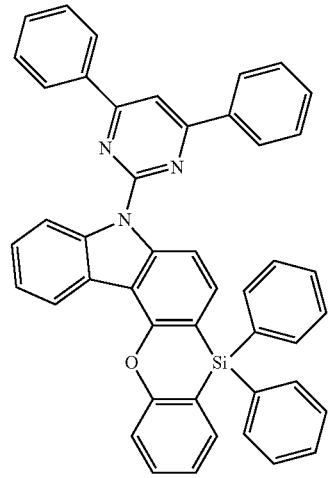
13
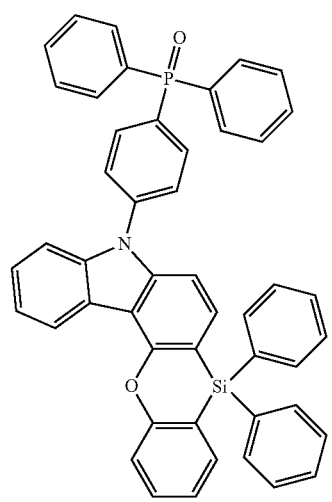
14
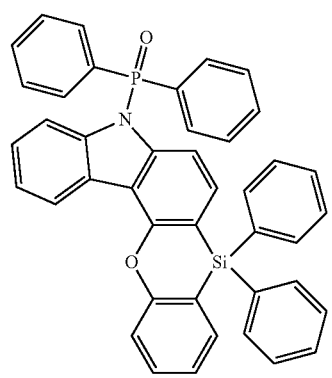

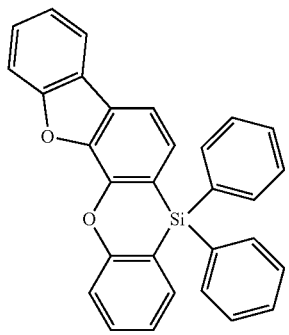
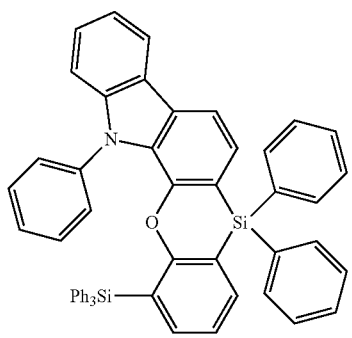
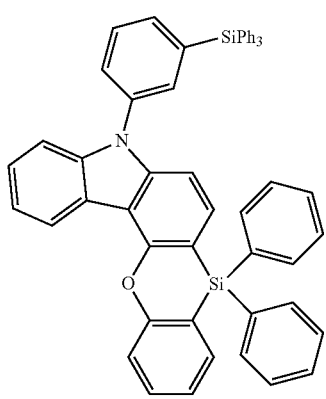
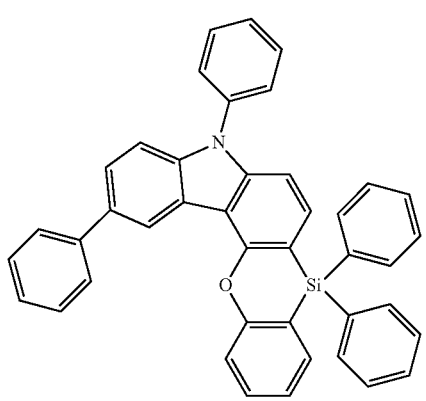
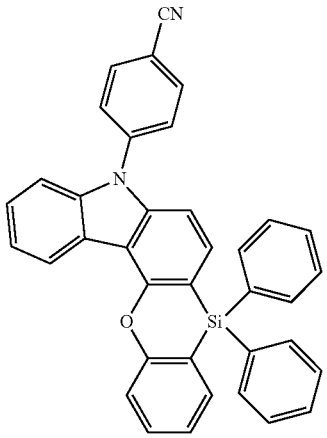
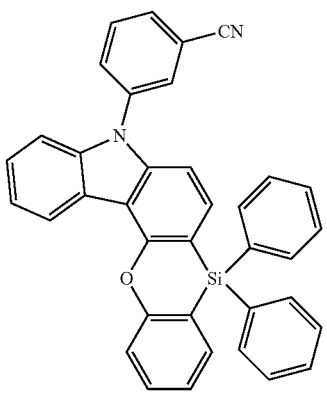
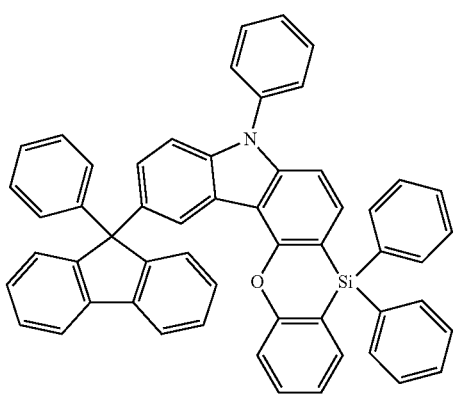

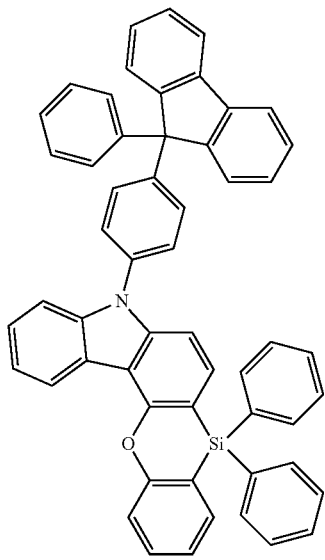
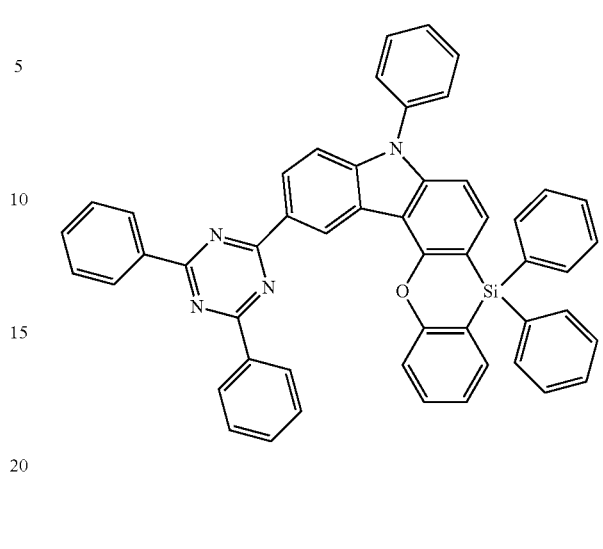
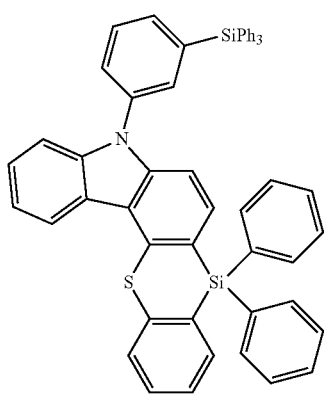
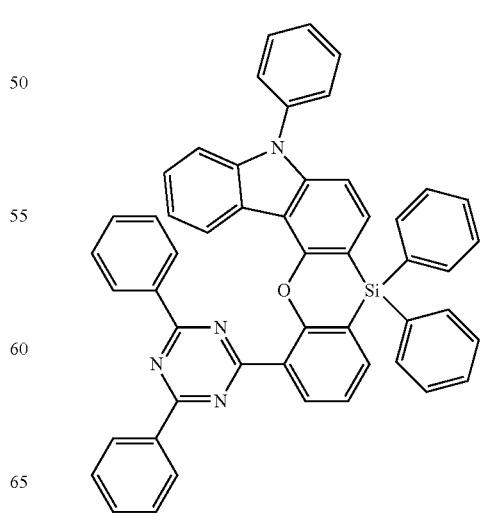
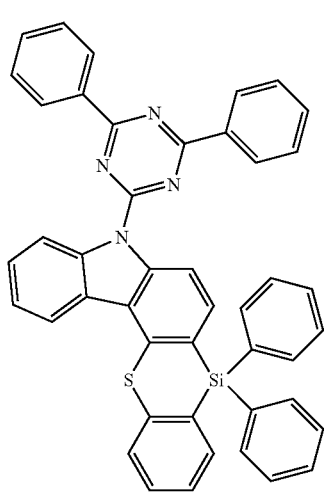

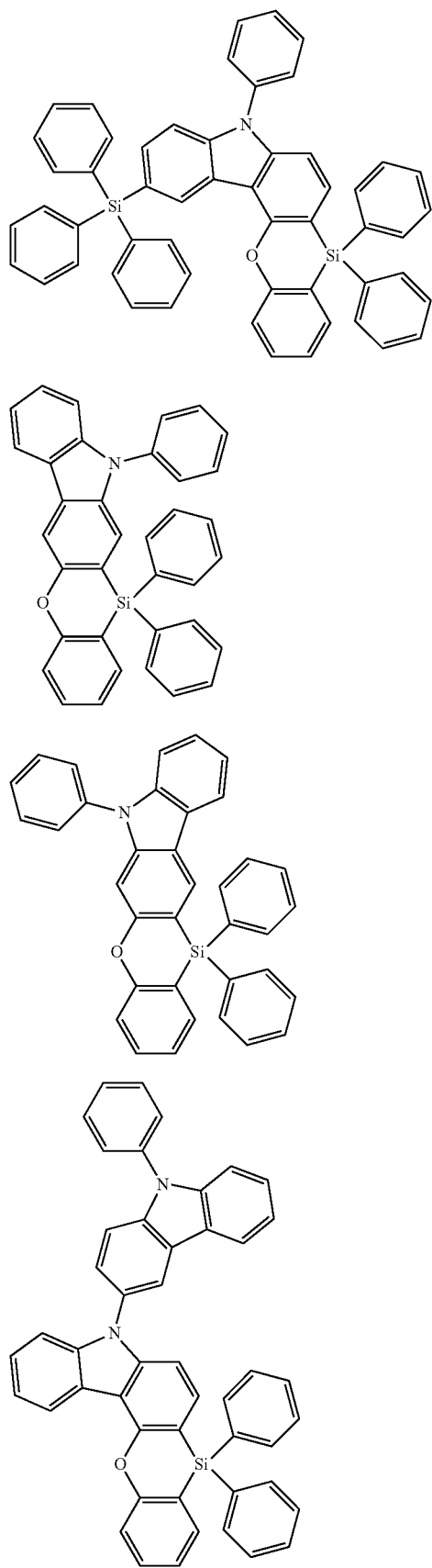
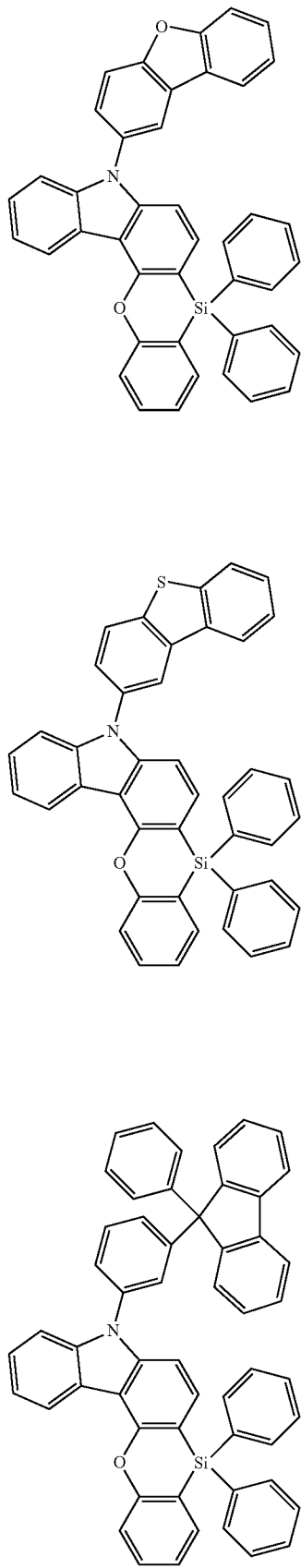

35
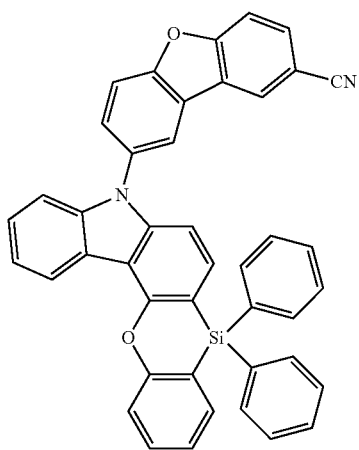
36
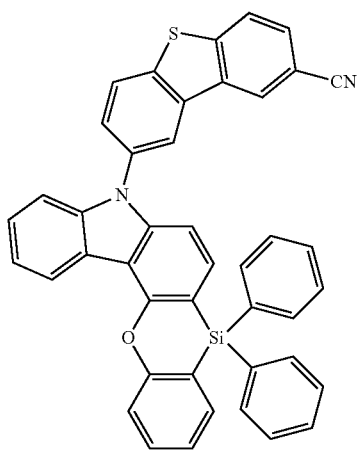
37
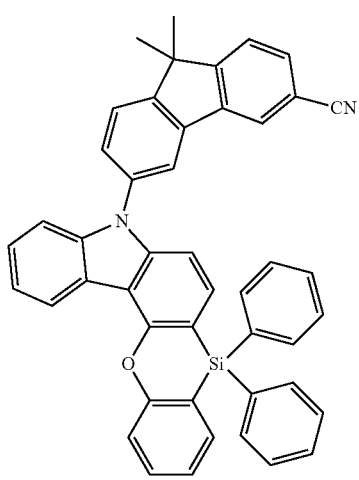
38
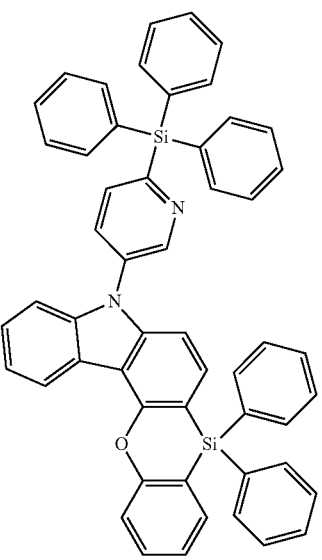
39
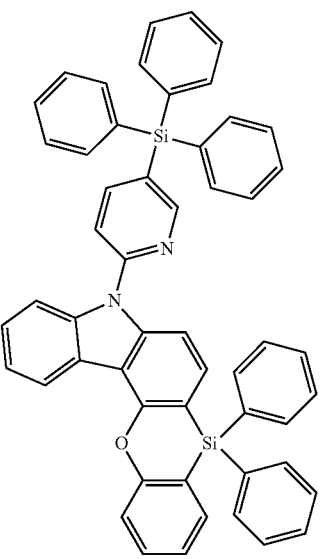
40
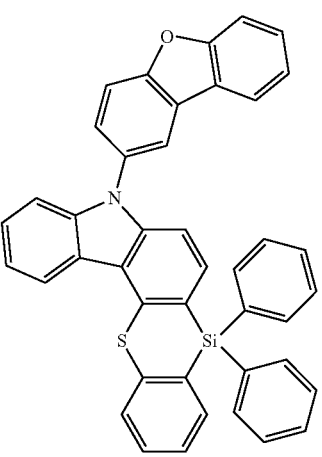

41
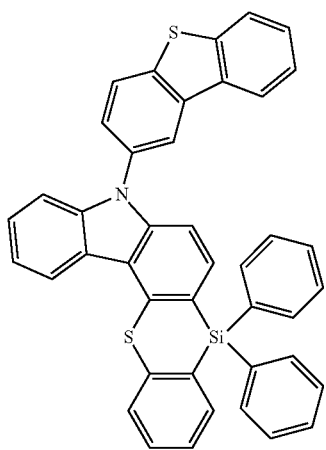
42
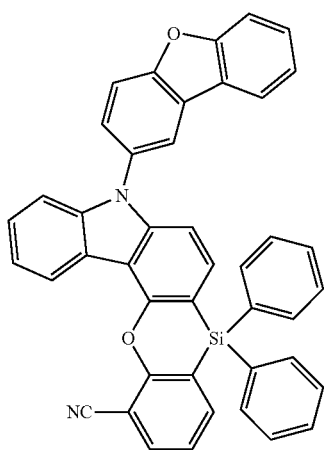
43
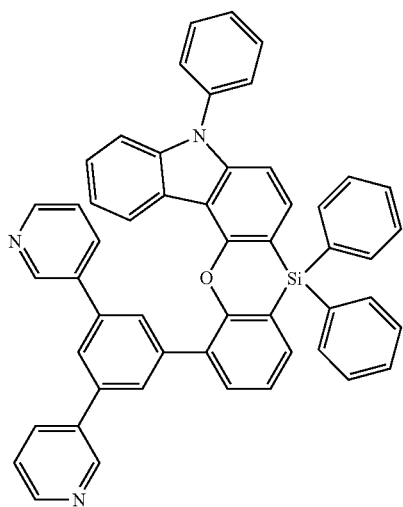
44
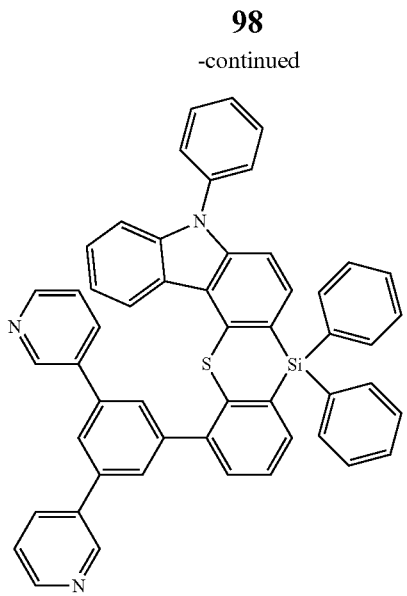
45
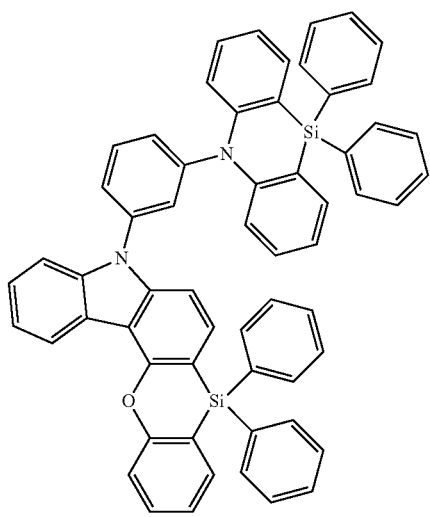
46
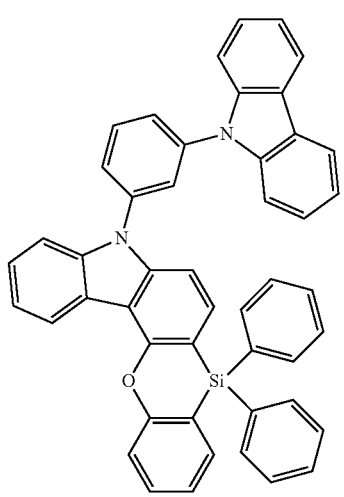

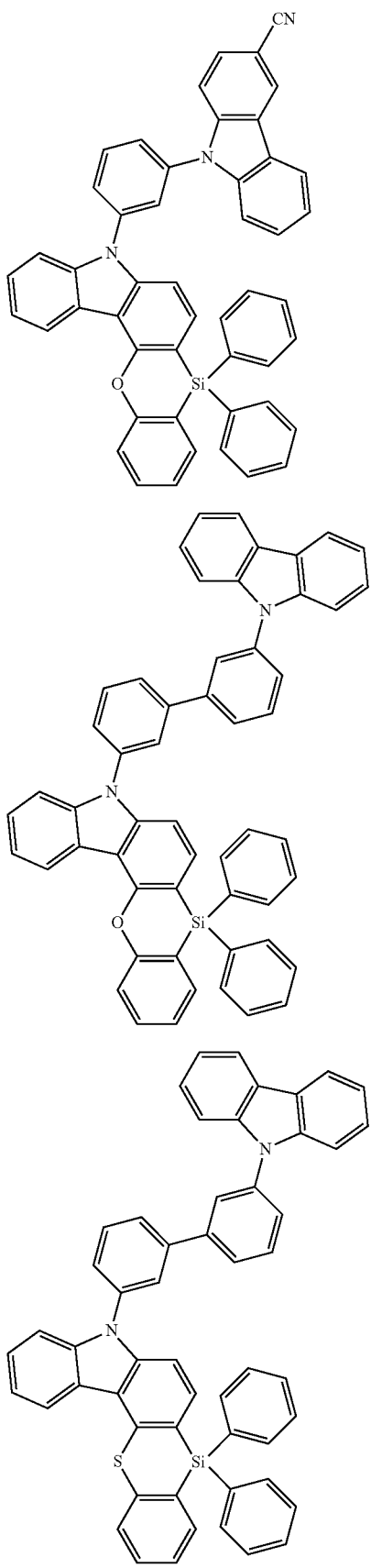

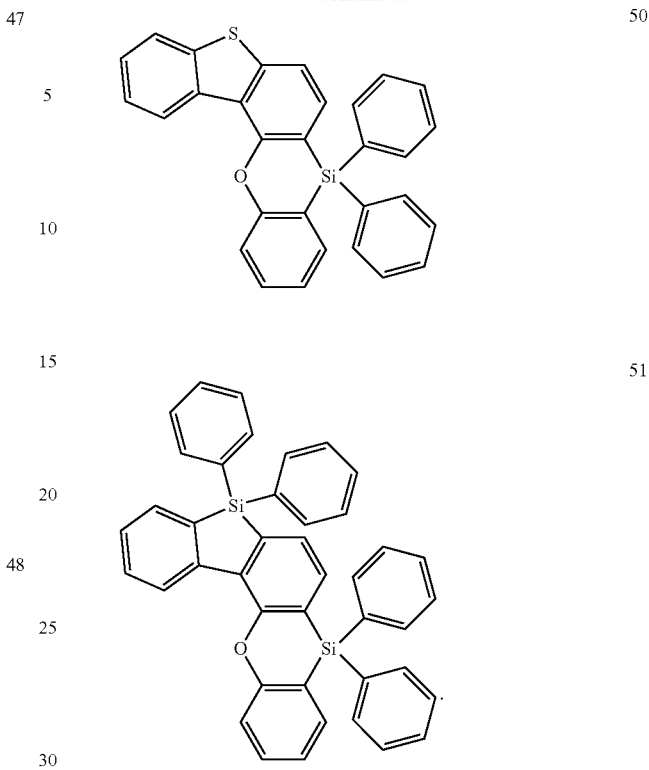

8. An organic electroluminescence device, comprising:
a first electrode;
a hole transport region on the first electrode;
an emission layer on the hole transport region;
an electron transport region on the emission layer; and
a second electrode on the electron transport region,
wherein the emission layer includes a heterocyclic compound represented by the following Formula 1:

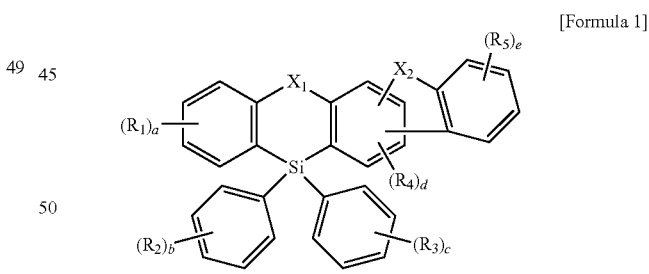

[Formula 1]

wherein, in Formula 1,
$X_1$ is O, S, SO, or $SO_2$,
$X_2$ is $NR_6$, $SiR_9R_{10}$, O, or S,
$R_1$ to $R_5$, $R_9$, and $R_{10}$ are each independently a hydrogen atom, a deuterium atom, a cyano group, a substituted or unsubstituted silyl group, a substituted or unsubstituted phosphine oxide group, a substituted or unsubstituted alkyl group having 1 to 10 carbon atoms, a substituted or unsubstituted alkenyl group having 2 to 10 carbon atoms, a substituted or unsubstituted aryl group having 6 to 60 ring carbon atoms, or a substituted or unsubstituted heteroaryl group having 2 to 60 ring carbon atoms, "a" and "e" are each independently an integer of 0 to 4, "b" and "c" are each independently an integer of 0 to 5, and "d" is an integer of 0 to 2.

9. The organic electroluminescence device as claimed in claim 8, wherein:

the emission layer includes a host and a dopant, and the host includes the heterocyclic compound represented by Formula 1.

10. The organic electroluminescence device as claimed in claim 8, wherein:

the emission layer includes a host and a dopant, and the dopant includes the heterocyclic compound represented by Formula 1.

11. The organic electroluminescence device as claimed in claim 8, wherein the compound represented by Formula 1 is represented by the following Formula 2:

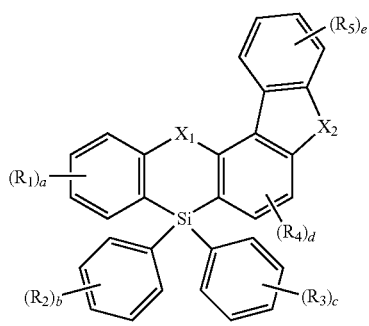

[Formula 2]

wherein, in Formula 2, $X_1$, $X_2$, $R_1$ to $R_5$, and "a" to "e" are defined the same as those of Formula 1.

12. The organic electroluminescence device as claimed in claim 11, wherein:

$X_2$ is $NR_6$, and $R_6$ is a substituted or unsubstituted phosphine oxide group, a substituted or unsubstituted aryl group having 6 to 30 ring carbon atoms, or a substituted or unsubstituted heteroaryl group having 2 to 30 ring carbon atoms.

13. The organic electroluminescence device as claimed in claim 11, wherein:

$X_2$ is $NR_6$, and $R_6$ is a diphenylphosphine oxide group, a substituted or unsubstituted phenyl group, a substituted or unsubstituted fluorene group, a substituted or unsubstituted pyridine group, a substituted or unsubstituted pyrimidyl group, a substituted or unsubstituted triazine group, a substituted or unsubstituted carbazole group, a substituted or unsubstituted dibenzofuran group, or a substituted or unsubstituted dibenzothiophene group.

14. The organic electroluminescence device as claimed in claim 8, wherein the compound represented by Formula 1 is represented by one of the following Formulae 2-1 to 2-3:

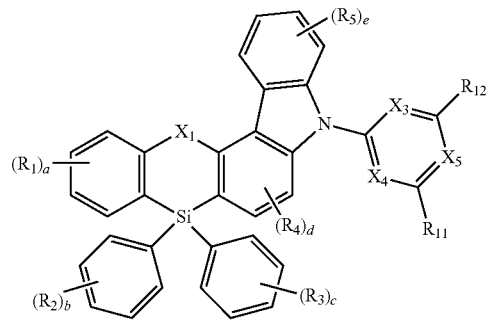

[Formula 2-1]

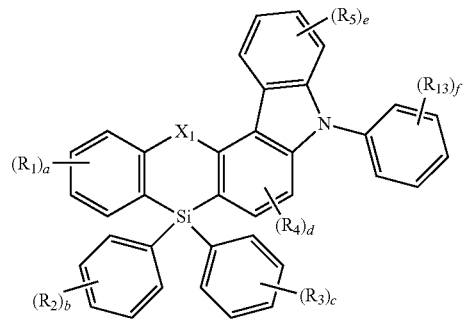

[Formula 2-2]

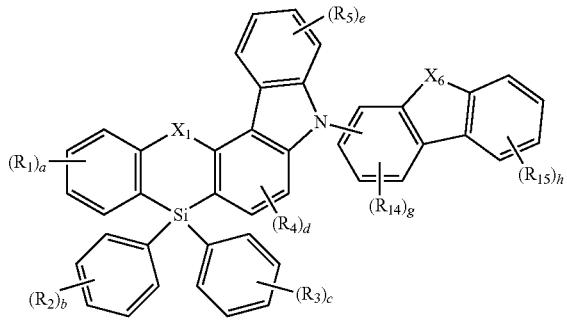

[Formula 2-3]

wherein, in Formula 2-1, $X_3$ to $X_5$ are each independently N or CH, at least one of $X_3$ to $X_5$ being N, $R_{11}$ and $R_{12}$ are defined the same as $R_1$ to $R_5$, wherein in Formula 2-2, $R_{13}$ is defined the same as $R_1$ to $R_5$, "f" is an integer of 0 to 5, wherein, in Formula 2-3, $X_6$ is O, S, $CR_{16}R_{17}$, or $NR_{18}$, $R_{14}$ to $R_{18}$ are defined the same as $R_1$ to $R_5$, "g" is an integer of 0 to 3, "h" is an integer of 0 to 4, and wherein, in Formulae 2-1 to 2-3, $X_1$, $R_1$ to $R_5$, and "a" to "e" are defined the same as those of Formula 1.

15. The organic electroluminescence device as claimed in claim 8, wherein the heterocyclic compound represented by Formula 1 is a compound of the following Compound Group 1:

[Compound Group 1]
1
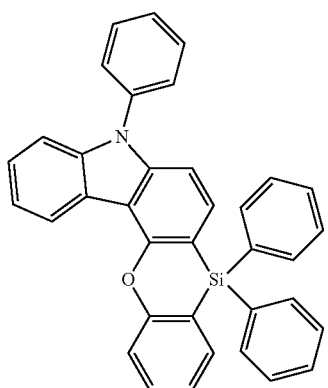
2
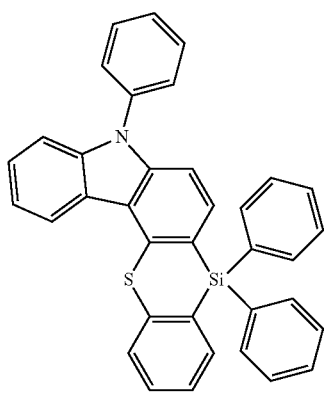
3
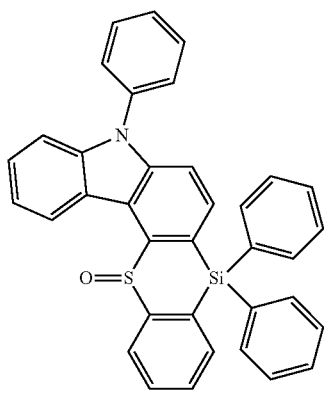
4
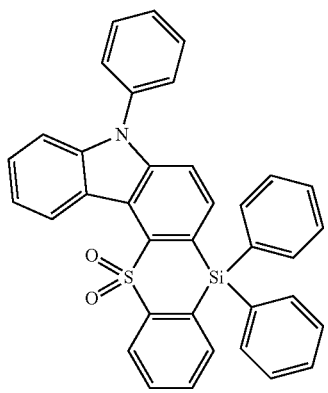
5
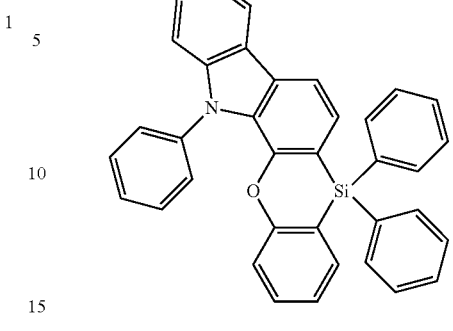
6
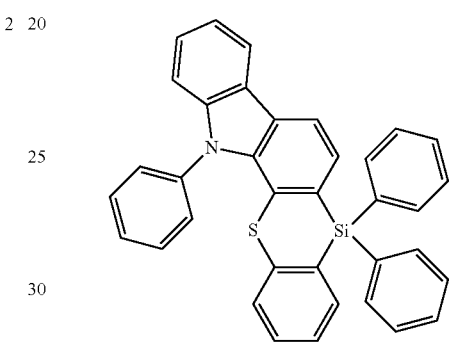
7
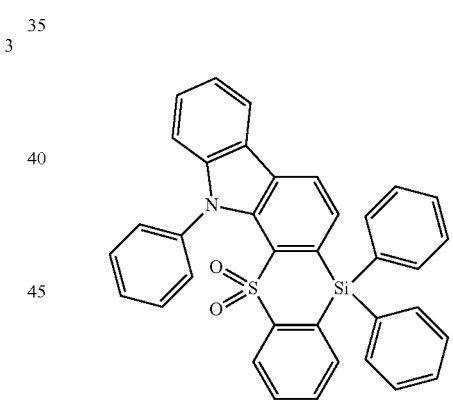
8
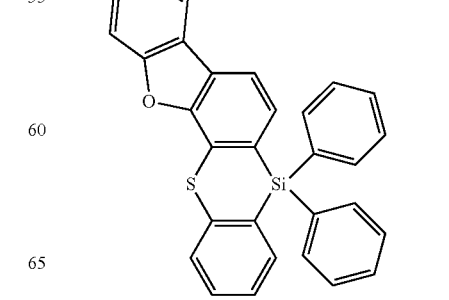

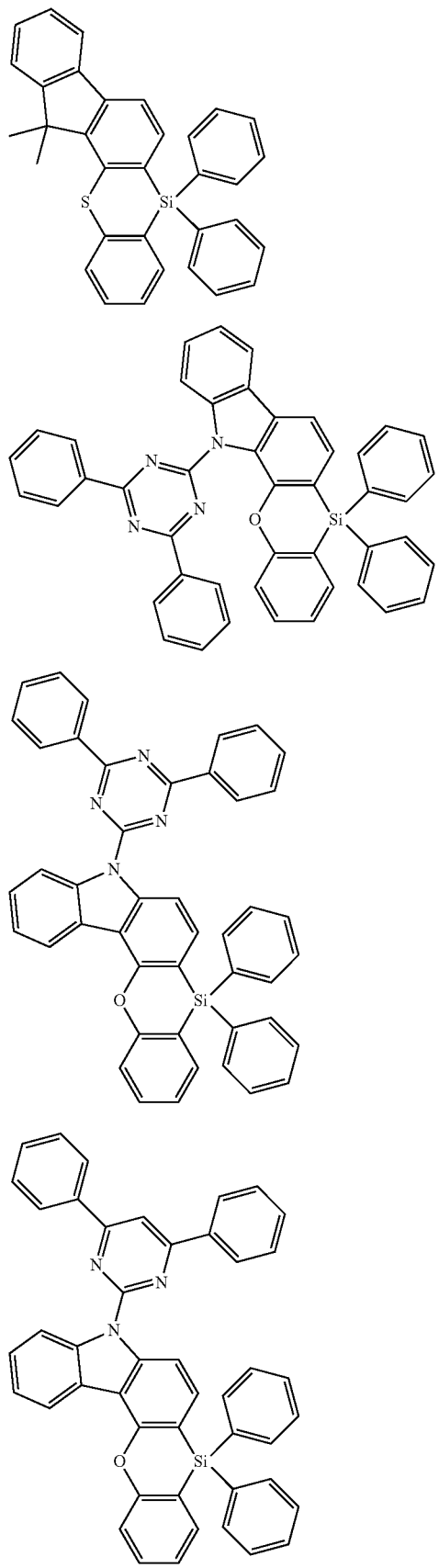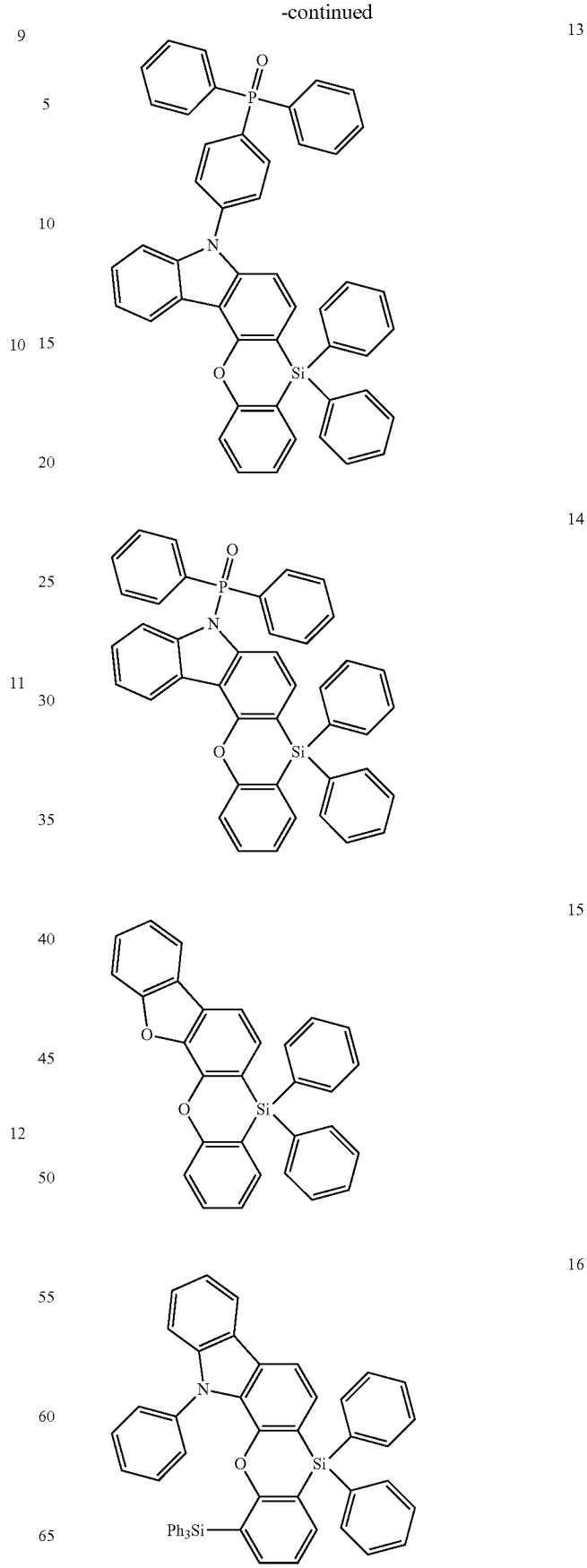

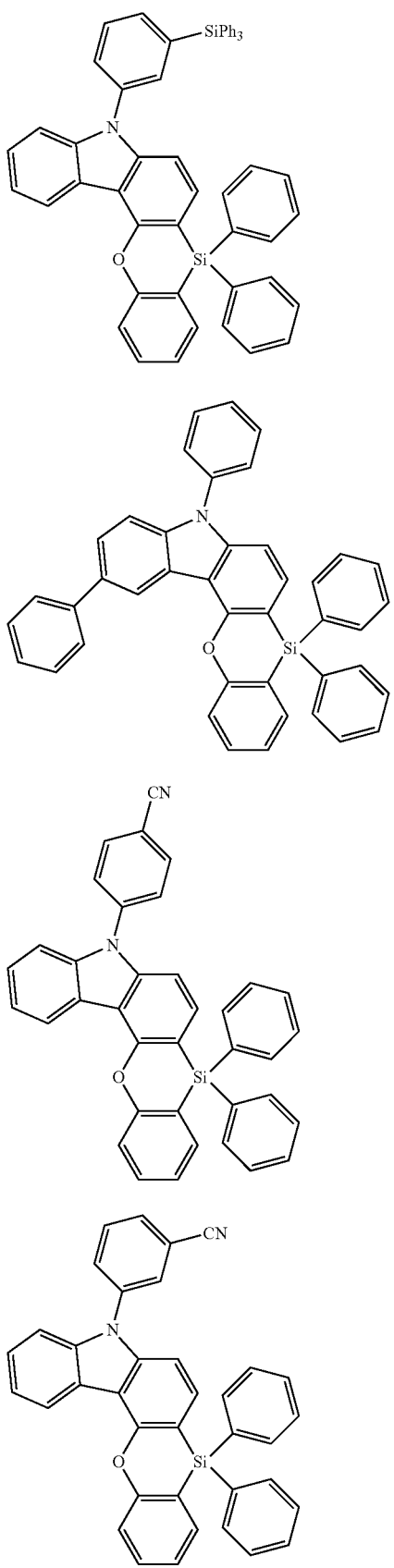
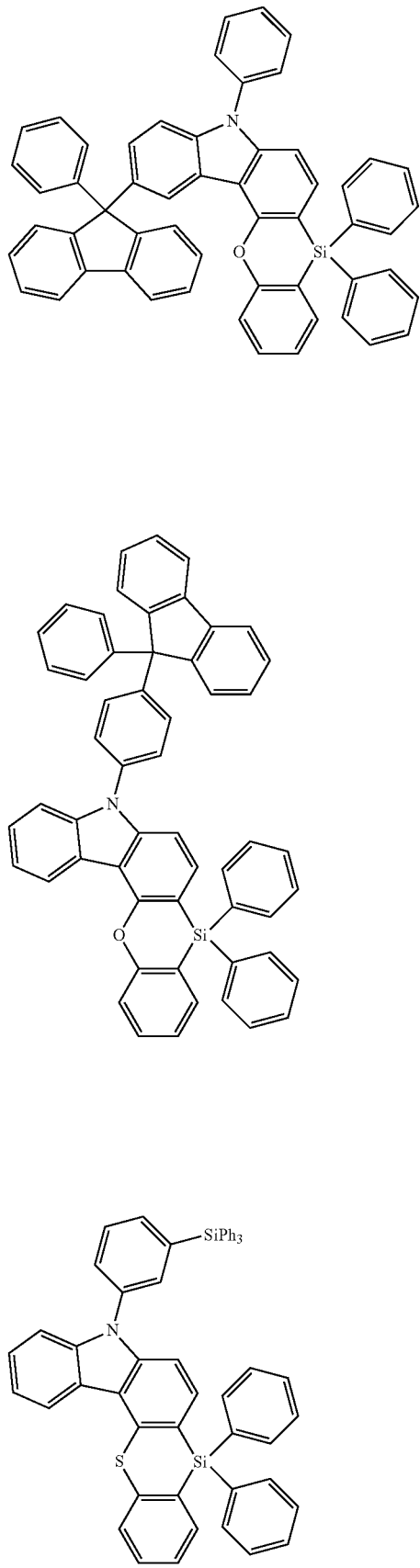

24
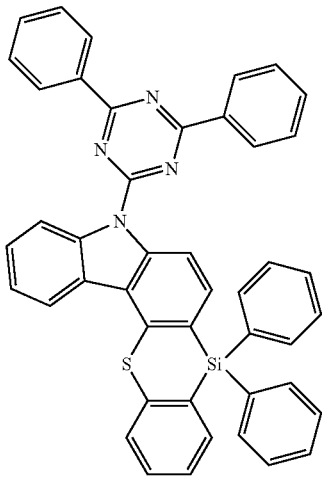
25
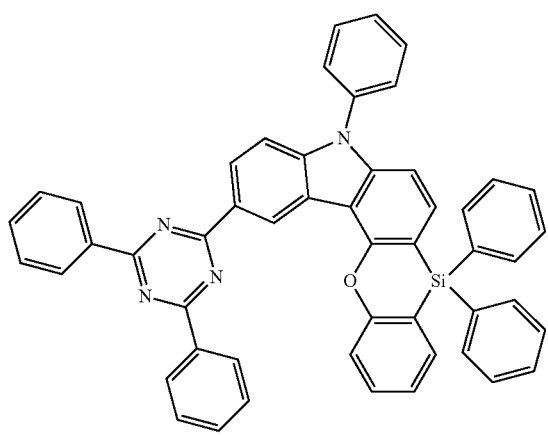
26
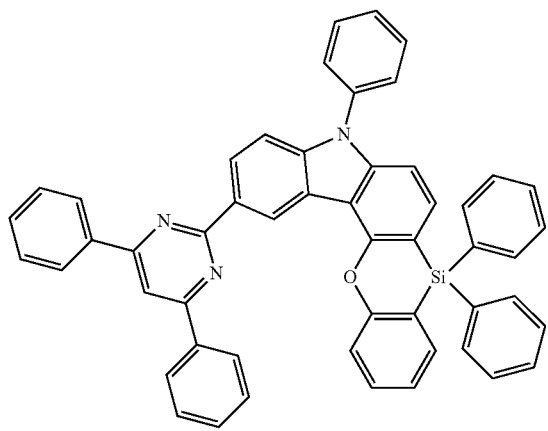
27
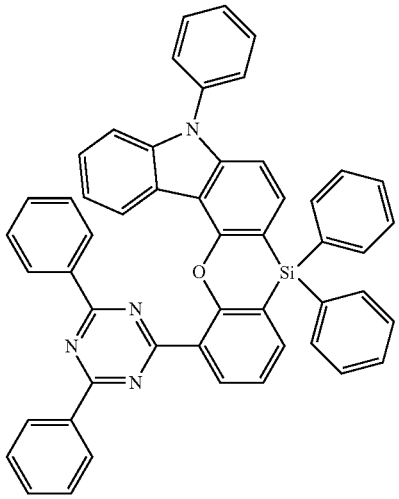
28
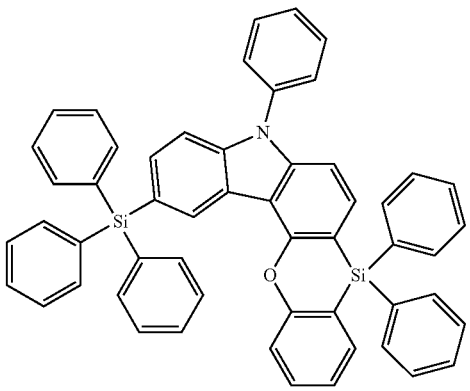
29
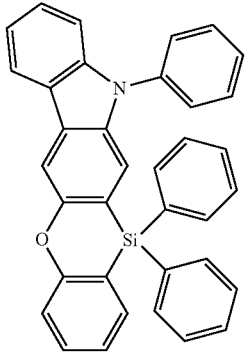
30
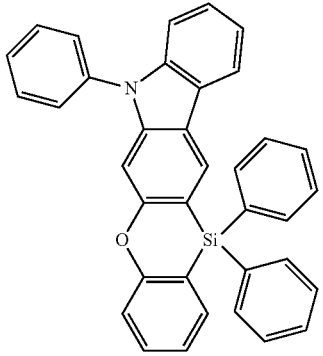

111
-continued
31
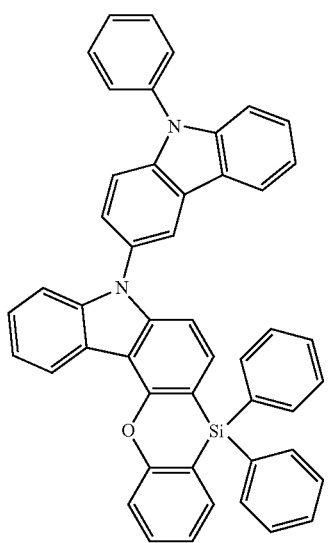
32
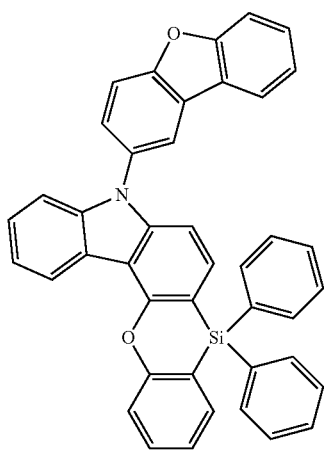
33
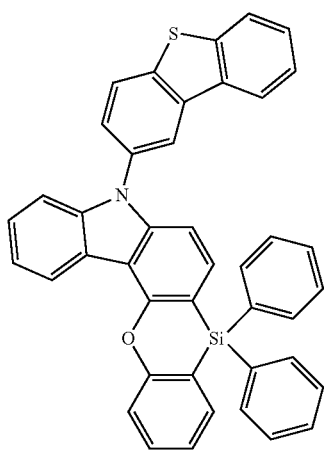
112
-continued
34
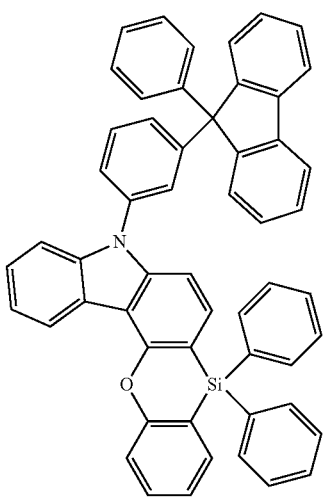
35
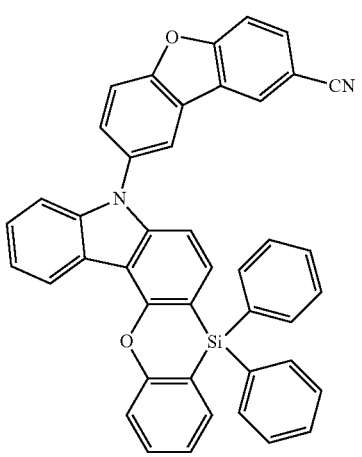
36
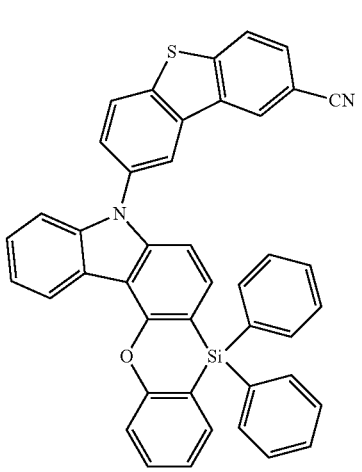

37
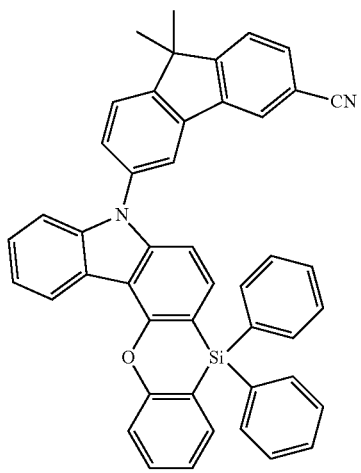
38
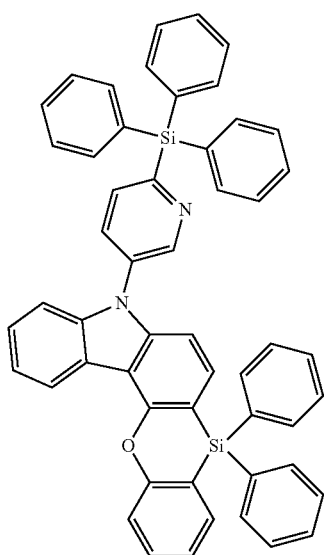
39
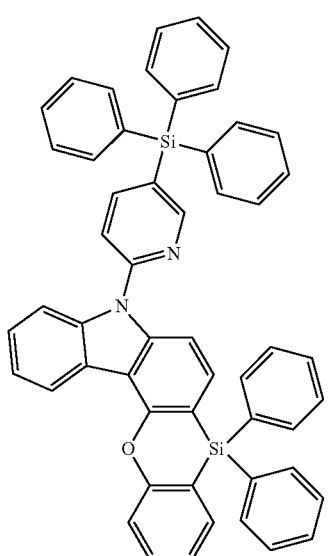
40
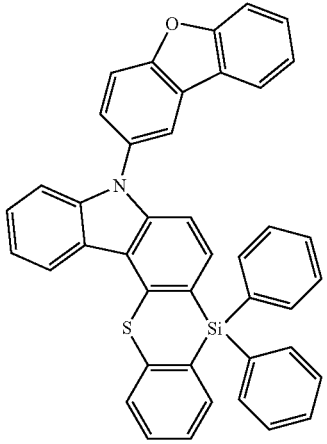
41
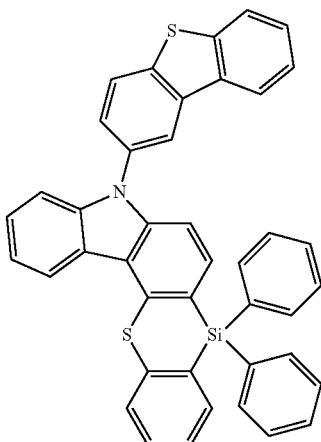
42
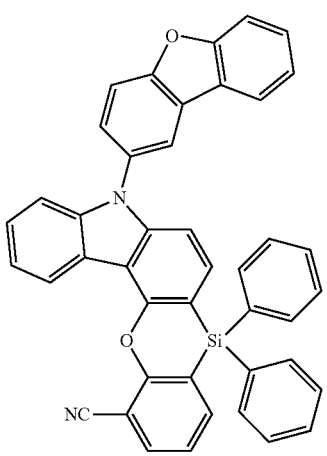

43
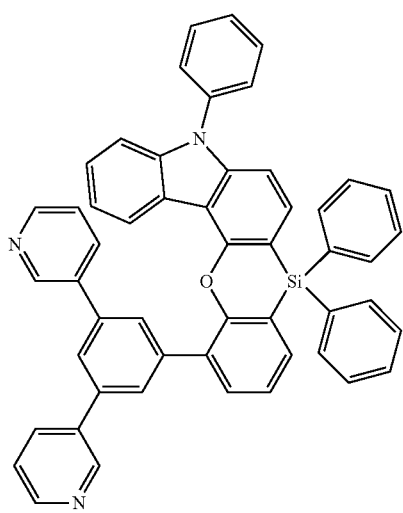
44
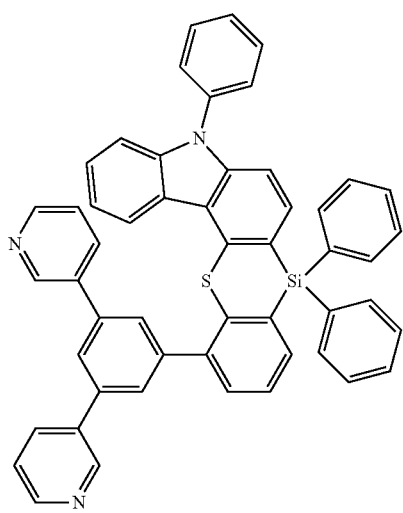
45
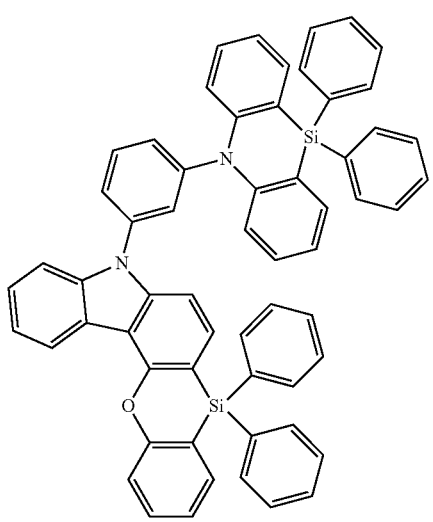
46
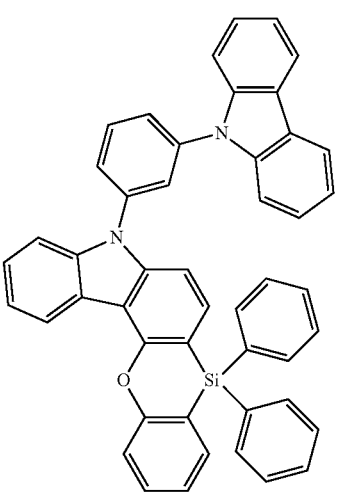
47
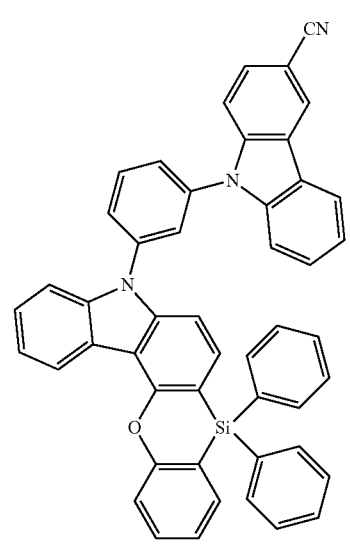
48
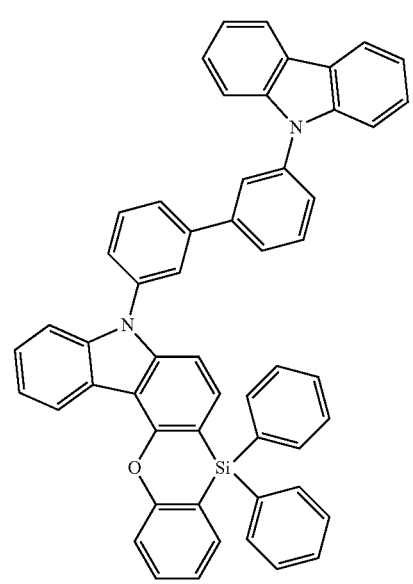

49
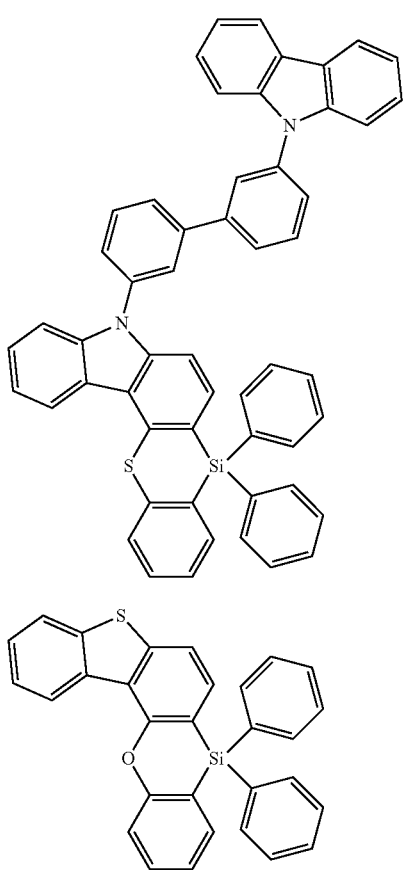
50
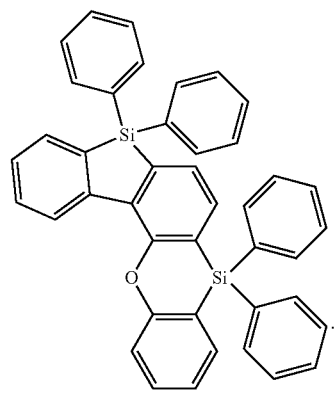
51
16. An organic electroluminescence device, comprising:
a first electrode;
a hole transport region on the first electrode;
an emission layer on the hole transport region;
an electron transport region on the emission layer; and
a second electrode on the electron transport region,
wherein the emission layer includes the heterocyclic compound of claim 6.
* * * * *

UNITED STATES PATENT AND TRADEMARK OFFICE
CERTIFICATE OF CORRECTION

PATENT NO. : 10,696,697 B2
APPLICATION NO. : 15/813651
DATED : June 30, 2020
INVENTOR(S) : Heechoon Ahn et al.

It is certified that error appears in the above-identified patent and that said Letters Patent is hereby corrected as shown below:

In the Claims

In Column 84, Lines 20-29, Claim 6, delete " 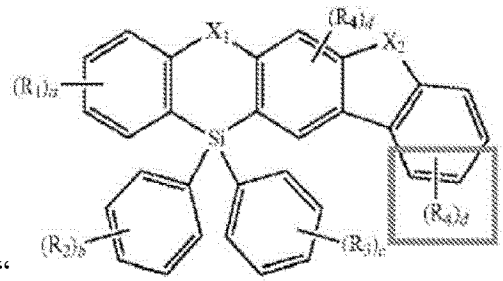 " and insert --

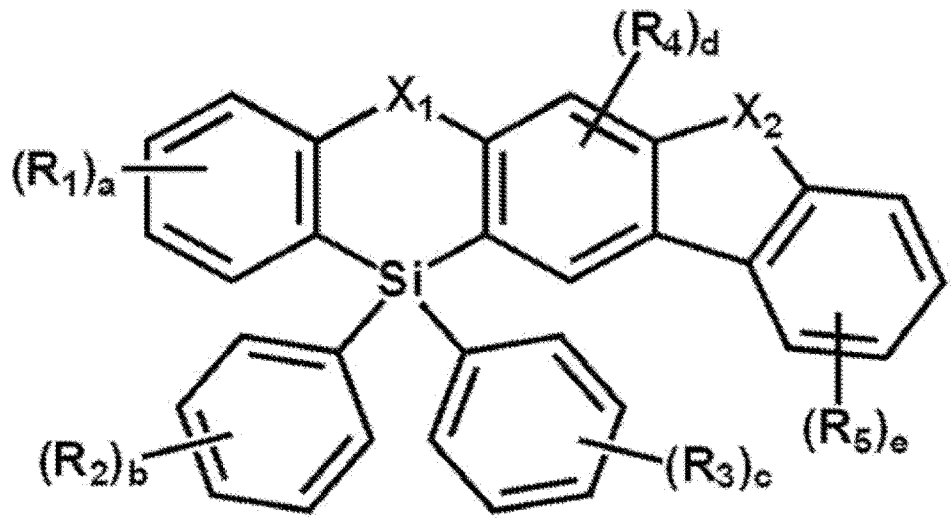

--

In Column 100, Line 58, Claim 8, delete "$R_1$ to $R_5$," and insert -- $R_1$ to $R_6$, --

Signed and Sealed this
Twenty-eighth Day of December, 2021

Drew Hirshfeld
*Performing the Functions and Duties of the
Under Secretary of Commerce for Intellectual Property and
Director of the United States Patent and Trademark Office*